(12) United States Patent
Mano et al.

(10) Patent No.: US 9,265,158 B2
(45) Date of Patent: Feb. 16, 2016

(54) INDUCTOR COMPONENT AND PRINTED WIRING BOARD INCORPORATING INDUCTOR COMPONENT AND METHOD FOR MANUFACTURING INDUCTOR COMPONENT

(75) Inventors: Yasuhiko Mano, Ogaki (JP); Shinobu Kato, Ogaki (JP); Takashi Kariya, Ogaki (JP)

(73) Assignee: IBIDEN Co., Ltd., Ogaki-shi (JP)

(*) Notice: Subject to any disclaimer, the term of this patent is extended or adjusted under 35 U.S.C. 154(b) by 537 days.

(21) Appl. No.: 13/360,201

(22) Filed: Jan. 27, 2012

(65) Prior Publication Data

US 2012/0212919 A1 Aug. 23, 2012

(30) Foreign Application Priority Data

Feb. 18, 2011 (JP) .................................. 2011-034022
Oct. 31, 2011 (JP) .................................. 2011-239304

(51) Int. Cl.
*H05K 3/46* (2006.01)
*H05K 1/18* (2006.01)
*H01F 17/00* (2006.01)
*H05K 3/00* (2006.01)

(52) U.S. Cl.
CPC .......... *H05K 3/4602* (2013.01); *H01F 17/0033* (2013.01); *H05K 1/185* (2013.01); *H01F 2017/004* (2013.01); *H05K 3/0032* (2013.01); *H05K 2201/1003* (2013.01); *H05K 2203/1469* (2013.01); *H05K 2203/1572* (2013.01); *Y10T 29/4913* (2015.01)

(58) Field of Classification Search
CPC ..................................................... H05K 1/185

USPC .......................................... 361/766; 438/106
See application file for complete search history.

(56) References Cited

U.S. PATENT DOCUMENTS

| 5,499,005 | A | * | 3/1996 | Gu | ........................... | H01P 5/12 |
| | | | | | | 333/161 |
| 5,612,660 | A | * | 3/1997 | Takimoto | ............ | H01F 17/0013 |
| | | | | | | 336/200 |
| 6,778,058 | B1 | * | 8/2004 | Branchevsky | .... | H01L 23/49822 |
| | | | | | | 257/E23.062 |

(Continued)

FOREIGN PATENT DOCUMENTS

CN 1321410 A 11/2001
JP 9-129449 A 5/1997

(Continued)

*Primary Examiner* — Zachary M Pape
*Assistant Examiner* — Douglas Burtner
(74) *Attorney, Agent, or Firm* — Oblon, McClelland, Maier & Neustadt, L.L.P.

(57) ABSTRACT

A printed wiring board includes a core substrate having a cavity and having first and second surfaces, an inductor component accommodated in the cavity, a filler resin filling a gap formed between the substrate and component in the cavity, and a buildup layer formed on the first surface of the substrate and the component. The component has a coil layer, a second insulation layer formed on the coil layer, an electrode formed on the substance layer, and a via conductor formed in the substance layer and connecting the coil layer and the electrode, the component is accommodated in the cavity such that the electrode faces the first surface of the substrate, and the buildup layer includes an interlayer insulation layer formed on the first surface of the substrate and the component, a conductive layer formed on the insulation layer, and a connection via conductor connecting the conductive layer and electrode.

20 Claims, 41 Drawing Sheets

(56) References Cited

U.S. PATENT DOCUMENTS

| | | | |
|---|---|---|---|
| 6,876,554 B1 | 4/2005 | Inagaki et al. | |
| 2001/0030059 A1* | 10/2001 | Sugaya | H01L 21/56 174/256 |
| 2003/0030533 A1* | 2/2003 | Waffenschmidt | H05K 1/165 336/200 |
| 2004/0157370 A1* | 8/2004 | Gardner | H01F 17/0006 438/106 |
| 2004/0208032 A1* | 10/2004 | Edo | H01F 17/0033 363/147 |
| 2007/0190686 A1* | 8/2007 | Wang | H05K 1/186 438/106 |
| 2007/0257761 A1* | 11/2007 | Mano | H01F 17/0006 336/200 |
| 2009/0315662 A1* | 12/2009 | Hijioka | H01F 17/0013 336/200 |
| 2011/0187486 A1* | 8/2011 | Sugiyama | H01F 17/0013 336/200 |
| 2011/0211321 A1* | 9/2011 | Oikawa | H05K 3/4617 361/782 |
| 2011/0234358 A1* | 9/2011 | Katsumata | H01F 17/0013 336/200 |
| 2012/0032767 A1* | 2/2012 | Iwasaki | H01F 17/0013 336/200 |
| 2014/0225701 A1* | 8/2014 | Morita | H01F 17/0013 336/200 |

FOREIGN PATENT DOCUMENTS

| | | | |
|---|---|---|---|
| JP | 09129449 A | * | 5/1997 |
| JP | 2000-348940 A | | 12/2000 |
| JP | 2002-043755 A | | 2/2002 |
| JP | 2004-363568 A | | 12/2004 |
| JP | 2007-027353 A | | 2/2007 |
| JP | 2008159654 A | * | 7/2008 |
| JP | 2009-016504 | | 1/2009 |
| JP | 2010-153721 A | | 7/2010 |
| JP | 2010-154591 A | | 7/2010 |
| TW | 200731889 A | | 8/2007 |
| TW | 201031293 A1 | | 8/2010 |

* cited by examiner

FIG. 1
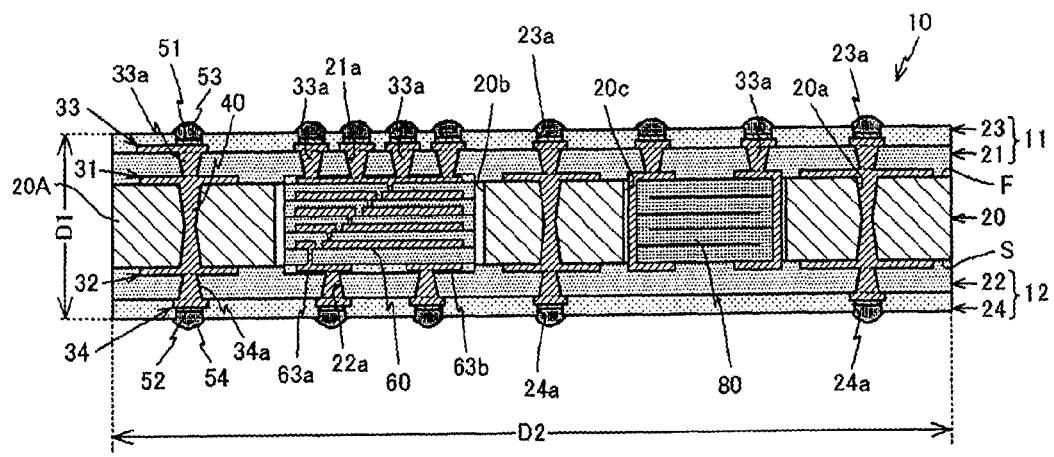
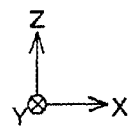
FIG. 2
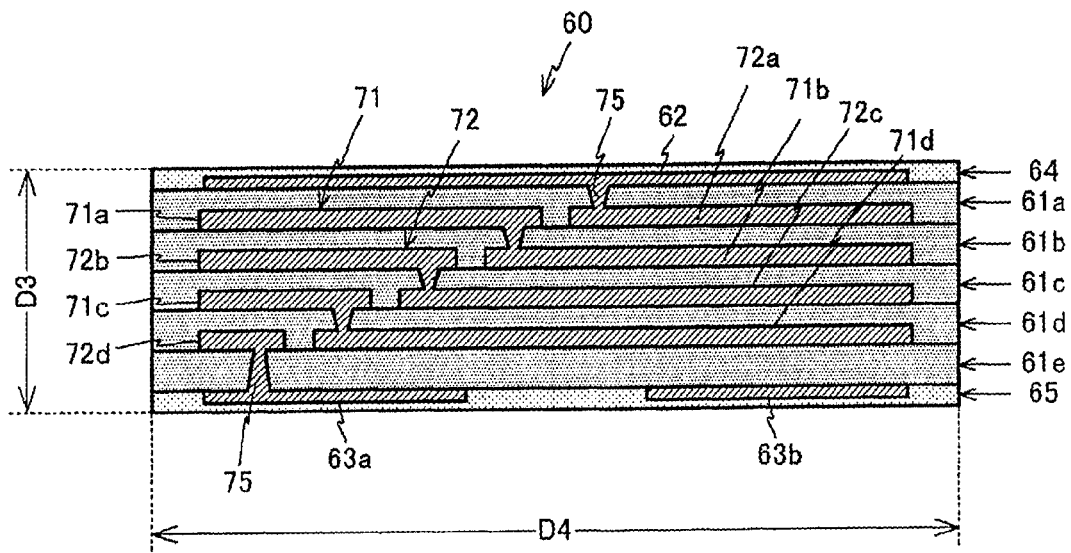
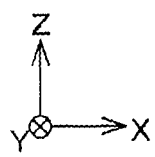

FIG. 35 (A)
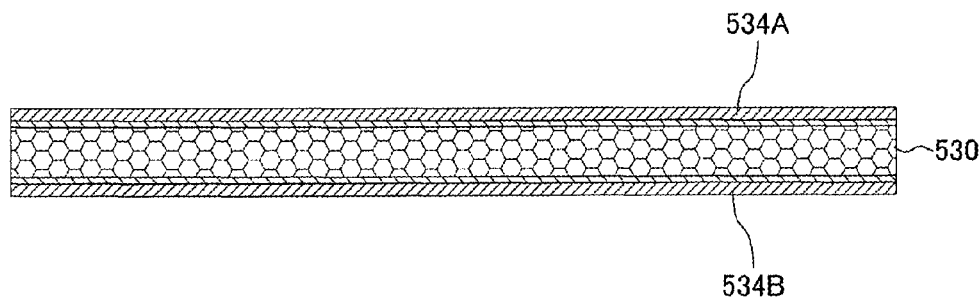
(B)
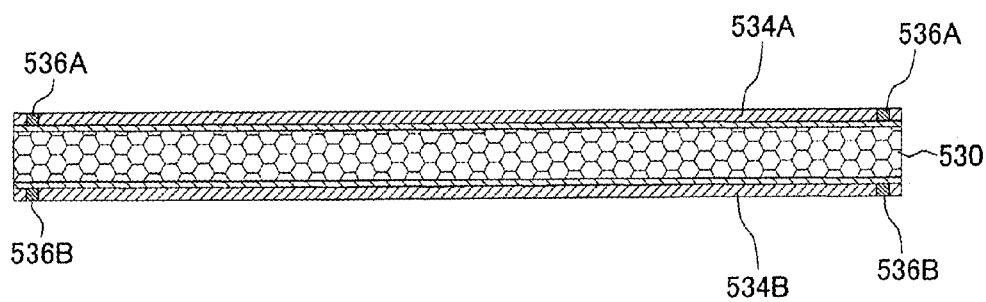
(C)
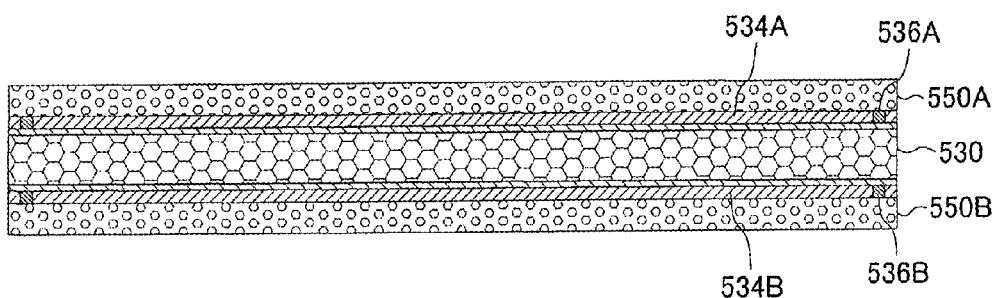

FIG. 36  (A)
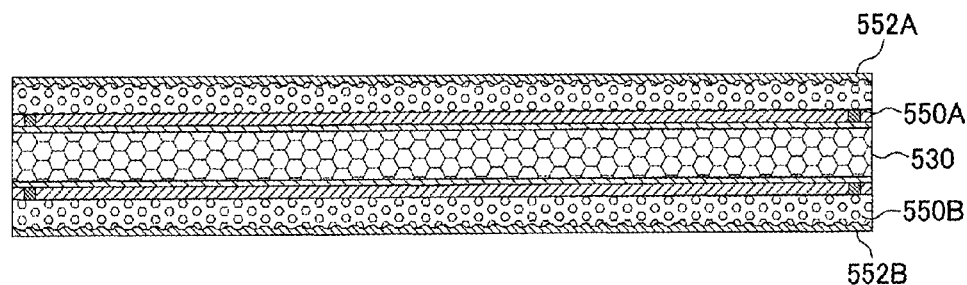
(B)
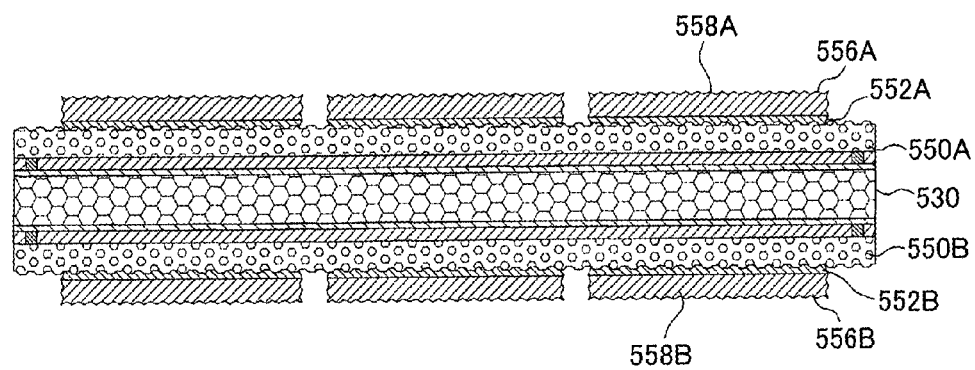
(C)
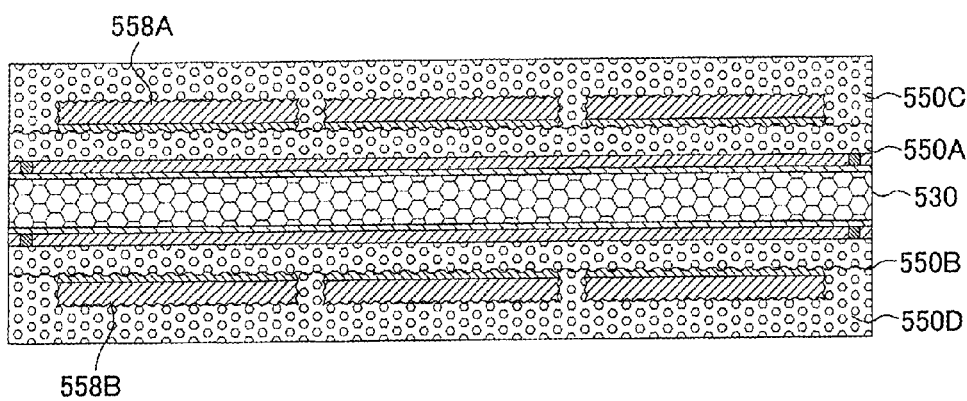

FIG. 37
(A)
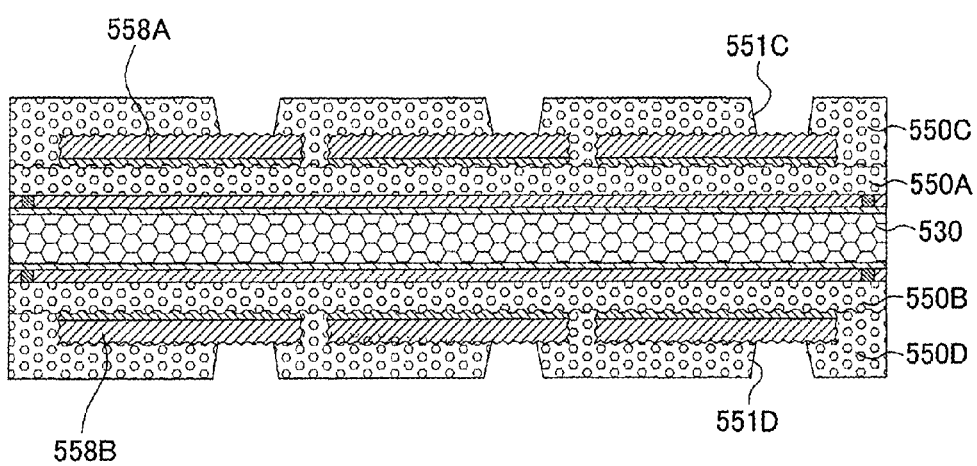
(B)
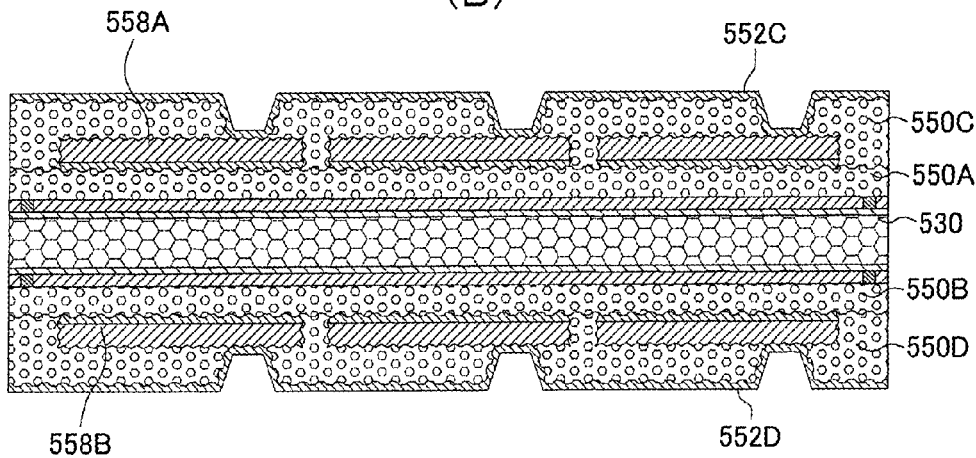

FIG. 38
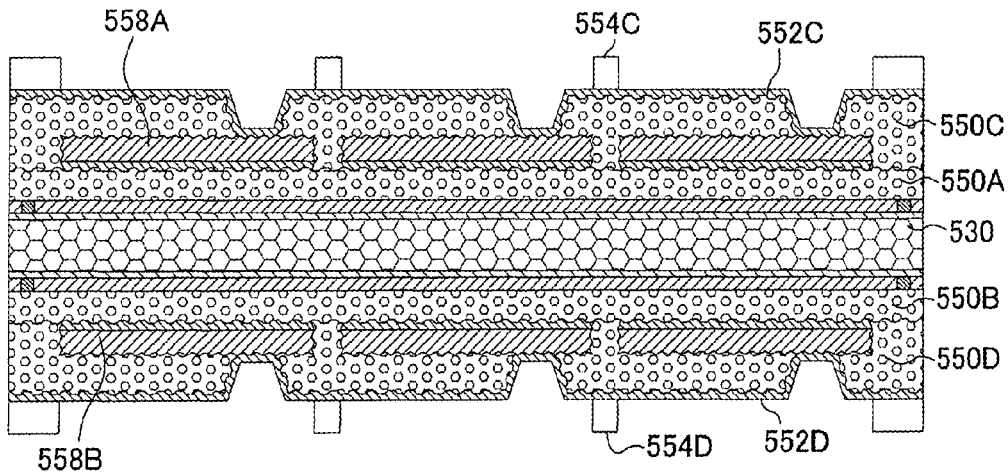
(A)
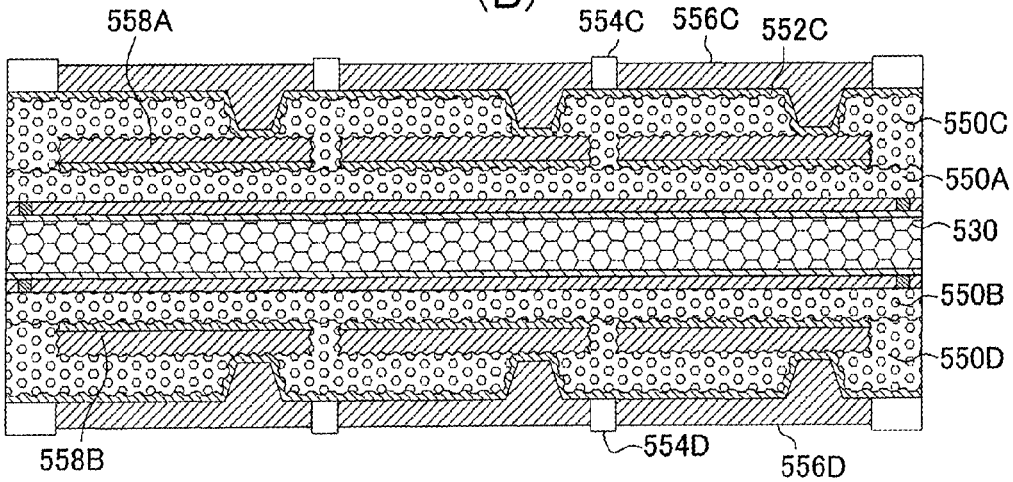
(B)
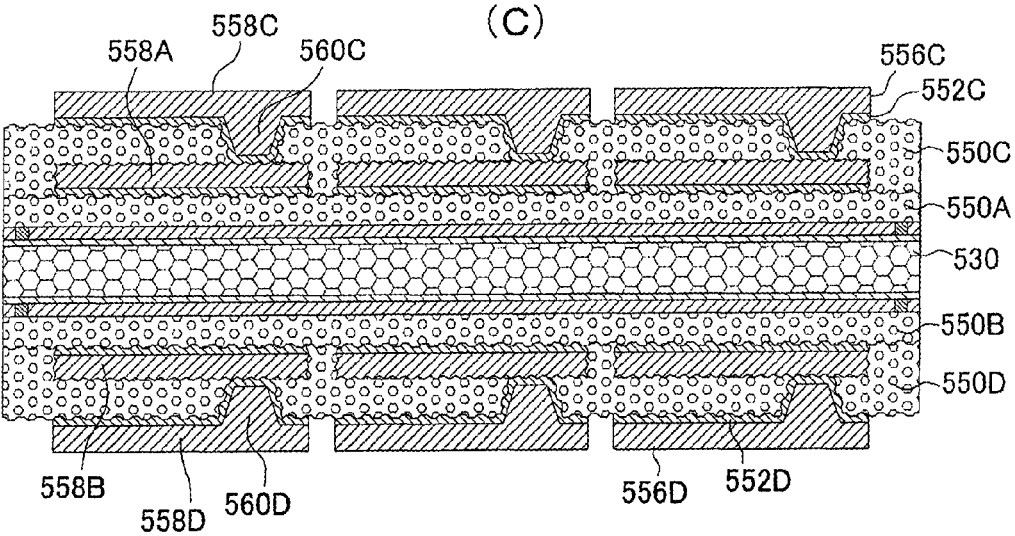
(C)

FIG. 40 (A)
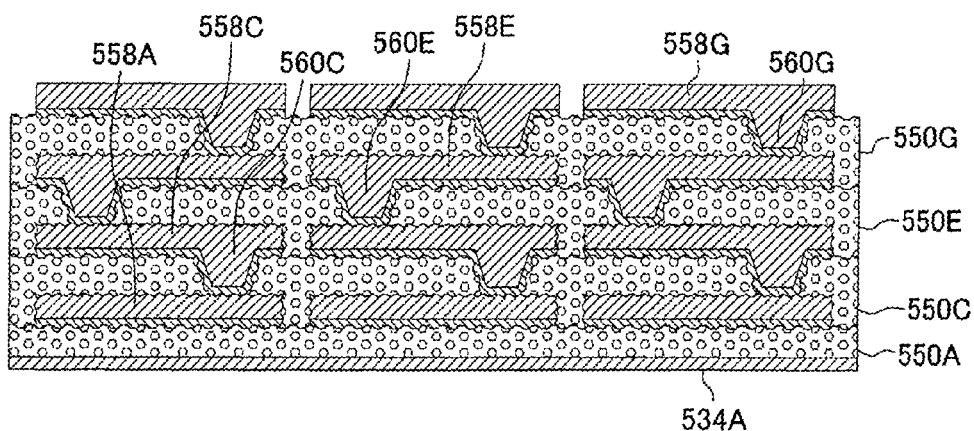
(B)
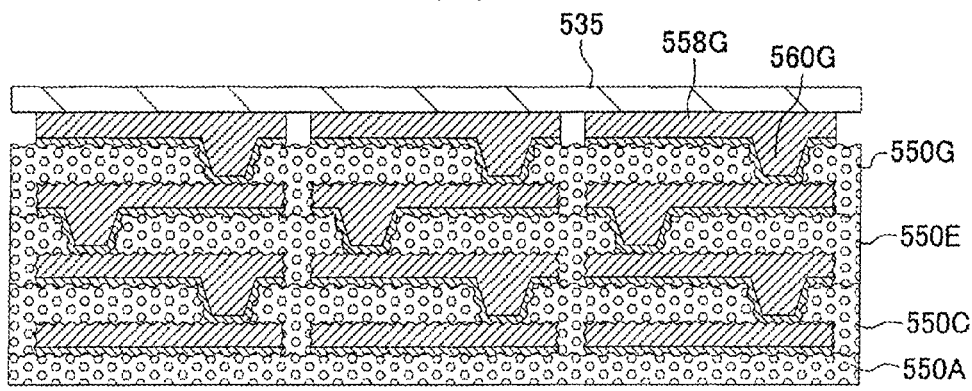
(C)
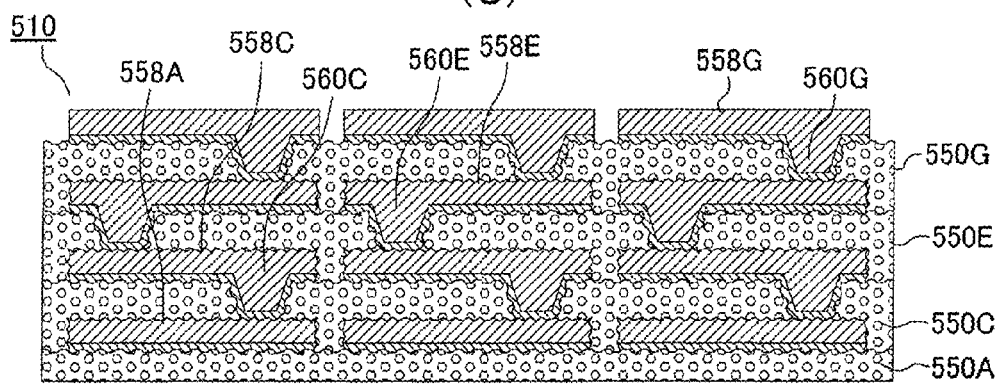

FIG. 46
(A)
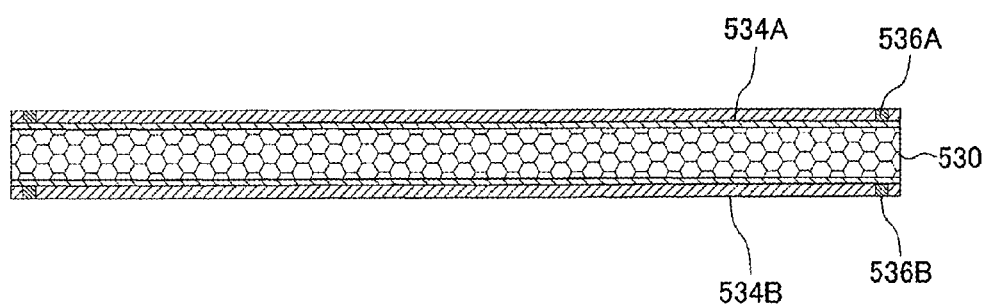
(B)
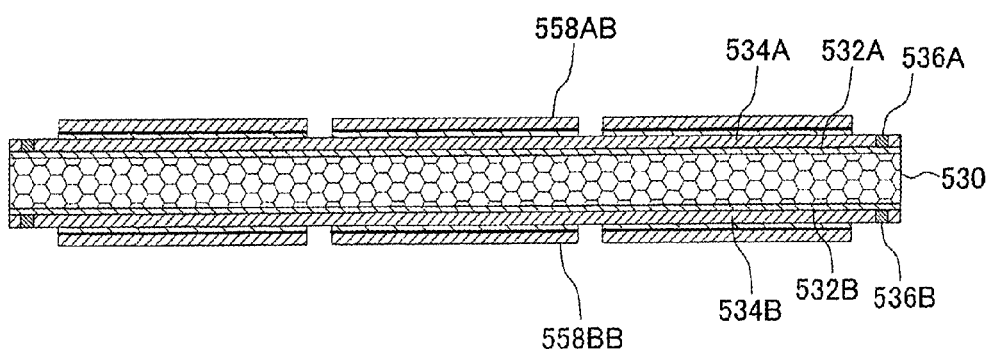

FIG. 47
(A)
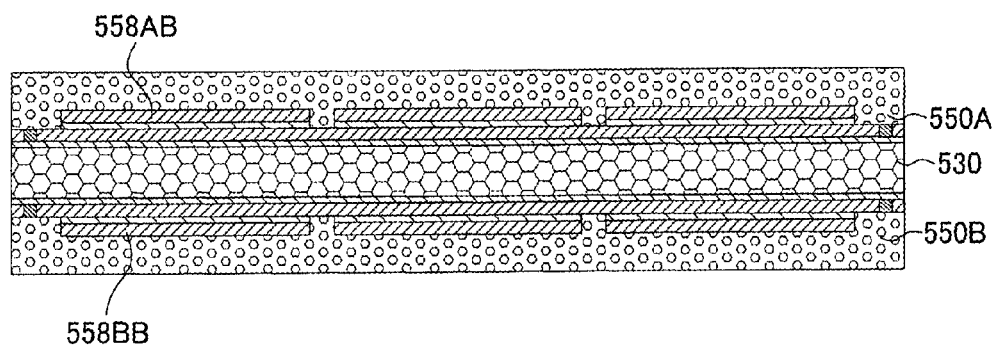
(B)
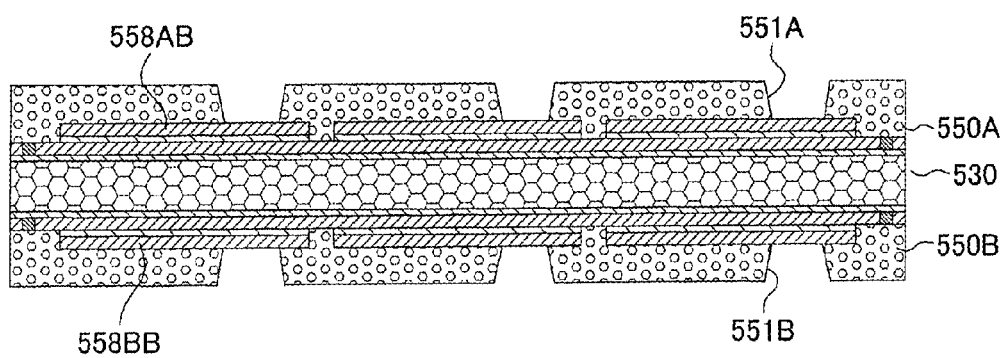
(C)
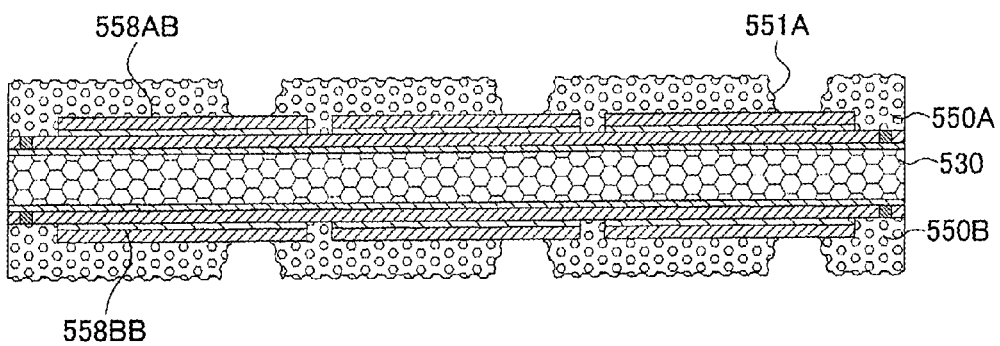

FIG. 49
(A)
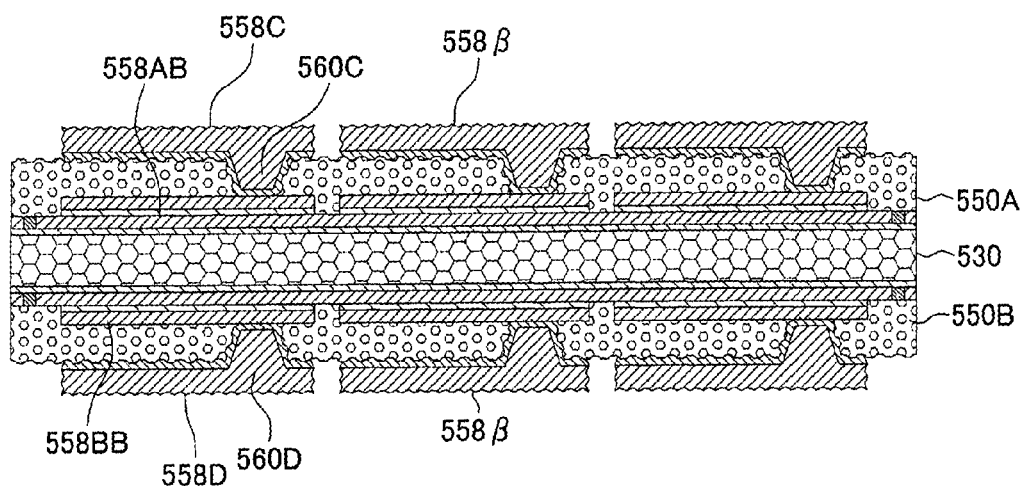
(B)
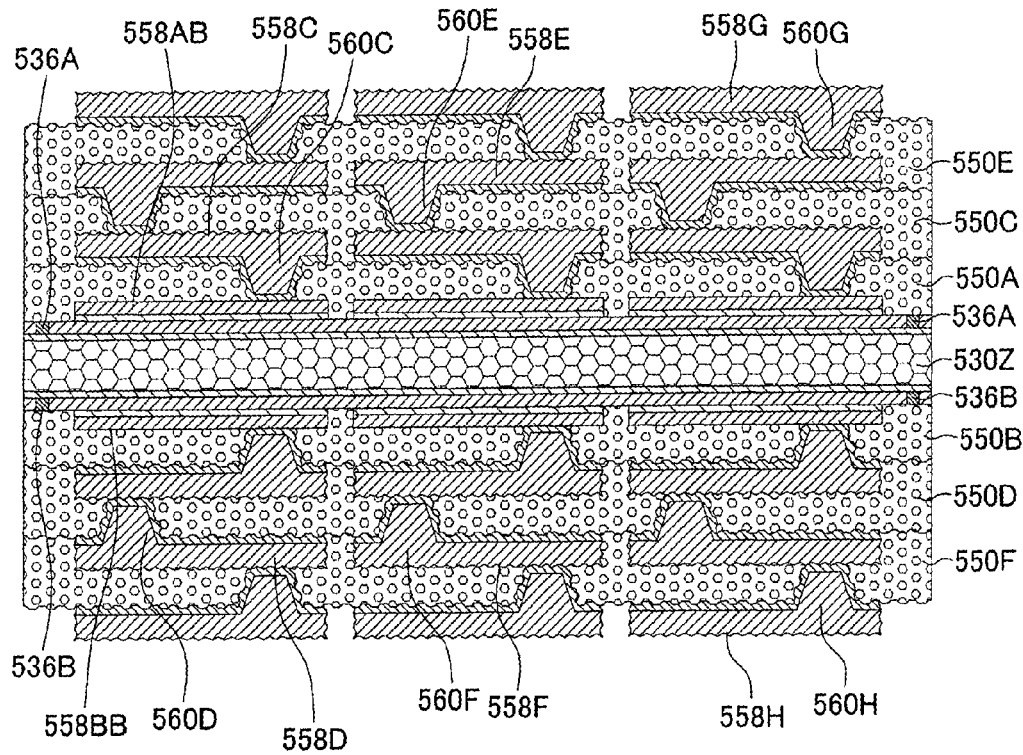

FIG. 50
(A)
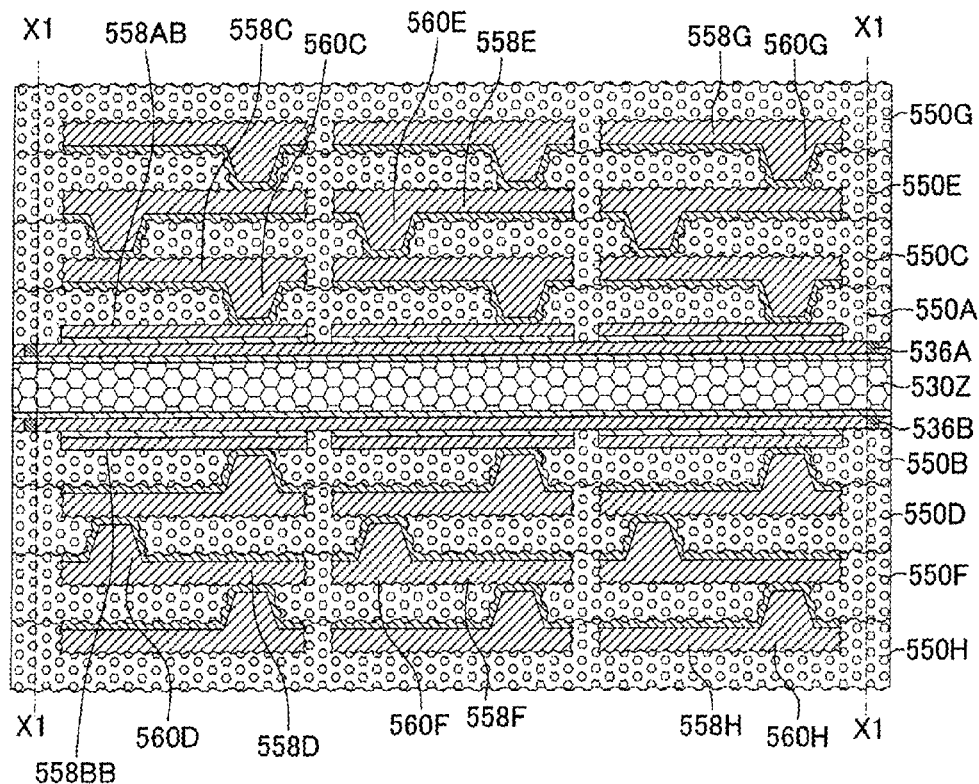
(B)
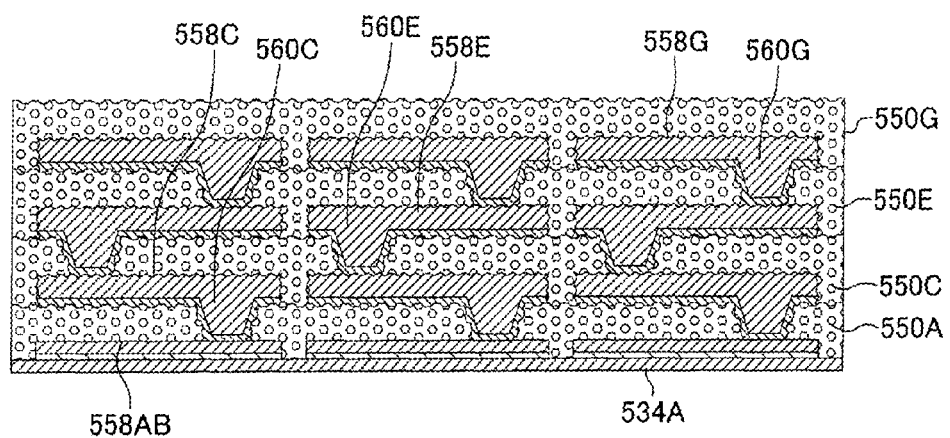

FIG. 57
(A)
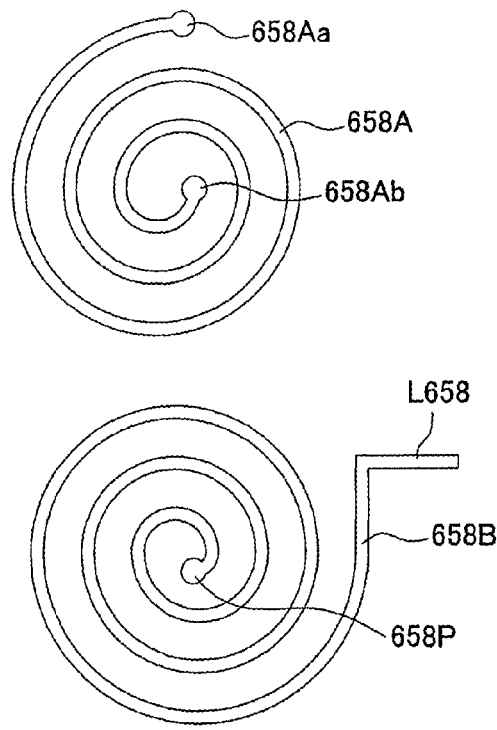
(B)
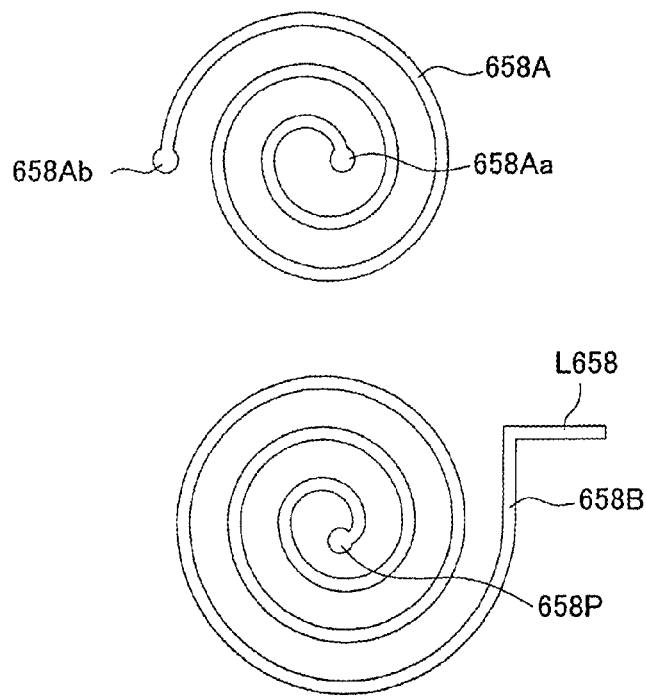

FIG. 58
(A) 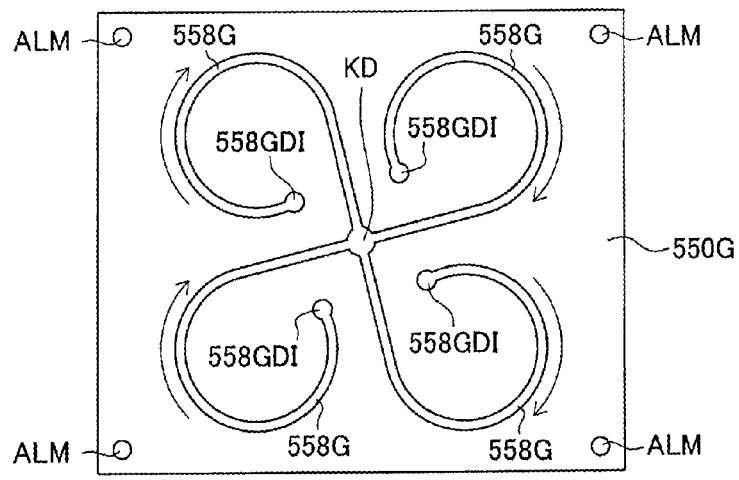
(B) 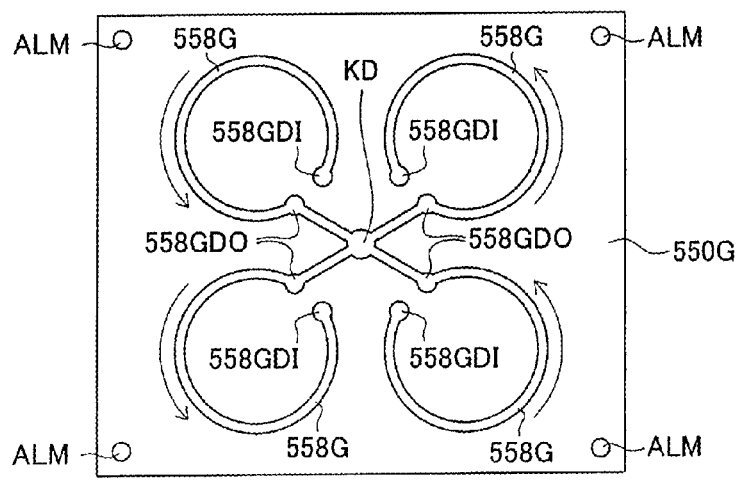
(C) 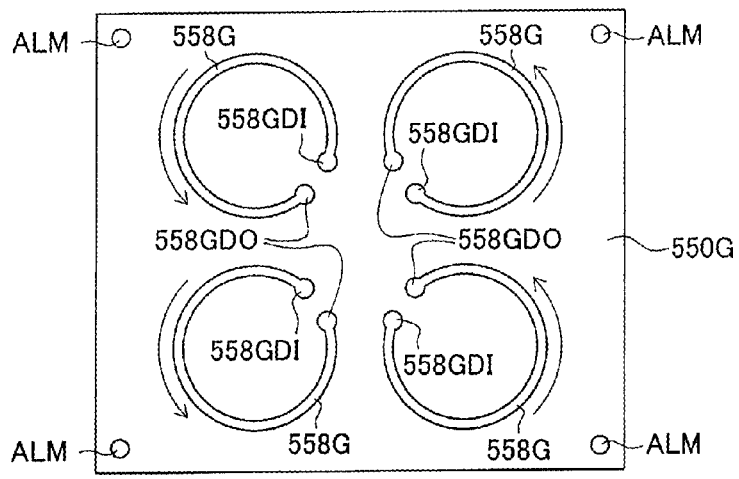

FIG. 60
(A)
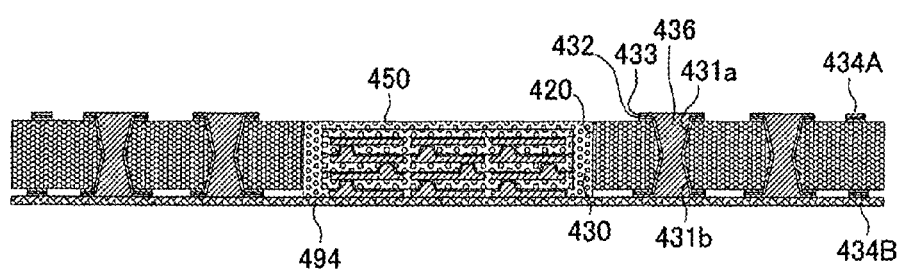
(B)
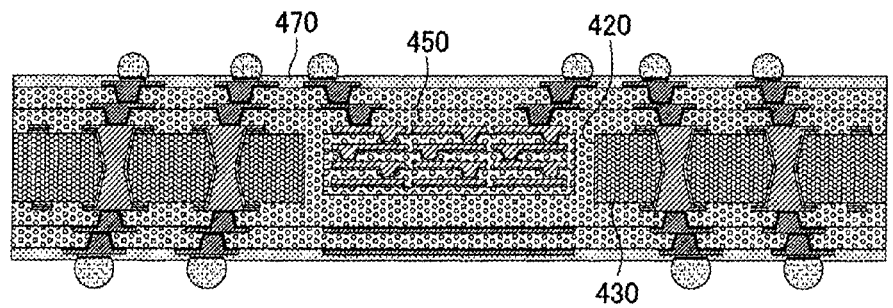

FIG. 61
(A)
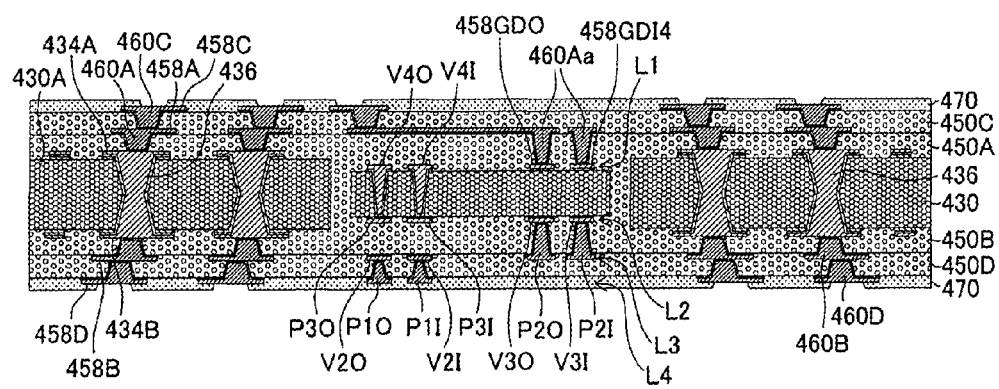
(B)
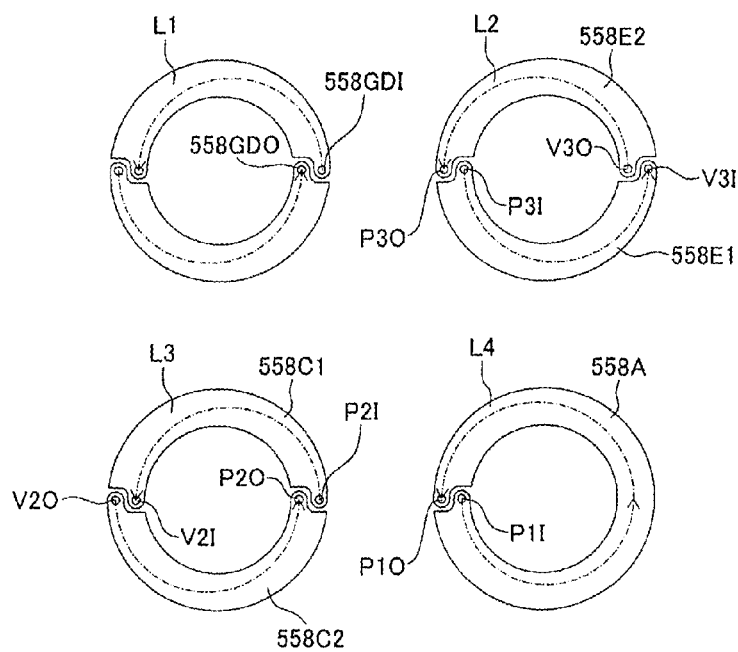

INDUCTOR COMPONENT AND PRINTED WIRING BOARD INCORPORATING INDUCTOR COMPONENT AND METHOD FOR MANUFACTURING INDUCTOR COMPONENT

CROSS-REFERENCE TO RELATED APPLICATIONS

The present application is based on and claims the benefit of priority to Japanese Patent Application Nos. 2011-034022, filed Feb. 18, 2011 and 2011-239304, filed Oct. 31, 2011. The entire contents of these applications are incorporated herein by reference.

BACKGROUND OF THE INVENTION

1. Field of the Invention

The present invention relates to an inductor component and a printed wiring board incorporating the inductor component, and to a method for manufacturing an inductor component to be incorporated in a printed wiring board.

2. Discussion of the Background

In Japanese Laid-Open Patent Publication No. 2009-16504, spiral patterns are formed in multiple layers of a multilayer substrate, and the spiral patterns in different layers are connected. The entire contents of this publication are incorporated herein by reference.

SUMMARY OF THE INVENTION

According to one aspect of the present invention, a wiring board includes a substrate having a cavity portion, a buildup layer formed on the substrate and having conductive layers and insulation layers, and an inductor component accommodated in the cavity portion of the substrate and having second insulation layers and second conductive patterns. The substrate, the buildup layer and the inductor component satisfy that a ratio of P1/S1 is set greater than a ratio of P2/S2, where S1 represents a cross-sectional area of the inductor component, P1 represents a sum of cross-sectional areas of the second conductive patterns, S2 represents a sum of cross sectional areas of the substrate and the buildup layer, P2 represents a sum of cross-sectional areas of the conductive layers, and the cross sectional areas is areas of cross sections taken in the thickness direction of the substrate, the buildup layer and the inductor component.

According to another aspect of the present invention, a method for manufacturing a wiring board includes preparing an inductor component having second insulation layers and second conductive patterns, accommodating the inductor component into a cavity portion of a substrate, and forming on the substrate a buildup layer having conductive layers and insulation layers. The substrate, the buildup layer and the inductor component satisfy that a ratio of P1/S1 is set greater than a ratio of P2/S2, where S1 represents a cross-sectional area of the inductor component, P1 represents a sum of cross-sectional areas of the second conductive patterns, S2 represents a sum of cross sectional areas of the substrate and the buildup layer, P2 represents a sum of cross-sectional areas of the conductive layers, and the cross sectional areas is areas of cross sections taken in a thickness direction of the substrate, the buildup layer and the inductor component.

According to yet another aspect of the present invention, a printed wiring board includes a core substrate having a cavity portion and having a first surface and a second surface on the opposite side of the first surface, an inductor component accommodated in the cavity portion of the core substrate, a filler resin filling a gap formed between the core substrate and the inductor component in the cavity portion of the core substrate, and a first buildup layer formed on the first surface of the core substrate and on the inductor component. The inductor component has a coil layer forming a wiring pattern on a plane, a second insulation layer formed on the coil layer, an electrode formed on the second insulation layer, and a via conductor formed in the second insulation layer and connecting the coil layer and the electrode, the inductor component is accommodated in the cavity portion of the core substrate such that the electrode faces the first surface of the core substrate, and the first buildup layer includes a first interlayer resin insulation layer formed on the first surface of the core substrate and on the inductor component, a conductive layer formed on the first interlayer resin insulation layer, and a connection via conductor connecting the conductive layer and the electrode in the inductor component.

According to still another aspect of the present invention, a method for manufacturing an inductor component includes forming a lowermost insulation layer on a support sheet, forming a coil layer having a wiring pattern on the lowermost insulation layer, forming a second insulation layer on the coil layer and the lowermost insulation layer, forming in the second insulation layer a via-conductor opening reaching to the coil layer, forming an electrode on the second insulation layer, forming a via conductor in the via-conductor opening such that the electrode is connected to the coil layer, and separating the support body from the lowermost insulation layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a cross-sectional view of a wiring board according to a first embodiment of the present invention;

FIG. 2 is a cross-sectional view of an inductor component;

FIGS. 35(A)-35(C) are views of steps showing a method for manufacturing an inductor component according to the second embodiment;

FIGS. 36(A)-36(C) are views of steps showing a method for manufacturing an inductor component according to the second embodiment;

FIGS. 37(A)-37(B) are views of steps showing a method for manufacturing an inductor component according to the second embodiment;

FIGS. 38(A)-38(C) are views of steps showing a method for manufacturing an inductor component according to the second embodiment;

FIGS. 40(A)-40(C) are views of steps showing a method for manufacturing an inductor component according to the second embodiment;

FIGS. 46(A)-46(B) are views of steps showing a method for manufacturing an inductor component according to a first modified example of the second embodiment;

FIGS. 47(A)-47(C) are views of steps showing a method for manufacturing an inductor component according to the first modified example of the second embodiment;

FIGS. 49(A)-49(B) are views of steps showing a method for manufacturing an inductor component according to the first modified example of the second embodiment;

FIGS. 50(A)-50(B) are views of steps showing a method for manufacturing an inductor component according to the first modified example of the second embodiment;

FIGS. 57(A)-57(B) are plan views showing the uppermost and lowermost coil layers of a laminated coil;

FIGS. 58(A)-58(C) are views showing connection wiring and a common electrode of the uppermost coil layer of the laminated coil;

FIGS. 60(A)-60(B) are cross-sectional views of a printed wiring board according to a sixth embodiment of the present invention; and FIGS. 61(A)-61(B) are cross-sectional views of a printed wiring board and plan views of coil layers according to a seventh embodiment of the present invention.

DETAILED DESCRIPTION OF THE EMBODIMENTS

Figure 3:
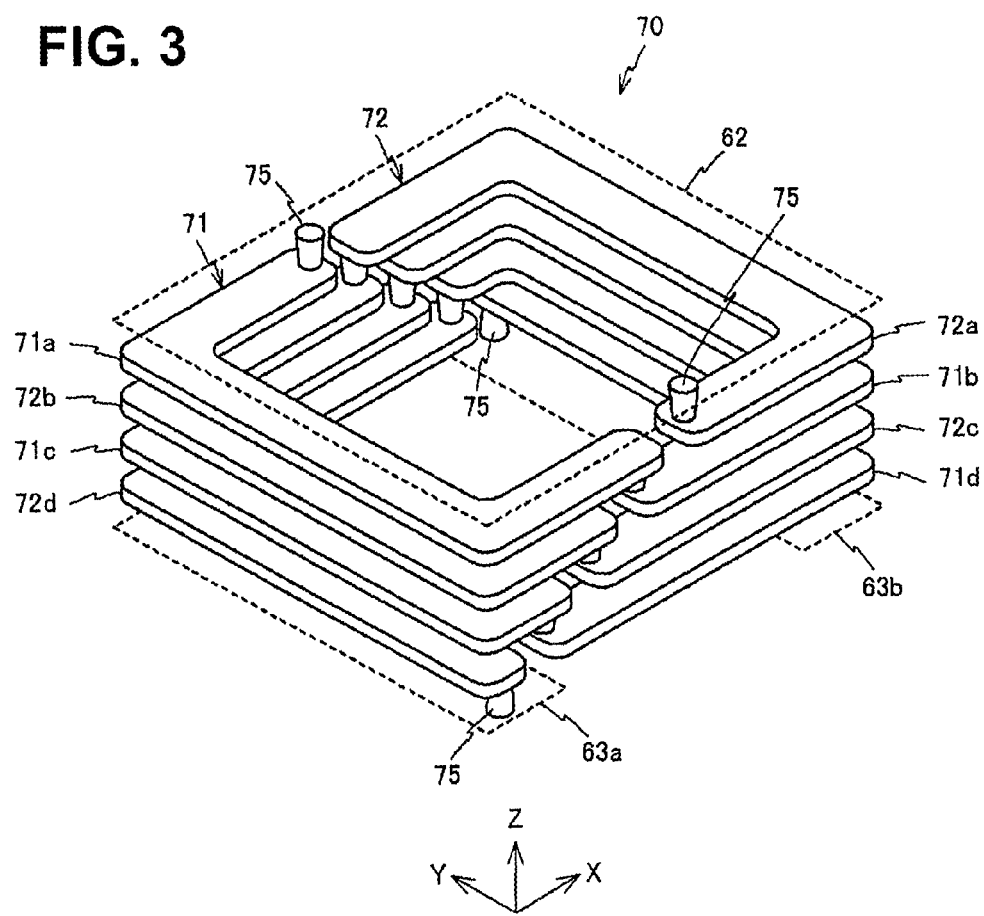
FIG. 3 is a perspective view of conductive patterns that form the inductor component.

The embodiments will now be described with reference to the accompanying drawings, wherein like reference numerals designate corresponding or identical elements throughout the various drawings.

First Embodiment

Coordinate axes of axis X, axis Y and axis Z which intersect at right angles to each other are used for purposes of description. Also, a cross section in a first embodiment is obtained by cutting a portion that includes an inductor with any plane perpendicular to the XY plane.

FIG. 1 is an XZ cross-sectional view of wiring board 10 (printed wiring board) according to a first embodiment. Core substrate (20A) is formed with insulative substrate (base material) 20 having first surface (F) and second surface (S) opposite the first surface; first buildup layer 11 formed on first surface (F) of insulative substrate 20; and second buildup layer 12 formed on second surface (S) of insulative substrate 20.

First buildup layer 11 is made up of first conductive layer 31 formed on first surface (F) of insulative substrate 20; first interlayer resin insulation layer 21 (insulation layer) formed on first surface (F) of insulative substrate 20 to cover first conductive layer 31; upper conductive layer 33 formed on first interlayer resin insulation layer 21; and solder-resist layer 23 formed on first interlayer resin insulation layer 21 to cover upper conductive layer 33.

Second buildup layer 12 is made up of second conductive layer 32 formed on second surface (S) of insulative substrate 20; second interlayer resin insulation layer 22 (insulation layer) formed on second surface (S) of insulative substrate 20 to cover second conductive layer 32; lower conductive layer 34 formed on second interlayer resin insulation layer 22; and solder-resist layer 24 formed on second interlayer resin insulation layer 22 to cover lower conductive layer 34.

Here, first buildup layer 11 and second buildup layer 12 each contain one layer of interlayer resin insulation layer (insulation layer). However, they may contain multiple insulation layers.

Inductor component 60 and chip capacitor 80 are accommodated in insulative substrate (base material) 20. Insulative substrate 20 is formed, for example, by impregnating reinforcing material such as glass fiber and aramid fiber with epoxy resin. As shown in FIG. 1, the following are formed in insulative substrate 20: penetrating holes (20a) for through-hole conductors; cavity (opening) (20b) in which inductor component 60 is accommodated; and cavity (opening) (20c) in which chip capacitor 80 is accommodated.

Through-hole conductors 40 are formed in penetrating holes (20a). Through-hole conductors 40 are made of copper plating.

When the cross-sectional area of insulative substrate 20, first buildup layer 11 and second buildup layer 12 in a thickness direction is set as (S2), and the sum of cross-sectional areas of first conductive layer 31, second conductive layer 32, upper conductive layer 33 and lower conductive layer 34 in the above cross section is set as (P2), P2/S2 is approximately 0.3. Here, (S2) is obtained by multiplying thickness (D1) of printed wiring board 10 in a direction of axis Z by width (D2) of printed wiring board 10 in a direction of axis X; thickness (D1) is the sum of the thicknesses of insulative substrate 20, first interlayer resin insulation layer 21, second interlayer resin insulation layer 22 and solder-resist layers (23, 24).

FIG. 2 is an XZ cross-sectional view of inductor component 60 accommodated in cavity (20b). As shown in FIG. 2, inductor component 60 has the following: multiple resin insulation layers (magnetic-substance layers, second insulation layers) (61a~61e); wiring patterns (second conductive patterns) (71a~71d, 72a~72d) formed on their respective magnetic-substance layers; electrode (pad) 62 formed on the upper surface of the uppermost resin insulation layer (uppermost magnetic-substance layer) (61a); electrodes (conductive patterns) (63a, 63b) formed on the lower surface of magnetic-substance layer (61e); protective film 64 covering conductive pattern 62; and protective film 65 covering conductive patterns (63a, 63b).

Magnetic-substance layers (61a~61e) are magnetic. Magnetic-substance layers (61a~61e) are formed by, for example, curing resin paste containing magnetic particles. The thickness of magnetic-substance layers (61a~61e) is approximately 15~60 μm. Protective films (64, 65) are formed to protect conductive pattern 62 and conductive patterns (63a, 63b).

FIG. 3 is a perspective view showing conductive patterns (71a~71d, 72a~72d). Conductive patterns (71a, 72a) are formed between magnetic-substance layer (61a) and magnetic-substance layer (61b). Conductive patterns (71a, 72a) are formed by patterning plated film formed on magnetic-substance layer (61b).

In the same manner, conductive patterns (71b, 72b) are formed between magnetic-substance layer (61b) and magnetic-substance layer (61c), conductive patterns (71c, 72c) are formed between magnetic-substance layer (61c) and magnetic-substance layer (61d), and conductive patterns (71d, 72d) are formed between magnetic-substance layer (61d) and magnetic-substance layer (61e). The thickness of conductive patterns (71a~71d, 72a~72d) is 10~80 μm. To enhance the performance of the inductor, the thickness of conductive patterns (71a~71d, 72a~72d) is preferred to be set greater than the thickness of magnetic-substance layers (61a~61e).

Figure 4:
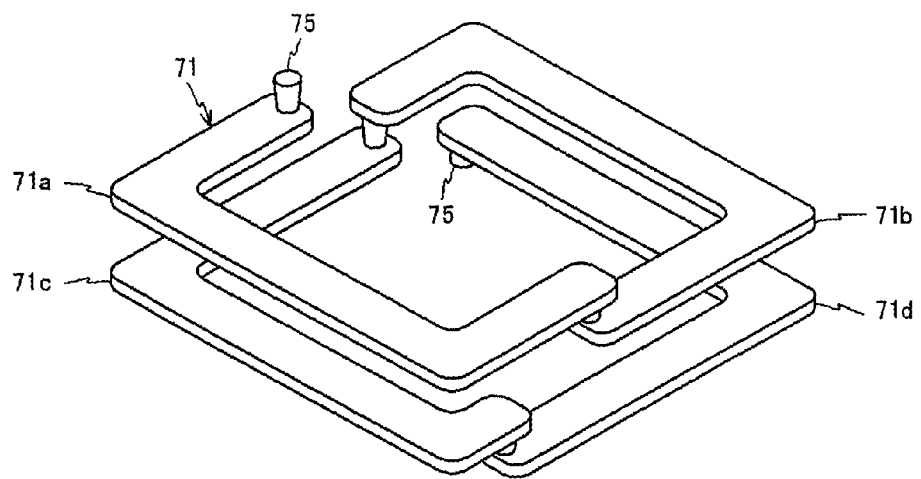
FIG. 4 is a perspective view of conductive patterns that form the inductor component.

FIG. 4 is a view showing conductive patterns (71a~71d). As shown in FIG. 4, conductive patterns (71a~71d) are connected to each other by via conductors 75 formed in magnetic-substance layers (61b, 61c, 61d), and form inductor (coil) 71.

Specifically, the (−Y) side end of conductive pattern (71a) is connected to the (−Y) side end of conductive pattern (71b). In the same manner, the (+Y) side end of conductive pattern (71b) is connected to the (+Y) side end of conductive pattern (71c), and the (−Y) side end of conductive pattern (71c) is connected to the (−Y) side end of conductive pattern (71d). Inductor 71 is formed by conductive patterns (71a~71d) connected in series. The number of turns of the inductor is two.

Figure 5:
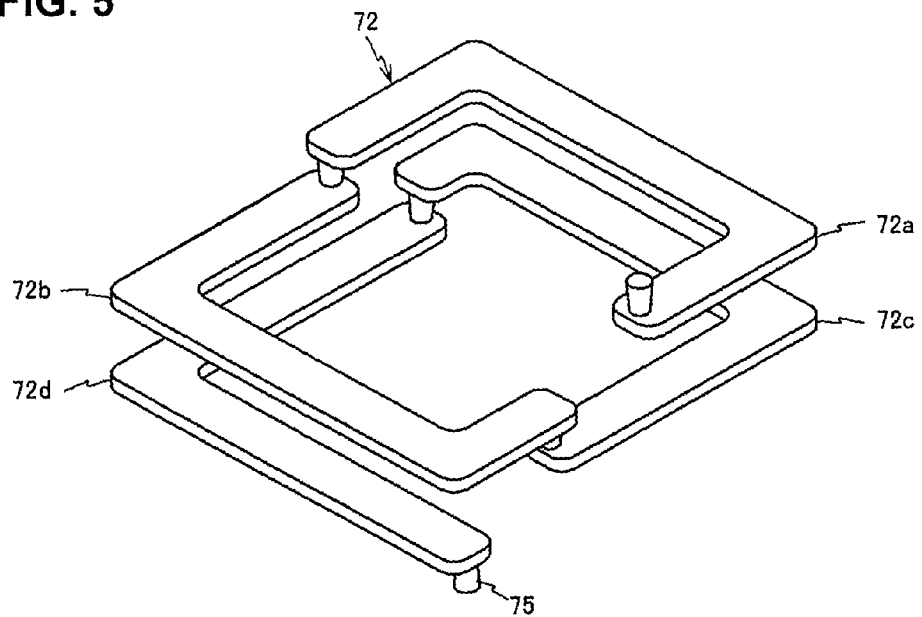
FIG. 5 is a perspective view of conductive patterns that form the inductor component.

FIG. 5 is a view showing conductive patterns (72a~72d). As shown in FIG. 5, conductive patterns (72a~-72d) are connected to each other by via conductors 75 formed in magnetic-substance layers (61b, 61c, 61d), and form inductor 72.

Specifically, the (+Y) side end of conductive pattern (72a) is connected to the (+Y) side end of conductive pattern (72b). In the same manner, the (−Y) side end of conductive pattern (72b) is connected to the (−Y) side end of conductive pattern (72c), and the (+Y) side end of conductive pattern (72c) is connected to the (+Y) side end of conductive pattern (72d). Inductor 72 is formed by conductive patterns (72a~72d) connected in series. The number of turns of inductor 72 is two.

As shown in FIG. 3, conductive pattern (71d) of inductor 71 is connected to electrode (63b) (lower electrode (lower first electrode)) by via conductor 75. Conductive pattern (72d) of inductor 72 is connected to electrode (63a) (lower electrode (lower second electrode)) by via conductor 75. In addition, inductor 71 and inductor 72 are connected parallel to each other by being connected to electrode 62 (upper electrode) through their respective via conductors.

In inductor component 60 of the first embodiment, multiple (two in FIG. 3) inductors are formed where a turn of coil is structured with conductive patterns in two layers. For example, conductive pattern (71a) and conductive pattern (71b) form a turn of coil, and conductive pattern (71a) and conductive pattern (71b) are formed in different layers. Conductive patterns (71a, 71b) and conductive patterns (72a, 72b) each form a turn of coil. Accordingly, compared with situations where one inductor is formed in a region with a size equal to that of inductor component 60, the area of current-flowing routes increases. As a result, the apparent resistance of inductor component 60 decreases, compared with that in one inductor. In addition, electrode 62 is preferred to be thicker than each of conductive patterns (71a~71d, 72a~72d) from the viewpoint of reducing the resistance of inductor component 60.

As shown in FIG. 2, when the area of a cross section of inductor component 60 in a thickness direction is set as (S1), and the sum of cross-sectional areas of second conductive patterns (71a~71d, 72a~72d) in that cross section is set as (P1), P1/S1 is 0.6~0.9, which is greater than the value of the above P2/S2. The cross-sectional area (S1) of inductor component 60 in a thickness direction is obtained by multiplying thickness (D3) in a direction of axis Z and width (D4) in a direction of axis X.

If the value of P1/S1 is less than 0.6, it is difficult to sufficiently secure the inductance of inductor component 60. On the other hand, if the value of P1/S1 exceeds 0.9, the ratio of second conductive patterns increases excessively. Therefore, short circuiting occurs between adjacent inductors, causing a decrease in inductor performance.

The ratio of P1/S1 to P2/S2 is 2 or greater and 3 or less. The same as above, if the value is less than 2, it is difficult to sufficiently secure the inductance of the inductor component. On the other hand, if the value exceeds 3, the ratio of second conductive patterns increases excessively. Therefore, short circuiting occurs between adjacent inductors, causing a decrease in inductor performance.

Next is an example of the method for manufacturing inductor component 60 described above.

Figure 6:
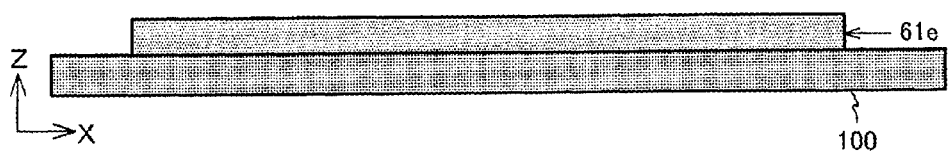
FIG. 6 is a view to illustrate a method for manufacturing an inductor component.

First, resin paste containing magnetic particles is applied on an upper surface of base substrate 100 having flat surfaces as shown in FIG. 6. Magnetic-substance layer (61e) is formed by curing the resin paste.

Figure 7:
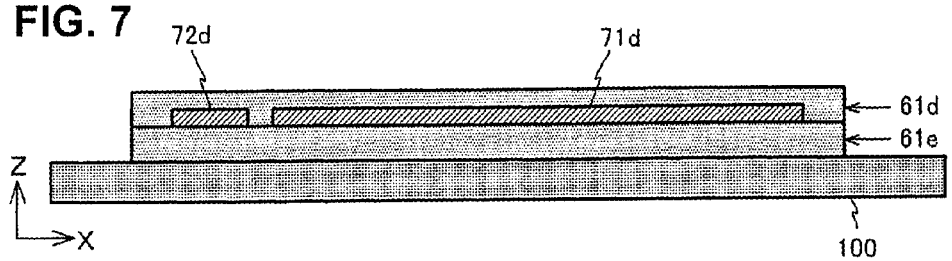
FIG. 7 is a view to illustrate the method for manufacturing an inductor component.

Next, electroless and electrolytic plating are performed on the upper surface of magnetic-substance layer (61e) to form plated film. Then, by patterning the plated film, conductive patterns (71d, 72d) are formed as shown in FIG. 7. Next, resin paste is applied on the upper surfaces of magnetic-substance layer (61e) and on conductive patterns (71d, 72d), and magnetic-substance layer (61d) is formed by curing the resin paste.

Figure 8:
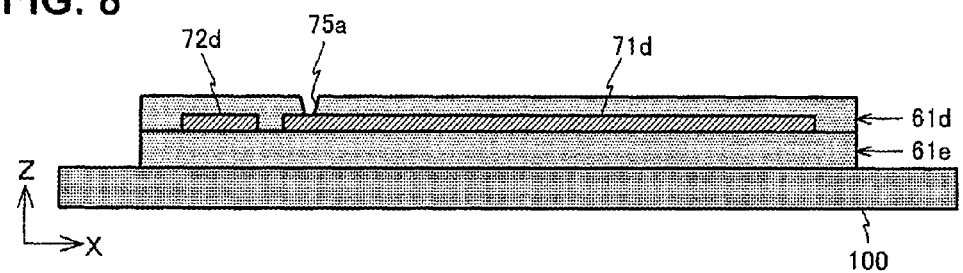
FIG. 8 is a view to illustrate the method for manufacturing an inductor component.

Next, laser light is irradiated on magnetic-substance layer (61d) to form via holes (75a) as shown in FIG. 8.

Figure 9:
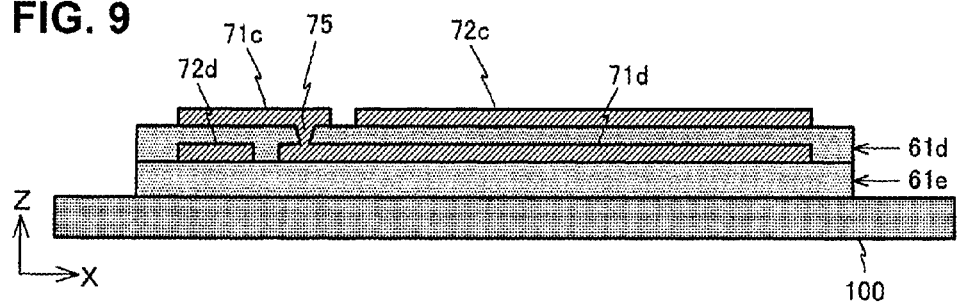
FIG. 9 is a view to illustrate the method for manufacturing an inductor component.

Next, electroless and electrolytic plating are performed on the upper surface of magnetic-substance layer (61d) to form plated film. Then, the plated film is patterned so that conductive pattern (71c) connected to conductive pattern (71d) by via conductor 75 and conductive pattern (72c) connected to conductive pattern (72d) by via conductor 75 are formed on magnetic-substance layer (61d) as shown in FIG. 9.

Figure 10:
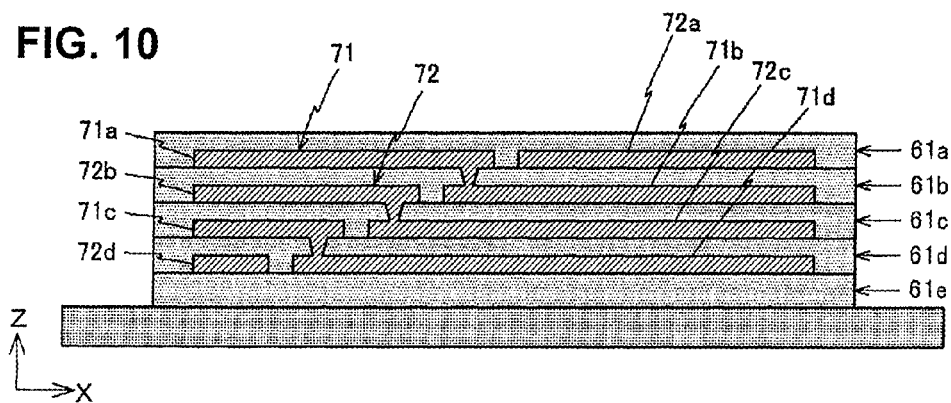
FIG. 10 is a view to illustrate the method for manufacturing an inductor component.

Using the same process, magnetic-substance layers (61c, 61b, 61a) and conductive patterns (71b, 72b, 71a, 72a) are formed in that order. In doing so, the body of inductor component 60 is formed, being made up of five magnetic-substance layers (61a~61e) and conductive patterns (71a~71d, 72a~72d) as shown in FIG. 10.

Figure 11:
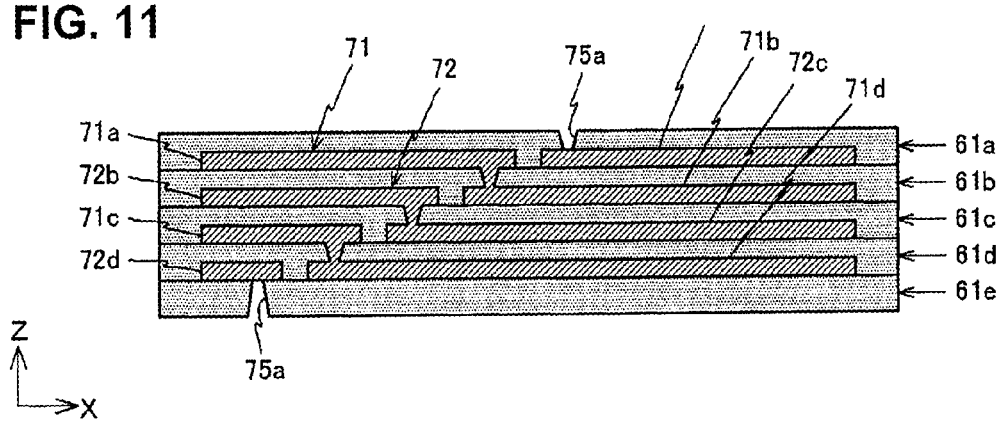
FIG. 11 is a view to illustrate the method for manufacturing an inductor component.

Next, as shown in FIG. 11, the body of inductor component 60 is separated from base substrate 100. Then, via holes are formed in magnetic-substance layers (61a, 61e).

Figure 12:
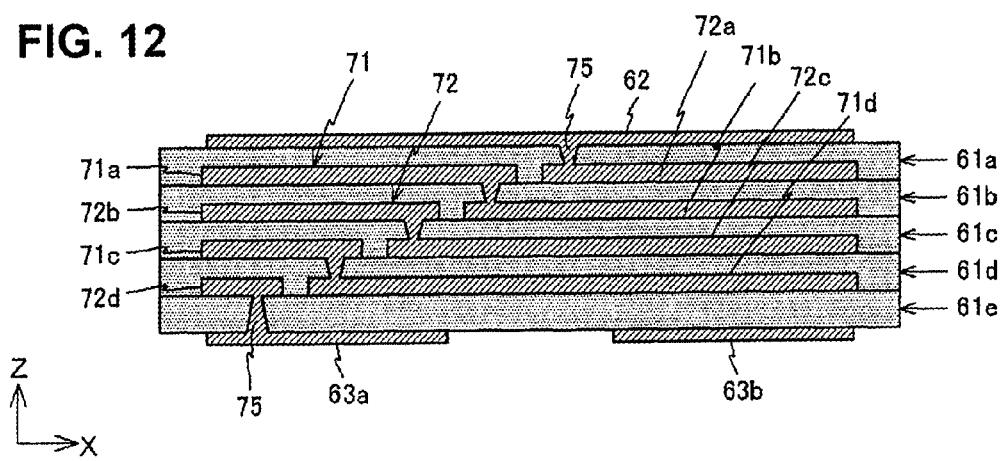
FIG. 12 is a view to illustrate the method for manufacturing an inductor component.

Next, as shown in FIG. 12, electroless and electrolytic plating are performed on surfaces of magnetic-substance layer (61a) and magnetic-substance layer (61e) to form plated films. Then, electrodes (62, 63a, 63b) are formed by patterning the plated films.

Electrode 62 is connected to conductive patterns (71a, 72a) by via conductors 75. Here, the via conductor connecting electrode 62 and conductive pattern (71a) is not shown.

Next, protective film 64 is formed on magnetic-substance layer (61a) to cover electrodes (62, 63a, 63b). Accordingly, inductor component 60 shown in FIG. 2 is completed.

As shown in FIG. 1, inductor component 60 described above is accommodated in cavity (20b) formed in insulative substrate 20. Also, chip capacitor 80 is accommodated in cavity (20c) formed in insulative substrate 20.

First conductive layer 31 is formed on the upper surface (the (+Z) side surface) of insulative substrate 20. In addition, second conductor 32 is formed on the lower surface (the (−Z) side surface) of insulative substrate 20. First conductive layer 31 and second conductive layer 32 are each 5~30 μm thick, and are patterned in a predetermined shape. First conductive layer 31 and second conductive layer 32 form electronic circuits of printed wiring board 10 and are electrically connected by through-hole conductors 40.

First interlayer resin insulation layer 21 is formed to cover the upper surface of insulative substrate 20. First interlayer resin insulation layer 21 is made of cured prepreg, for example.

The prepreg is made by impregnating glass fiber or aramid fiber, for example, with epoxy resin, polyester resin, bismaleimide triazine resin (BT resin), imide resin (polyimide), phenol resin, allyl polyphenylene ether resin (A-PPE resin) or the like. In printed wiring board 10, the thickness of first interlayer resin insulation layer 21 is 10~60 μm.

Multiple via holes (21a) are formed in first interlayer resin insulation layer 21. Via conductors (33a) are formed in via holes (21a). Via conductors (33a) are made of copper plating.

Second interlayer resin insulation layer 22 is formed to cover the lower surface of insulative substrate 20. Second interlayer resin insulation layer 22 is made of cured prepreg, for example, the same as first interlayer resin insulation layer 21. The thickness of second interlayer resin insulation layer 22 is 10~60 μm, the same as first interlayer resin insulation layer 21.

Multiple via holes (22a) are formed in second interlayer resin insulation layer 22. Via conductors (34a) are formed in via holes (22a). Via conductors (34a) are made of copper plating.

Upper conductive layer 33 is formed on the upper surface of first interlayer resin insulation layer 21. Also, lower conductive layer 34 is formed on the lower surface of second interlayer resin insulation layer 22. Upper conductive layer 33 and lower conductive layer 34 are each 5~20 μm thick, and are patterned in a predetermined shape. Then, upper conductive layer 33 is electrically connected to first conductive layer 31, inductor component 60 and chip capacitor 80 by via conductors (33a) formed in first interlayer resin insulation layer 21. Also, lower conductive layer 34 is electrically connected to second conductive layer 32 and inductor component 60 by via conductors (34a) formed in second interlayer resin insulation layer 22. Via conductors connected to the inductor component are referred to as connection via conductors.

Solder-resist layer 23 is formed to cover first interlayer resin insulation layer 21. Also, solder-resist layer 24 is formed to cover second interlayer resin insulation layer 22.

Multiple openings (23a) are formed in solder-resist layer 23. Upper surfaces of the upper conductive layer and via conductors exposed through openings (23a) work as pads for connection with an electronic component. Then, solder connection layers 51 with a double-layer structure of nickel-plated film and gold-plated film are formed in openings (23a) to cover pad surfaces. Terminals of an electronic component mounted on printed wiring board 10 are connected to solder connection layers 51 through solder 53.

In the same manner, multiple openings (24a) are formed in solder-resist layer 24. Then, solder connection layers 51 with a double-layer structure of nickel-plated film and gold-plated film are formed in the openings to cover the surface of lower conductive layer 34. The printed wiring board is connected to a motherboard through solder 54 formed on solder connection layers 51.

Next, a method for manufacturing the above printed wiring board 10 is described.

Figure 13:
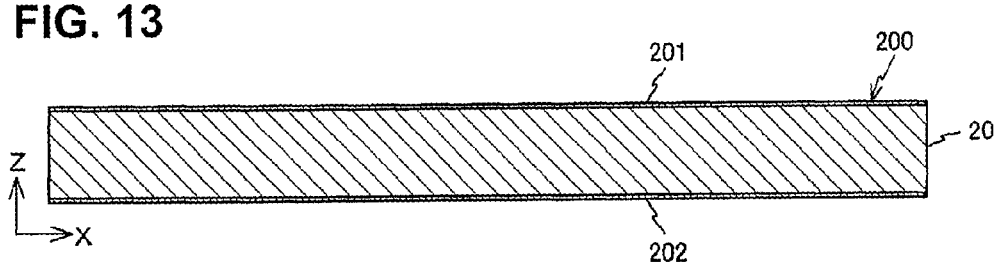
FIG. 13 is a view to illustrate a method for manufacturing a wiring board.

First, copper-clad laminate 200 is prepared as shown in FIG. 13.

Figure 14:
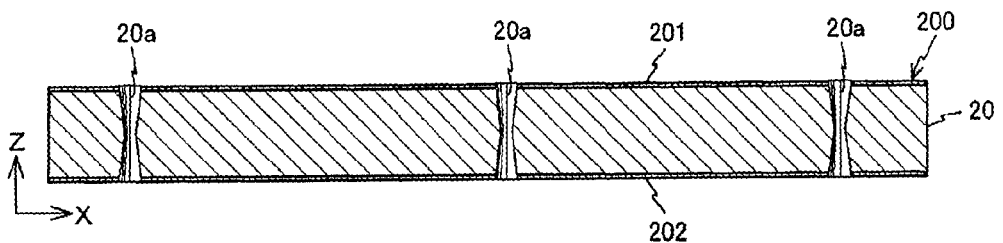
FIG. 14 is a view to illustrate the method for manufacturing a wiring board.
Figure 15:
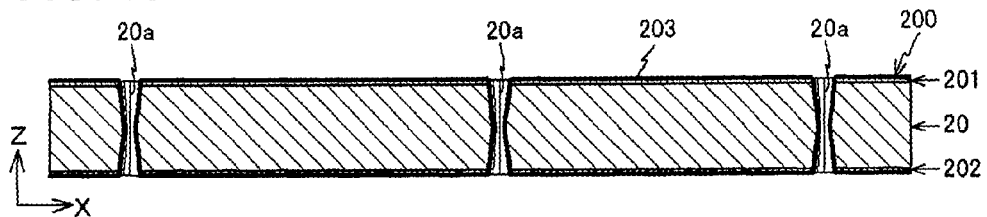
FIG. 15 is a view to illustrate the method for manufacturing a wiring board.

Next, as shown in FIG. 14, a $CO_2$ laser, for example, is used to form penetrating holes (20a) in copper-clad laminate 200. At that time, laser light is irradiated from both the upper and lower surfaces of copper-clad laminate 200. It is also an option to irradiate laser light only from the upper-surface side of copper-clad laminate 200. Then, a catalyst mainly containing palladium (Pd), for example, is attached to surfaces of copper-clad laminate 200 and on the inner walls of penetrating holes (20a). Then, electroless copper plating is performed on copper-clad laminate 200. Accordingly, electroless plated film 203 as a seed layer is formed on the surfaces of copper-clad laminate 200 and on the inner walls of penetrating holes (20a) as shown in FIG. 15.

Figure 16:
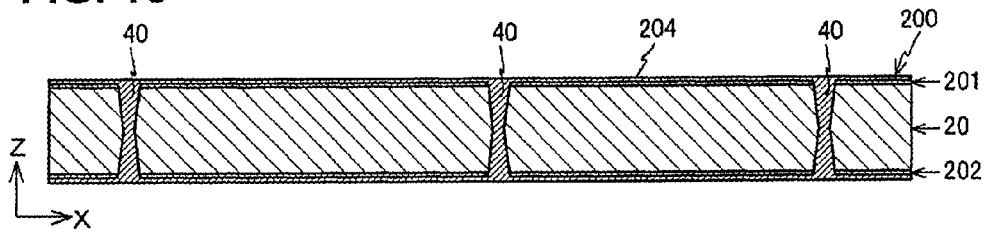
FIG. 16 is a view to illustrate the method for manufacturing a wiring board.

Next, electrolytic copper plating is performed on copper-clad laminate 200 having electroless plated film 203. Accordingly, plated film 204 is formed on surfaces of copper-clad laminate 200, and through-hole conductors 40 are formed in penetrating holes (20a) as shown in FIG. 16.

Figure 17:
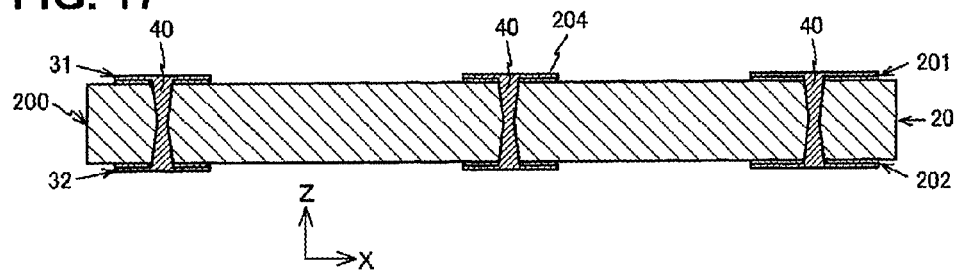
FIG. 17 is a view to illustrate the method for manufacturing a wiring board.

Next, by a tenting method or the like, copper foils (201, 202) and plated film 204 are patterned. In doing so, first conductive layer 31 made of copper foil 201 and plated film 204 and second conductive layer 32 made of copper foil 202 and plated film 204 are formed as shown in FIG. 17.

Figure 18:
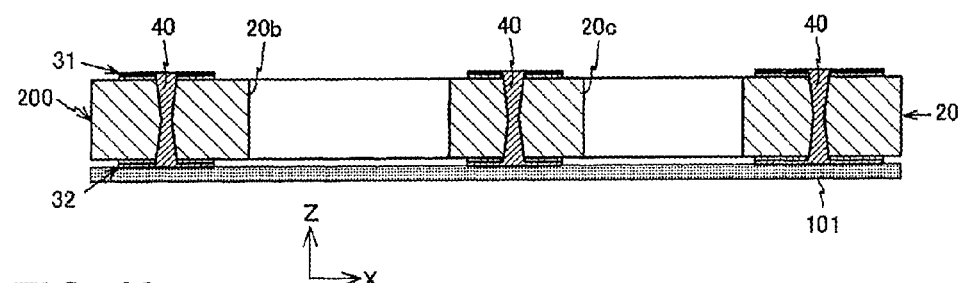
FIG. 18 is a view to illustrate the method for manufacturing a wiring board.

Next, using a router, for example, cavities (20b, 20c) are formed in insulative substrate 20 as shown in FIG. 18. Then, adhesive sheet 101 is pasted to the lower-surface side of copper-clad laminate 200.

Figure 19:
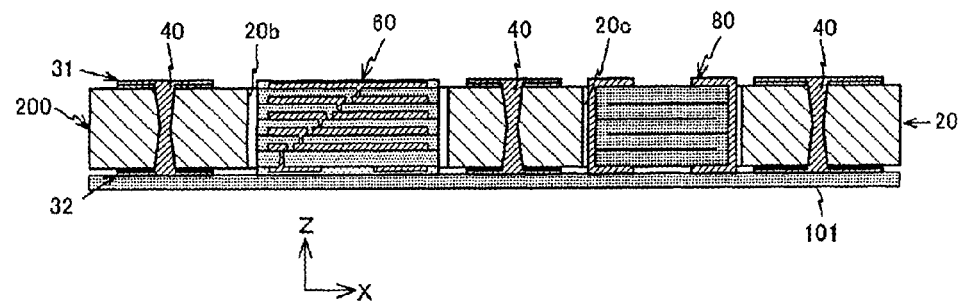
FIG. 19 is a view to illustrate the method for manufacturing a wiring board.

Next, inductor component 60 is accommodated in cavity (20b) and chip capacitor 80 is accommodated in cavity (20c) as shown in FIG. 19.

Figure 20:
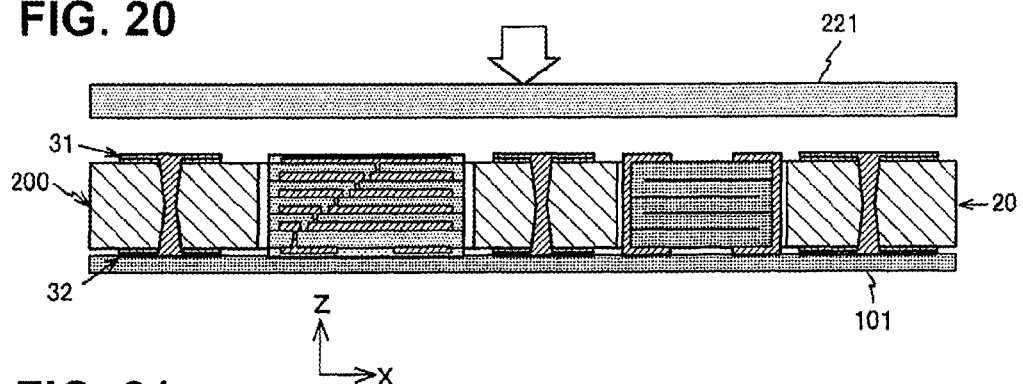
FIG. 20 is a view to illustrate the method for manufacturing a wiring board.

Next, film 221 made of thermosetting resin is positioned on the upper surface of copper-clad laminate 200 as shown in FIG. 20. Then, film 221 is laminated to copper-clad laminate 200 by conducting a lamination treatment on film 221. In doing so, first interlayer resin insulation layer 21 covering first conductive layer 31 is formed on the upper surface of insulative substrate 20 as shown in FIG. 21.

Figure 21:
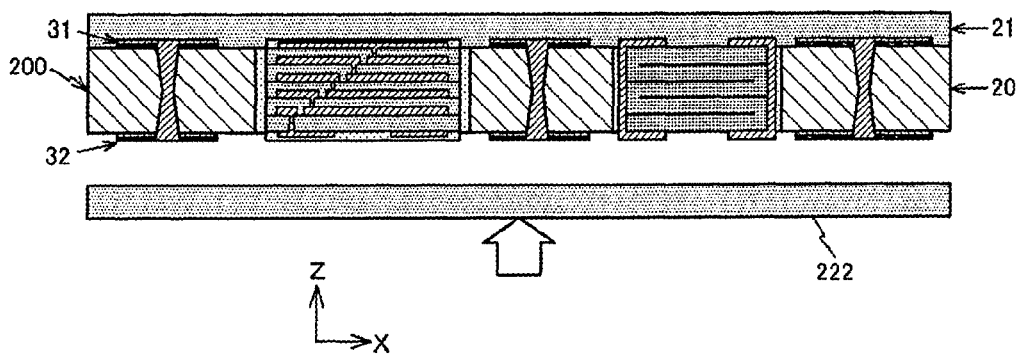
FIG. 21 is a view to illustrate the method for manufacturing a wiring board.
Figure 22:
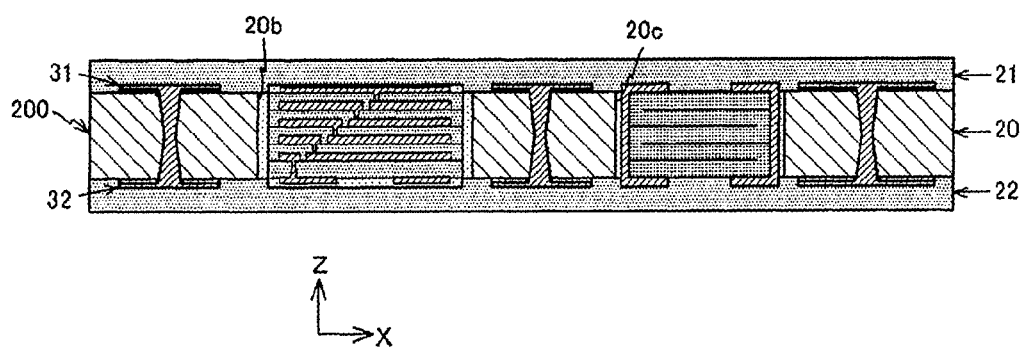
FIG. 22 is a view to illustrate the method for manufacturing a wiring board.

Next, adhesive sheet 101 is removed from copper-clad laminate 200 as shown in FIG. 21. Film 222 made of thermosetting resin is positioned under the lower surface of copper-clad laminate 200. Then, film 222 is laminated to copper-clad laminate 200 by conducting a lamination treatment on film 222. In doing so, second interlayer resin insulation layer 22 covering second conductive layer 32 is formed on the lower surface of insulative substrate 20 as shown in FIG. 22.

In addition, during the above procedure, resin of films (221, 222) seeps into cavities (20b, 20c) and fills the cavities.

Figure 23:
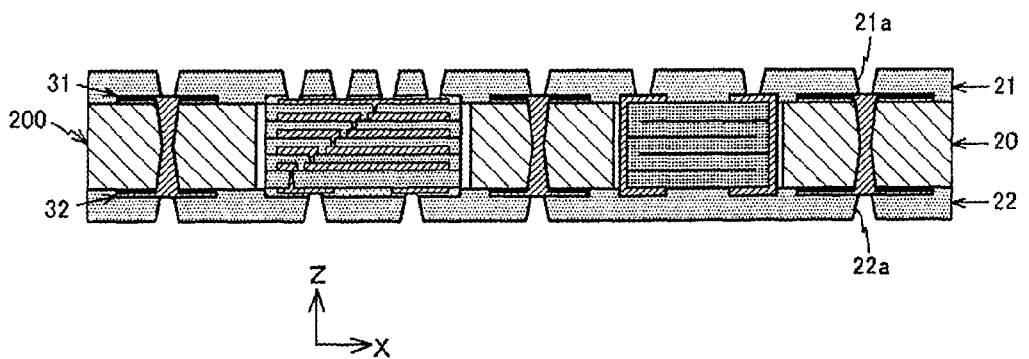
FIG. 23 is a view to illustrate the method for manufacturing a wiring board.

Next, laser light is irradiated respectively on first interlayer resin insulation layer 21 and second interlayer resin insulation layer 22 so that via holes (21a, 22a) are formed as shown in FIG. 23.

Figure 24:
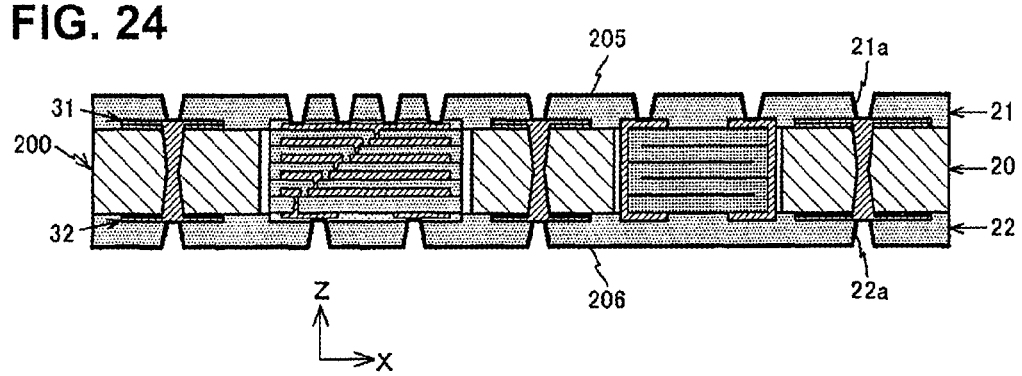
FIG. 24 is a view to illustrate the method for manufacturing a wiring board.

Next, copper-clad laminate 200 is immersed in an electroless copper plating solution. In doing so, electroless plated film 205 is formed on the surface of first interlayer resin insulation layer 21 and the inner walls of via holes (21a) as shown in FIG. 24. Also, electroless plated film 206 is formed on the surface of second interlayer resin insulation layer 22 and the inner walls of via holes (22a).

Figure 25:
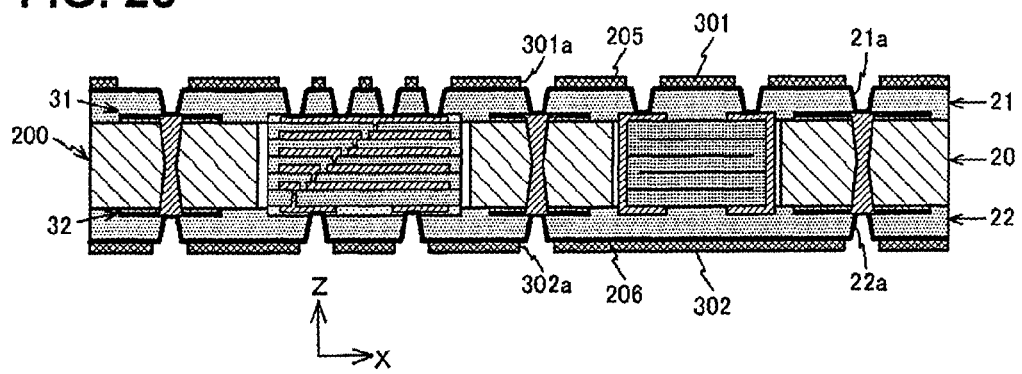
FIG. 25 is a view to illustrate the method for manufacturing a wiring board.

Next, plating resists (301, 302) are formed on the surfaces of electroless plated films (205, 206) (FIG. 25).

Figure 26:
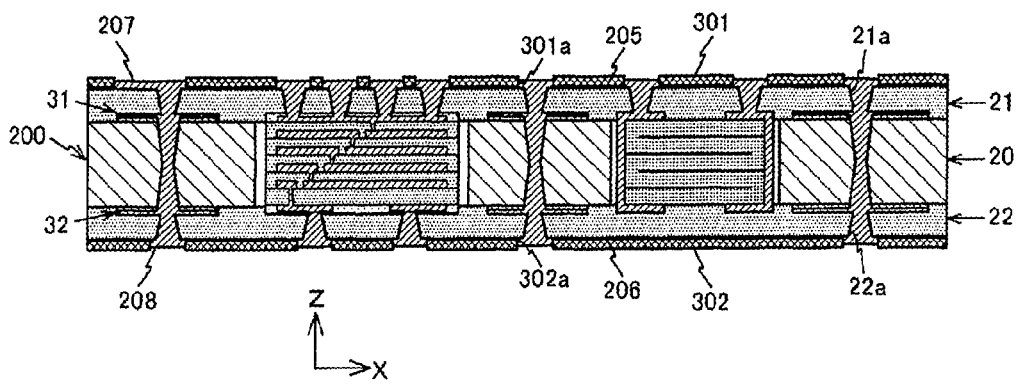
FIG. 26 is a view to illustrate the method for manufacturing a wiring board.

Next, electrolytic copper plating is performed on electroless plated films (205, 206) exposed through openings (301a, 302a) of plating resists (301, 302). Accordingly, electrolytic plated films (207, 208) are formed on electroless plated films exposed from plating resists (301, 302) as shown in FIG. 26.

Figure 27:
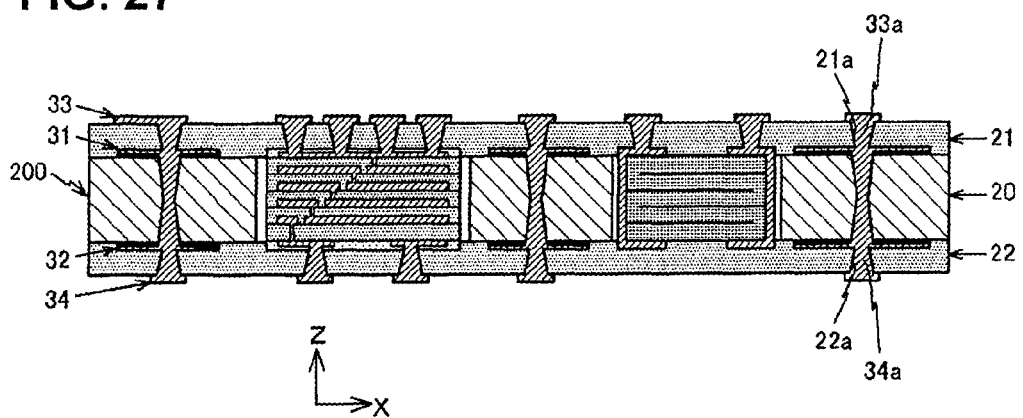
FIG. 27 is a view to illustrate the method for manufacturing a wiring board.

Next, plating resists (301, 302) are removed. Then, electroless plated films (205, 206) between portions of electrolytic plated films are etched away. Accordingly, as shown in FIG. 27, upper conductive layer 33 is formed on the surface of first interlayer resin insulation layer 21, and via conductors (33a) are formed in via holes (21a). Also, lower conductive layer 34 is formed on the surface of second interlayer resin insulation layer 22, and via conductors (34a) are formed in via holes (22a).

Figure 28:
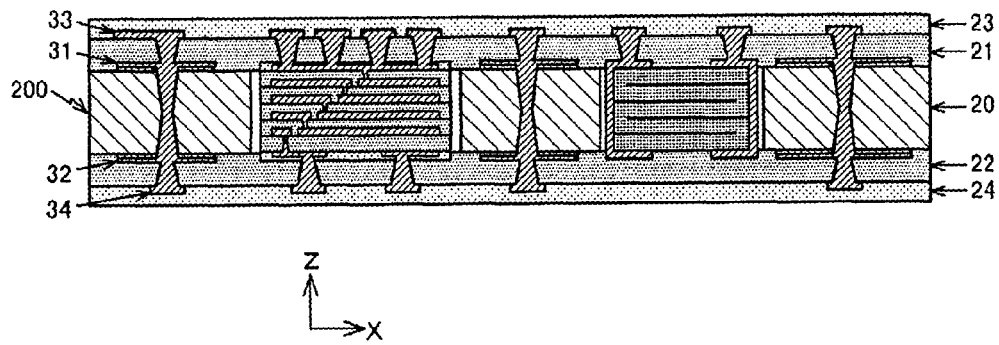
FIG. 28 is a view to illustrate the method for manufacturing a wiring board.

Next, as shown in FIG. 28, solder-resist layers (23, 24) are respectively formed on first interlayer resin insulation layer 21 and second interlayer resin insulation layer 22 to cover upper conductive layer 33 and lower conductive layer 34.

Figure 29:
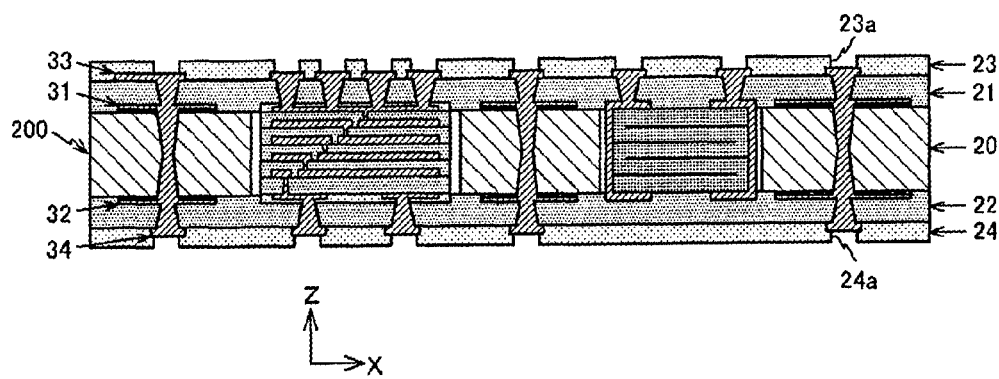
FIG. 29 is a view to illustrate the method for manufacturing a wiring board.
Figure 30:
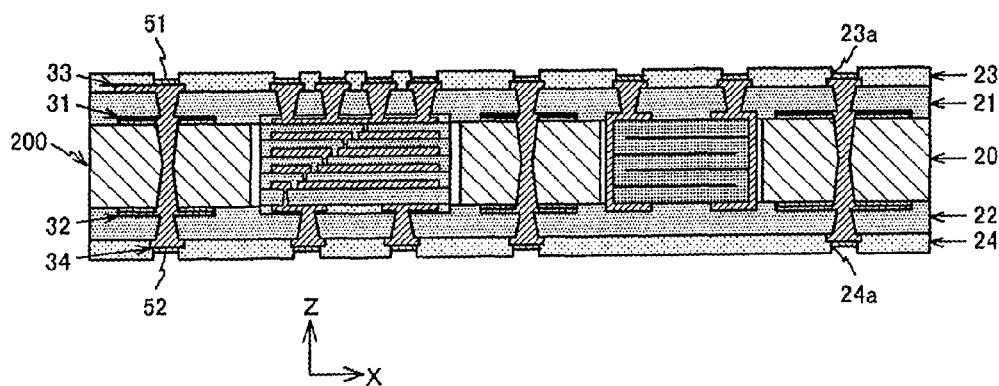
FIG. 30 is a view to illustrate the method for manufacturing a wiring board.

Next, as shown in FIG. 29, openings (23a, 24a) are formed in solder-resist layers (23, 24) so that upper conductive layer 33 and lower conductive layer 34 are at least partially exposed.

Next, solder connection layers (51, 52) made of electroless Ni/Pd/Au or the like are formed on upper conductive layer 33 and lower conductive layer 34 exposed through openings (23a, 24a). Accordingly, printed wiring board 10 shown in FIG. 1 is completed.

In the first embodiment, inductor component 60 is accommodated in cavity (20b) formed in insulative substrate 20. Therefore, regardless of the layer structure of printed wiring board 10, the space factor of inductor component 60 is sufficiently secured. Appropriate inductance is obtained.

If an inductor is formed in first buildup layer 11 or second buildup layer 12, the space factor of the inductor depends on the number of conductive layers in the buildup layer, thicknesses of first interlayer resin insulation layer 21, second interlayer resin insulation layer 22 and so forth. By contrast, in the first embodiment, inductor component 60 is manufactured in advance according to the purposes and usage requirements of printed wiring board 10. Accordingly, the space factor of inductor component 60 is sufficiently secured regardless of the layer structure of the buildup layer in printed wiring board 10. Therefore, an inductor with a suitable performance is formed according to the usage requirements of printed wiring board 10.

From the above, when a low voltage microprocessor whose drive voltage and power consumption are low is mounted on printed wiring board 10 of the first embodiment, power is constantly supplied to the microprocessor from printed wiring board 10 through circuits that include inductor component 60 and chip capacitor 80.

In the first embodiment, a buildup layer made up of first conductive layer 31, upper conductive layer 33 and first interlayer resin insulation layer 21 is formed on the upper surface of insulative substrate 20, and a second buildup layer made up of second conductive layer 32, lower conductive layer 34 and second interlayer resin insulation layer 22 is formed on the lower surface of insulative substrate 20, for example. However, that is not the only option, and buildup layers made up of three or more conductive layers and two or more interlayer resin insulation layers may be formed on surfaces of insulative substrate 20.

The material for a substrate is not limited specifically. Namely, metals such as Cu and Al as well as semiconductor materials such as Si may also be used for a substrate instead of insulative resin. Also, a substrate may have a multilayer structure made by alternately laminating a metal and resin.

In the first embodiment, the thickness of conductive patterns (71a~71d, 72a~72d) of inductor component 60 is greater than the thickness of conductive layers (31~34) (conductive layers on the insulative substrate or conductive layers of buildup layers). However, that is not the only option, and first buildup layer 11 and second buildup layer 12 may include a conductive layer whose thickness is greater than the thickness of conductive patterns (71a~71d, 72a~72d).

In the first embodiment, inductor component 60 is formed with inductors (71, 72) connected parallel. However, that is not the only option, and inductor component 60 may be formed with one inductor. In the inductor component shown in FIG. 3, the resistance of the inductors is low, since two pairs of inductors are connected parallel. Therefore, an inductor component with low resistance is obtained. Also, the number of turns of inductors (71, 72) is not limited to two, and may be three or more.

Figure 31:
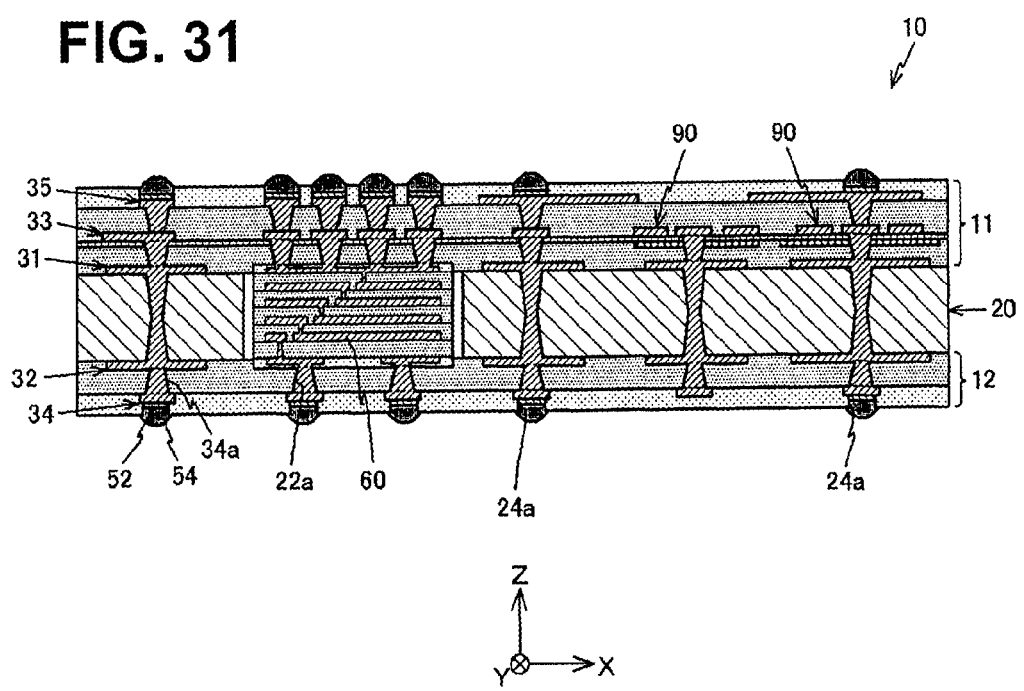
FIG. 31 is a view to illustrate the method for manufacturing a wiring board.

In the first embodiment, chip capacitor 80 is accommodated in insulative substrate 20. However, as shown in FIG. 31, thin-film capacitor 90 may be formed in first buildup layer 11 instead of chip capacitor 80. By forming thin-film capacitor 90 between a semiconductor element (not shown in the drawing) and inductor component 60 in a direction of axis Z, a stable power supply is achieved.

Materials for insulative substrate 20, first interlayer resin insulation layer 21, second interlayer resin insulation layer 22 and solder-resist layers (23, 24) may be selected freely according to usage requirements or the like of printed wiring board 10. For example, first interlayer resin insulation layer 21 and second interlayer resin insulation layer 22 may be formed with liquid or film thermosetting resin, their composites or RCF (resin-coated copper foil) instead of using prepreg.

Nickel, titanium, chromium or the like may be used as the material for electroless plating. PVD film or CVD film may be used instead of electroless plating. When PVD film or CVD film is used, a catalyst is not required.

In the same manner, nickel, titanium, chromium or the like may be used as the material for electrolytic plating.

Also, plating includes depositing conductor (such as metal) in layers on a surface of metal or resin as well as the deposited conductor (such as a metallic layer) formed by such deposition. In addition, plating includes wet plating such as electrolytic plating and electroless plating as well as dry plating such as PVD (physical vapor deposition) and CVD (chemical vapor deposition).

Also, the method for forming or patterning conductive layers (31~34) is not limited specifically, and a semi-additive method, subtractive method or the like may be selected appropriately according to the usage of printed wiring board 10.

Second Embodiment

Figure 32:
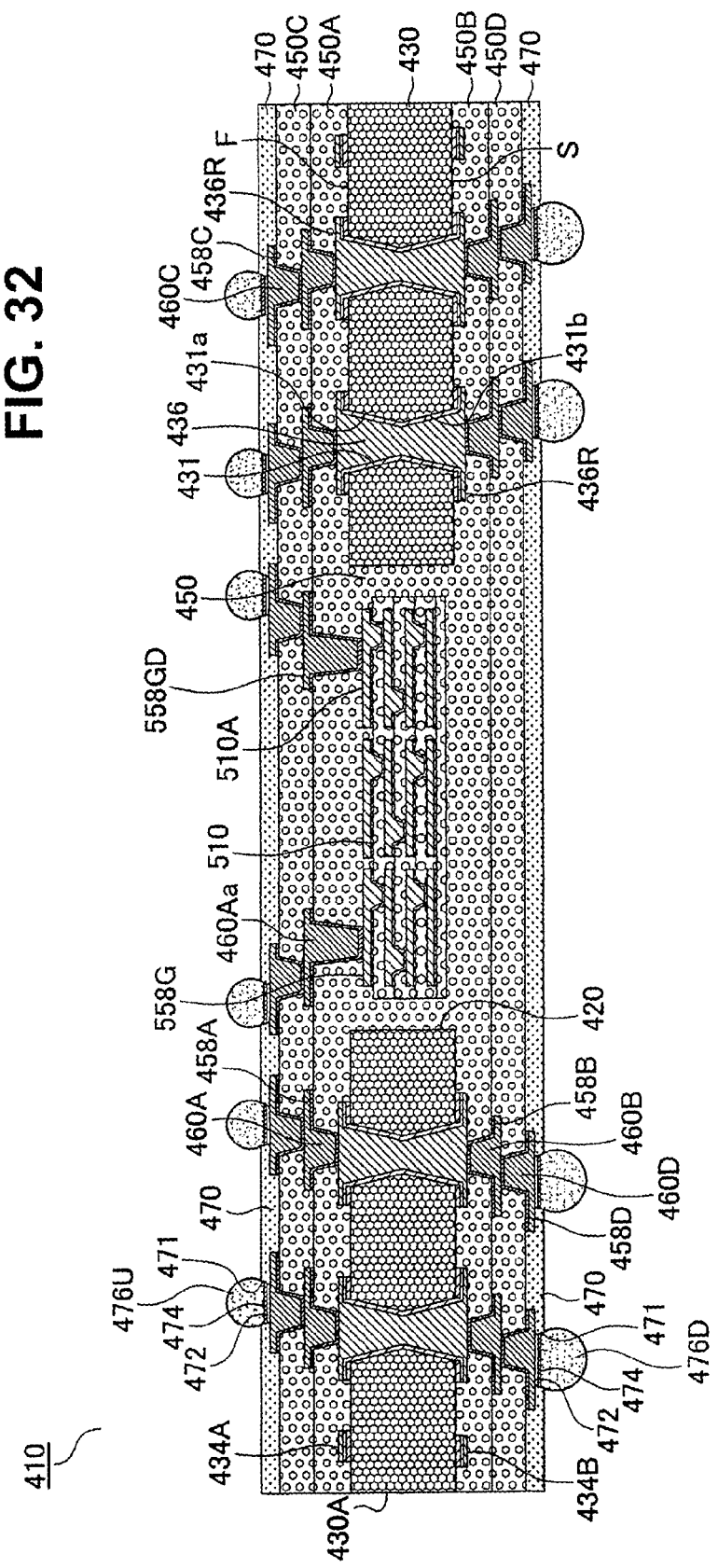
FIG. 32 is a cross-sectional view of a printed wiring board according to a second embodiment of the present invention.

FIG. 32 is a cross-sectional view of printed wiring board 410 according to a second embodiment of the present invention. In printed wiring board 410, inductor component 510 is incorporated in core substrate 430 having first surface (F) and second surface (S) opposite the first surface. The core substrate has opening 420 to incorporate an inductor component, insulative substrate (430A) having a first surface and a second surface opposite the first surface, first conductive layer (434A) on the first surface of the insulative substrate, second conductive layer (434B) on the second surface of the insulative substrate, and through-hole conductors 436 connecting first conductive layer (434A) and second conductive layer (434B).

Through-hole conductors 436 are formed by filling plated film in penetrating holes 431 formed in the insulative substrate. Penetrating hole 431 is made up of first opening portion (431a) formed on the first-surface side of the insulative substrate and of second opening portion (431b) formed on the second-surface side. First opening portion (431a) tapers from the first surface toward the second surface, while second opening portion (431b) tapers from the second surface toward the first surface. First opening portion (431a) and second opening portion (431b) are connected in the insulative substrate.

The first surface of the core substrate corresponds to the first surface of the insulative substrate, and the second surface of the core substrate corresponds to the second surface of the insulative substrate. A first buildup layer is formed on first surface (F) of core substrate 430 and on the inductor component. The first buildup layer includes insulation layer (450A) (first interlayer resin insulation layer) formed on first surface (F) of core substrate 430 and on the inductor component, conductive layer (458A) (upper conductive layer) on insulation layer (450A), and via conductors (460A) which penetrate through insulation layer (450A) and connect the first conductive layer or through-hole conductors with conductive layer (458A). Furthermore, connection via conductors (460Aa) are formed in insulation layer (450A) to connect electrodes (558GD) of the inductor component with conductive layer (458A). The first buildup layer further includes insulation layer (450C) (uppermost interlayer resin insulation layer) on insulation layer (450A) and conductive layer (458A), conductive layer (458C) (uppermost conductive layer) on insulation layer (450C), and via conductors (460C) which penetrate through insulation layer (450C) and connect conductive layer (458A) or via conductors (460A, 460Aa) with conductive layer (458C).

A second buildup layer is formed under second surface (S) of core substrate 430 and the inductor component. The second buildup layer includes insulation layer (450B) (second interlayer resin insulation layer) formed under second surface (S) of core substrate 430 and the inductor component, conductive layer (458B) (lower conductive layer) under insulation layer (450B), and via conductors (460B) which penetrate through insulation layer (450B) and connect the second conductive layer or through-hole conductors with conductive layer (458B). The second buildup layer further includes insulation layer (450D) (lowermost interlayer resin insulation layer) under insulation layer (450B) and conductive layer (458B), conductive layer (458D) (lowermost conductive layer) under insulation layer (450D), and via conductors (460D) which penetrate through insulation layer (450D) and connect conductive layer (458B) with conductive layer (450D).

Solder-resist layers 470 having openings 471 are formed on the first buildup layer and the second buildup layer. Upper surfaces of conductive layers (458C, 458D) and via conductors (460C, 460D) exposed through openings of solder-resist layers work as pads. Metallic films (471, 472, 474) made of Ni/Pd/Au are formed on the pads, and solder bumps (476U, 476D) are formed on such metallic films. An IC chip is mounted on the printed wiring board through solder bumps (476U) formed on the first buildup layer, and the printed wiring board is mounted on a motherboard through solder bumps (476D) formed on the second buildup layer.

In printed wiring board 410 of the second embodiment, inductor component 510 is accommodated in opening 420 formed in core substrate 430. Opening 420 is penetrating hole (opening) 420 which reaches the second surface from the first surface of the insulative substrate. Filler resin 450 is filled in penetrating hole 420. The gap between a side wall of opening 420 (side wall of insulative substrate left exposed by opening 420) and the inductor component is filled with filler resin 450.

In the second embodiment, an inductor component is incorporated in the core substrate. Therefore, the inductor component can be incorporated in a printed wiring board without increasing the number of insulation layers in buildup layers. In the second embodiment, when an inductor component formed by alternately laminating multiple coil layers and resin insulation layers is incorporated in a printed wiring board, that does not increase the number of insulation layers on the core substrate (interlayer resin insulation layers in the first or second buildup layer). Since the thickness of a core substrate is usually greater than thicknesses of insulation layers on the core substrate, an inductor component with a greater number of coil layers can be incorporated in the printed wiring board without increasing the number of insulation layers on the core substrate in the second embodiment. An inductor component with high inductance is incorporated in a thin printed wiring board. In the second embodiment, the number of insulation layers (interlayer resin insulation layers) in a buildup layer is not required to be increased to incorporate a coil in a printed wiring board. If a coil is formed in a buildup layer by patterning, the number of insulation layers and conductive layers increases, making the printed wiring board thicker. When a coil is formed in the first buildup layer or the second buildup layer, the number of layers in the first or second buildup layer tends to increase. Warping tends to occur in the printed wiring board since the symmetry of the printed wiring board in a cross-sectional direction becomes degraded. However, since the number of insulation layers and conductive layers is set the same in the first and second buildup layers in the second embodiment, warping is slight in the printed wiring board.

Figure 33:
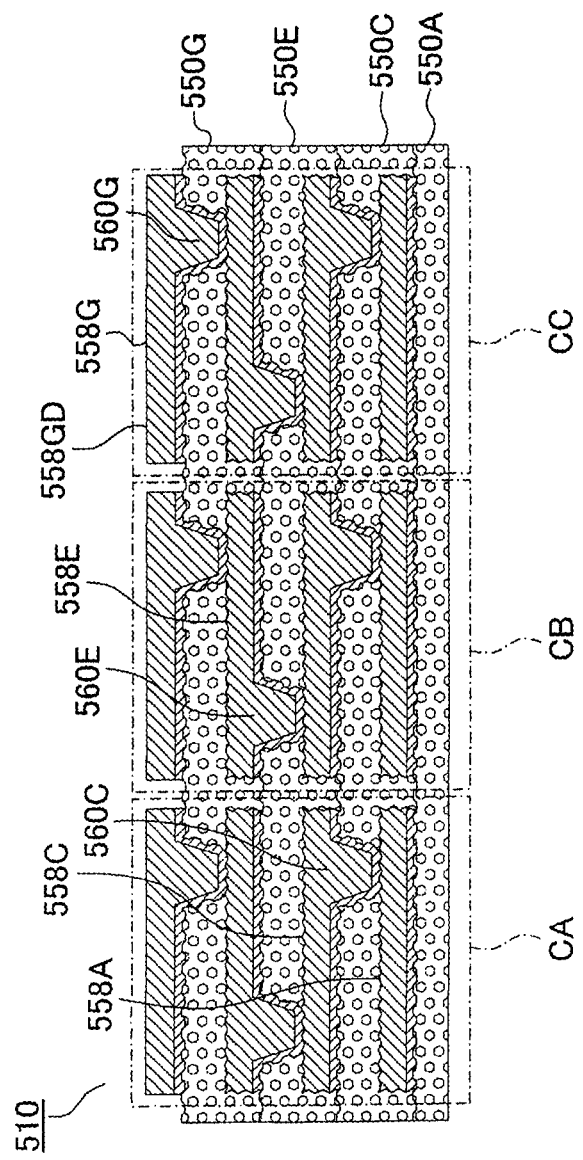
FIG. 33 is a cross-sectional view of an inductor component of the second embodiment.

FIG. 33 is a magnified view of inductor component 510 in FIG. 32. The inductor component includes lowermost resin insulation layer (550A), first coil layer (558A), resin insulation layers (550C, 550E, 550G) and coil layers (558C, 558E) on coil layer (558A), and electrodes (558GD) on resin insulation layer (550G) (uppermost resin insulation layer). The electrodes are exposed and no resin insulation layer or coating layer is formed on the electrodes in FIG. 33. The inductor component is incorporated in the core substrate in such a way that electrodes (558GD) face the first surface of the core substrate.

First coil layer (558A) is formed on first resin insulation layer (550A) (lowermost resin insulation layer). Second resin insulation layer (550C) is formed on first coil layer (558A) and on the first resin insulation layer, and second coil layer (558C) is formed on the second resin insulation layer. First coil layer (558A) and the second coil layer are connected by via conductors (560C) formed in the second resin insulation layer. Third resin insulation layer (550E) is formed on second coil layer (558C) and on the second resin insulation layer. Third coil layer (558E) is formed on the third resin insulation layer. Second coil layer (558C) and third coil layer (558E) are connected by via conductors (560E) formed in the third resin insulation layer. Fourth resin insulation layer (550G) (uppermost resin insulation layer) is formed on third coil layer (558E) and on the third resin insulation layer. Fourth coil layer (558G) (uppermost coil layer) is formed on the fourth resin insulation layer. Third coil layer (558E) and fourth coil layer (558G) are connected by via conductors (560G) formed in the fourth resin insulation layer. Portions of the fourth coil layer work as electrodes (558GD). Connection via conductors (460Aa) are formed on electrodes (558GD). In the second embodiment, the fourth coil layer corresponds to the uppermost coil layer, and the fourth resin insulation layer corresponds to the uppermost resin insulation layer. Except for the uppermost coil layer, the surfaces of inner coil layers (first coil layer (558A), second coil layer (558C), third coil layer (558E)) are roughened. Peeling seldom occurs between a resin insulation layer and a coil layer. The surface of the fourth coil layer (uppermost coil layer) may or may not be roughened. The inductor component in the second embodiment has resin insulation layers and coil layers alternately laminated, and coil layers in different layers are connected by via conductors in resin insulation layers. The inductor component in the second embodiment has multiple laminated coils (CA, CB, CC), and the laminated coils are connected to each other in parallel or in series. The inductor component in FIG. 33 is formed with three laminated coils (CA: left part of the drawing, CB: middle part of the drawing, CC: right part of the drawing). It is easy to connect each laminated coil. Resin insulation layers (550C, 550E, 550G) sandwiched by coil layers may contain magnetic-substance particles of iron-nickel alloys, iron alloys, amorphous alloys or the like. Inductance increases. The lowermost resin insulation layer may also contain magnetic-substance particles. Magnetic flux in the inductor component tends not to leak to the outside. Even if conductive circuits for ground or power source are formed in the second buildup layer directly under the inductor component, a decrease in inductance or an increase in loss of inductance is prevented. From such a viewpoint, a coating layer containing magnetic-substance particles is preferred to be formed on the uppermost coil layer and on the uppermost resin insulation layer. Even if conductive circuits such as ground and power source are formed in the first buildup layer directly above the inductor component, a decrease in inductance or an increase in loss of inductance is prevented. The coating layer may have openings to expose electrodes. The amount of magnetic-substance particles is 30~60 vol. %. By mixing magnetic-substance particles in resin insulation layers, the number of insulation layers and conductive layers decreases in the first and second buildup layers. Accordingly, the thickness of a printed wiring board with an inductor component incorporated in the core substrate can be set thinner.

Magnetic-substance film is preferred to be formed under the lowermost resin insulation layer, on the uppermost coil layer and on the uppermost resin insulation layer of an inductor component. Magnetic-substance film may further be formed on the side walls of the inductor component. Magnetic flux in the inductor component tends not to leak to the outside. To prevent inductance from decreasing and the quality factor from lowering, it is not required to arrange a region without conductive circuits directly above or directly under the inductor component. The volume of conductive circuits is unlikely to become unbalanced in the first buildup layer and the second buildup layer. A printed wiring board with less warping is provided. The lowermost resin insulation layer may be made of magnetic-substance film. When magnetic-substance film is formed on the uppermost coil layer and on the lowermost coil layer, such magnetic-substance film is preferred to be formed where a coating layer or a resin insulation layer containing magnetic-substance particles is placed in between.

In the above situation, the magnetic-substance film and the coating layer are preferred to have openings to expose the electrodes. The magnetic-substance film is formed by sputtering or the like. Iron (III) oxide or the like is used as a target.

Figure 55:
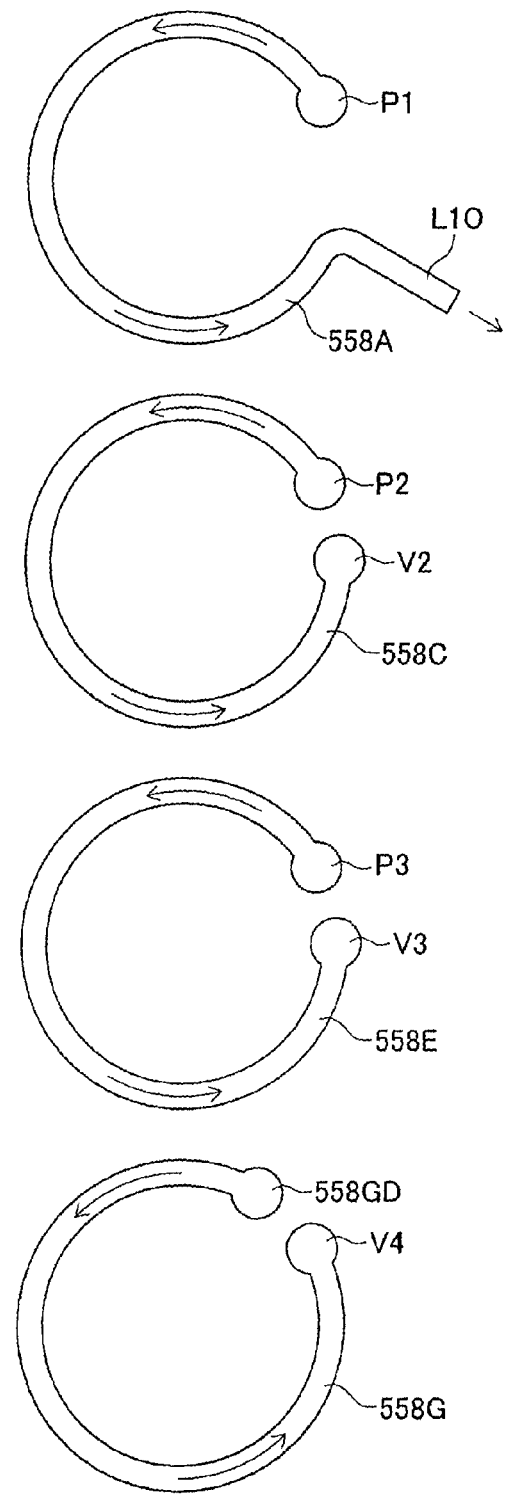
FIG. 55 is a plan view showing each coil layer of a laminated coil according to another example.

Coil layers (558A, 558C, 558E, 558G) are each made of a wiring pattern. An example of the shape of such patterns is shown in FIG. 55. Each coil layer is formed on a plane. First through fourth coil layers (558A, 558C, 558E, 558G) are formed as ring-shaped conductive circuits. Each coil layer is a conductive circuit shaped substantially as a complete circle. Accordingly, a four-turn coil is formed. The direction of the current flow in each coil layer is the same. Arrows in the drawings indicate the current directions. The direction is counterclockwise in the example. In addition, each coil layer is preferred to overlap in a cross-sectional direction.

The following is a description of first laminated coil (CA). At an end of uppermost coil layer (558G) (fourth coil layer), electrode (558GD) is formed to be connected to connection via conductor (460Aa) in the first buildup layer. The shape of the electrode is substantially circular. At the end opposite the electrode, the fourth coil layer has connection portion (V4) connected to via conductor (560G) formed in the uppermost resin insulation layer. The fourth coil layer and third coil layer (558E) are connected by via conductor (560G). The third coil layer has via pad (P3) to be connected to via conductor (560G). Via pad (P3) is formed at an end of the third coil layer. At the end opposite via pad (P3), the third coil layer has connection portion (V3) connected to via conductor (560E) formed in the third resin insulation layer. The third coil layer and second coil layer (558C) are connected by via conductor (560E). The second coil layer has via pad (P2) to be connected to via conductor (560E). Via pad (P2) is formed at an end of the second coil layer. At the end opposite via pad (P2), the second coil layer has connection portion (V2) connected to via conductor (560C) formed in the second resin insulation layer. The second coil layer and first coil layer (558A) are connected by via conductor (560C). The first coil layer has via pad (P1) to be connected to via conductor (560C). Via pad (P1) is formed at an end of the first coil layer. The other end of the first coil layer opposite via pad (P1) is connected to connection wiring (L1O), and connection wiring (L1O) is connected to the second laminated coil. The second laminated coil is the same as the first laminated coil, and the direction of the current flow is the same in the first laminated coil and in the second laminated coil. The uppermost coil layer of the second laminated coil is connected to connection wiring which is connected to the third laminated coil.

FIG. 57 shows another example of a laminated coil. Only the uppermost and lowermost coil layers are shown in the drawings. In such an example, each coil layer is a spiral conductive circuit (wiring pattern). Uppermost coil layer (658A) has electrode (658Aa) and connection portion (658Ab), the same as in the laminated coil shown in FIG. 55. In the coil shown in FIG. 57, via pad (658P) of lowermost coil layer (658B) is formed in the center of the lowermost coil layer, and the lowermost coil layer is connected to connection wiring (L658) at its periphery. When the number of coil layers is an even number, the electrode is formed at the periphery of the uppermost coil layer (FIG. 57(A)). When the number of coil layers is an odd number, electrode (658Aa) is formed in the center of uppermost coil layer (658A), and via pad (658P) of the lowermost coil layer is formed in the center of the lowermost coil layer (FIG. 57(B)).

Figure 34:
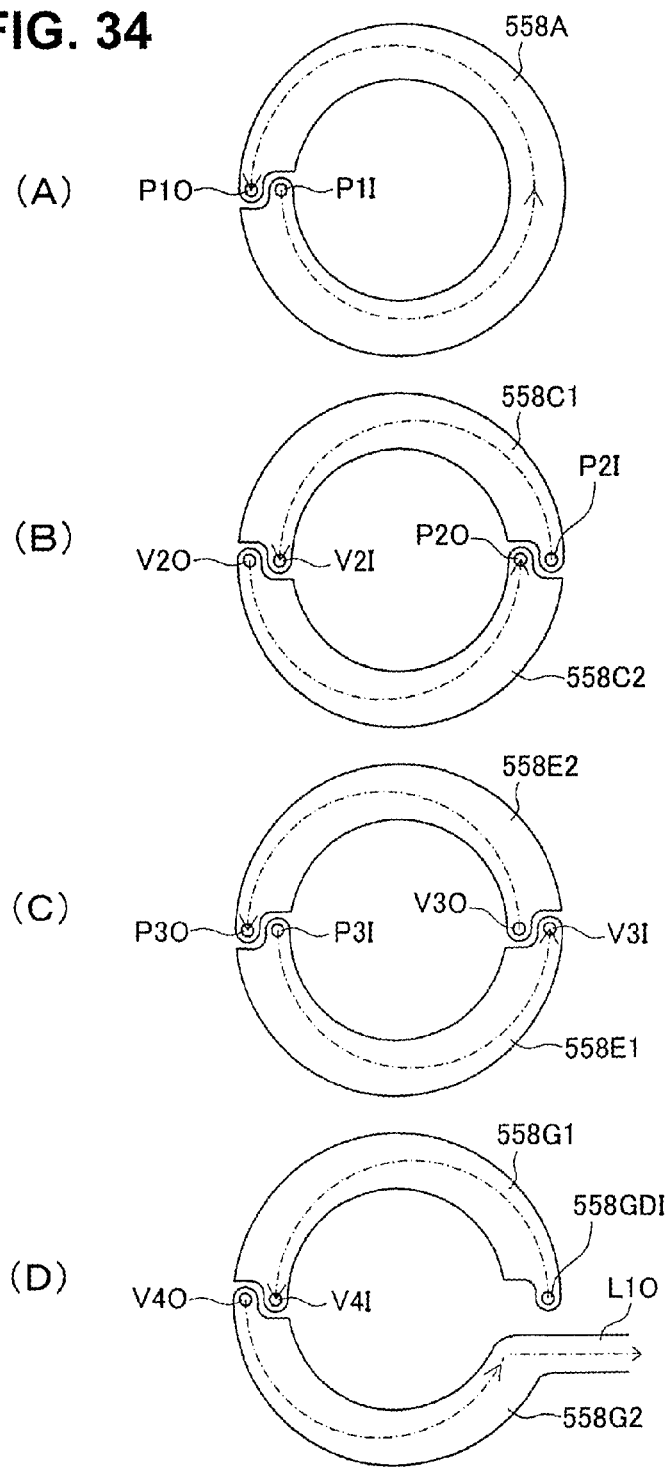
FIGS. 34(A)-34(D) are plan views showing each coil layer of an inductor component according to the second embodiment.
Figure 39:
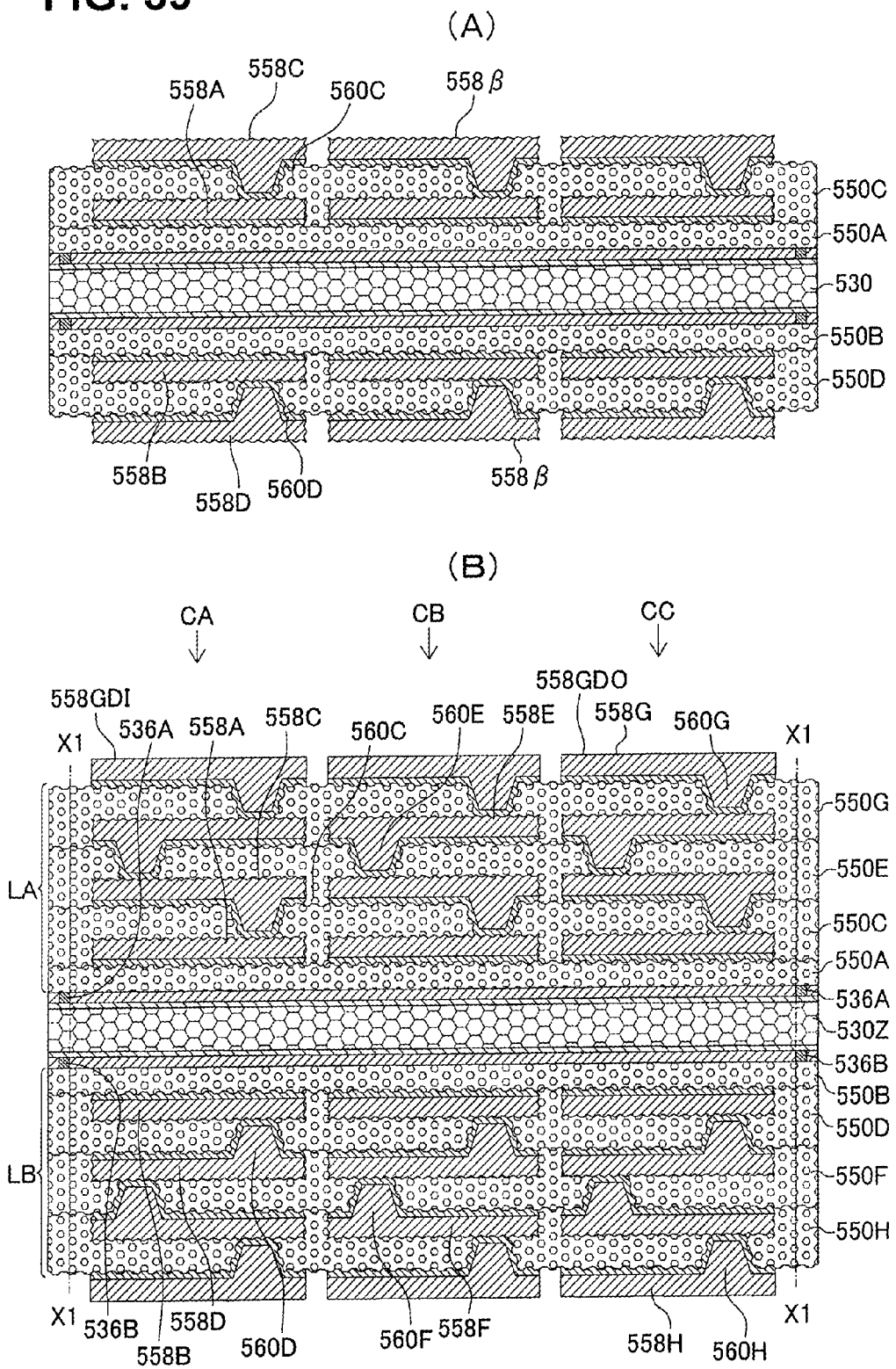
FIGS. 39(A)-39(B) are views of steps showing a method for manufacturing an inductor component according to the second embodiment.
Figure 41:
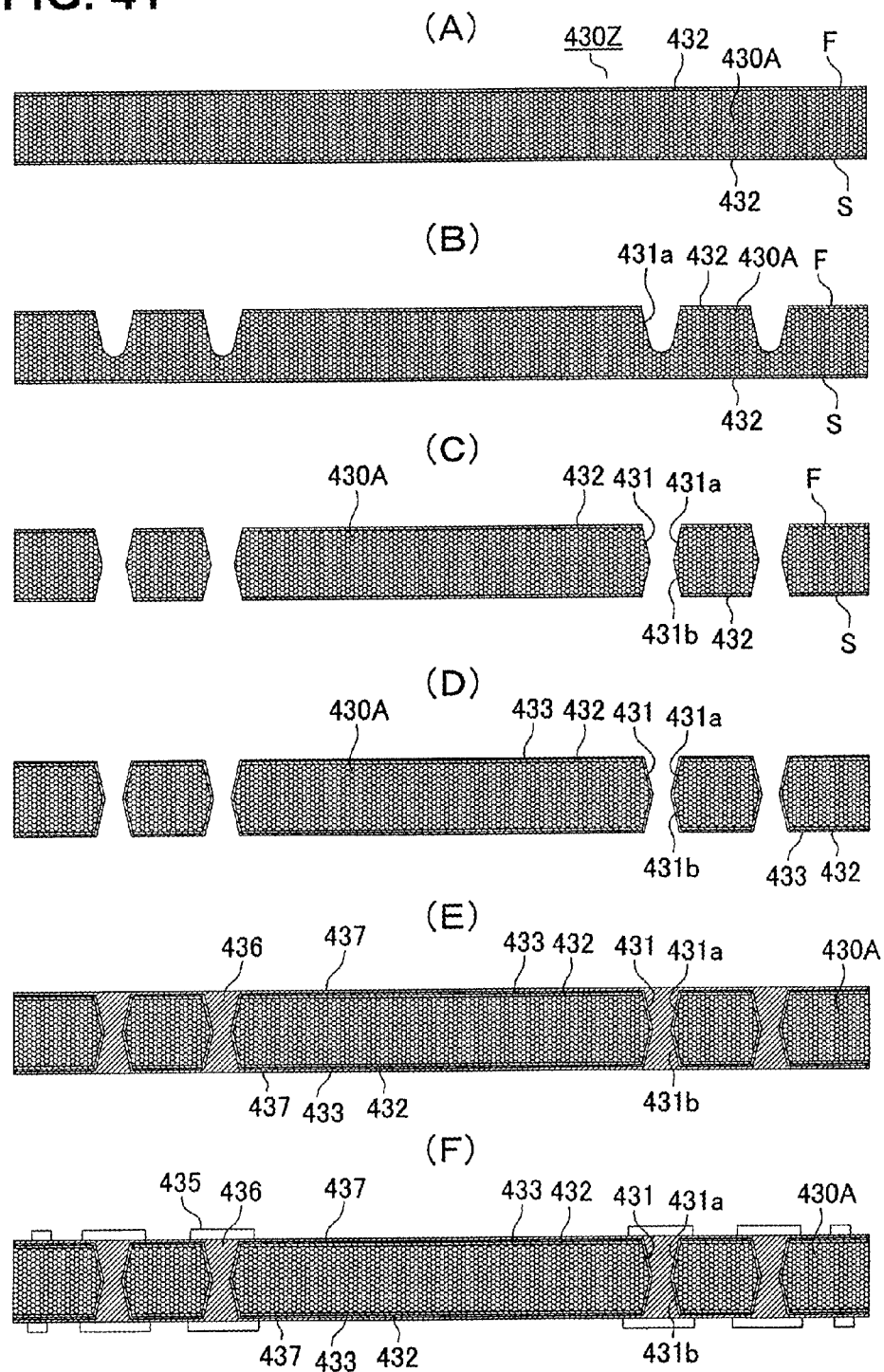
FIGS. 41(A)-41(F) are views of steps showing a method for manufacturing a printed wiring board according to the second embodiment.
Figure 42:
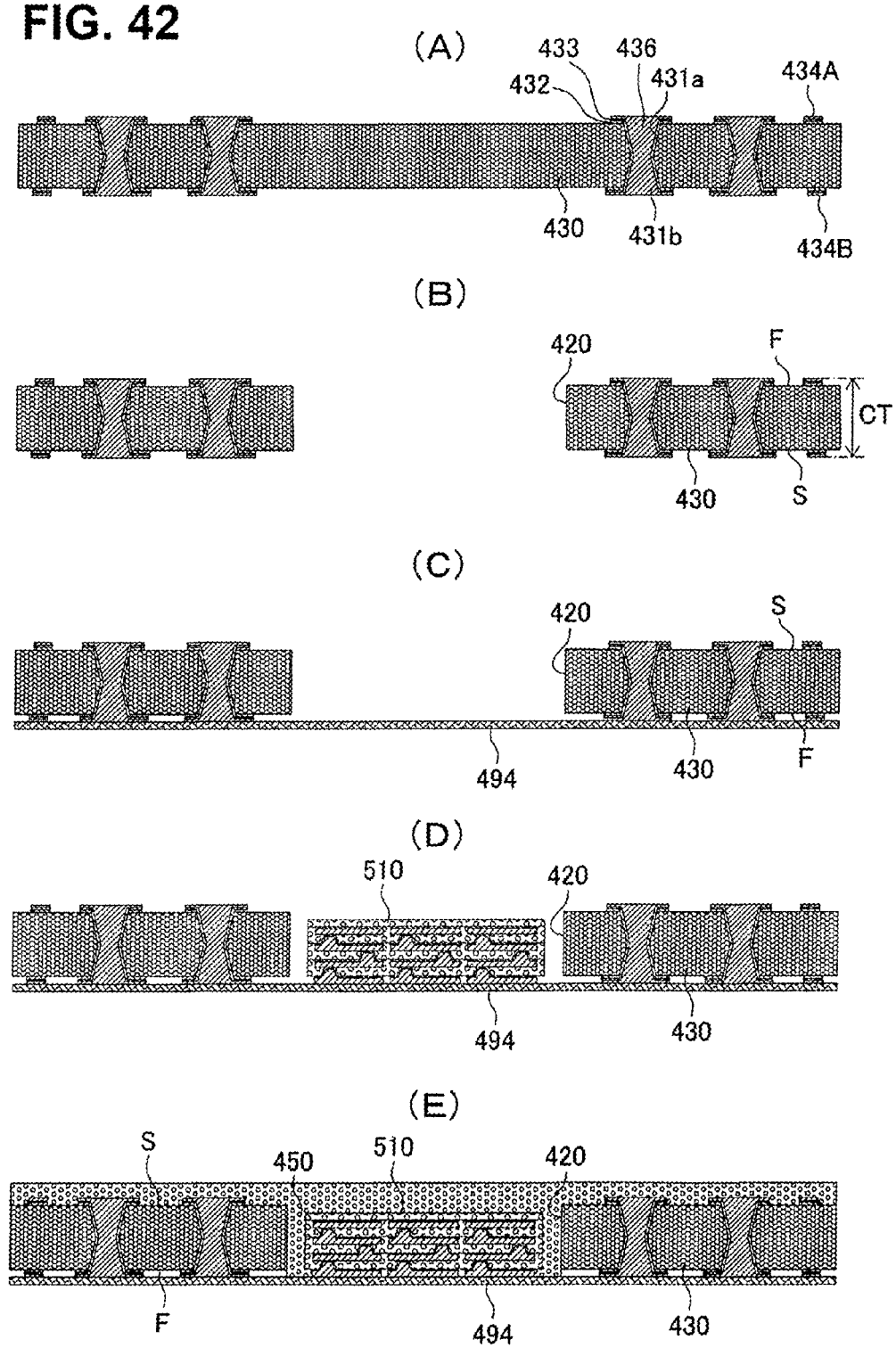
FIGS. 42(A)-42(E) are views of steps showing a method for manufacturing a printed wiring board according to the second embodiment.
Figure 43:
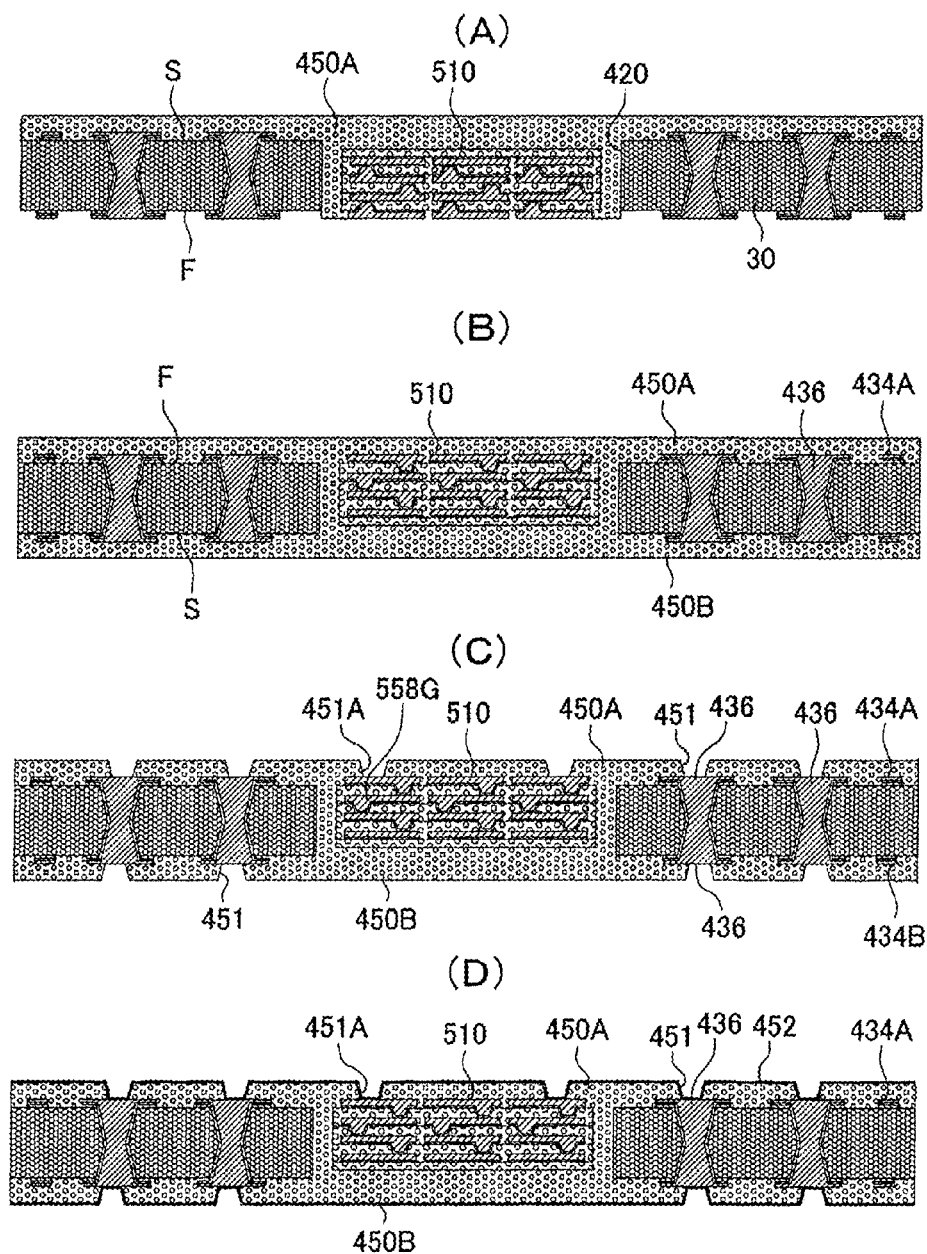
FIGS. 43(A)-43(D) are views of steps showing a method for manufacturing a printed wiring board according to the second embodiment.
Figure 44:
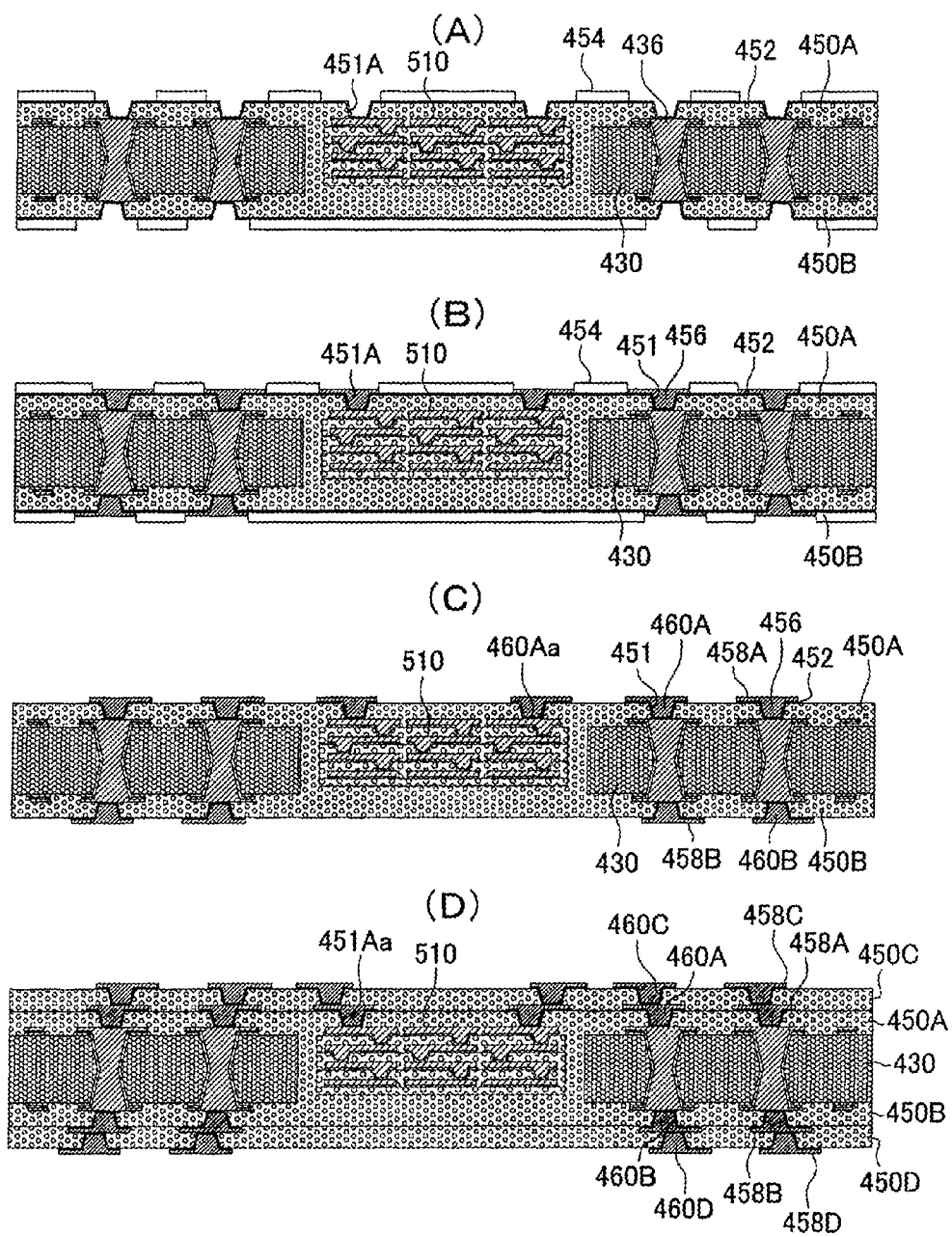
FIGS. 44(A)-44(D) are views of steps showing a method for manufacturing a printed wiring board according to the second embodiment.
Figure 45:
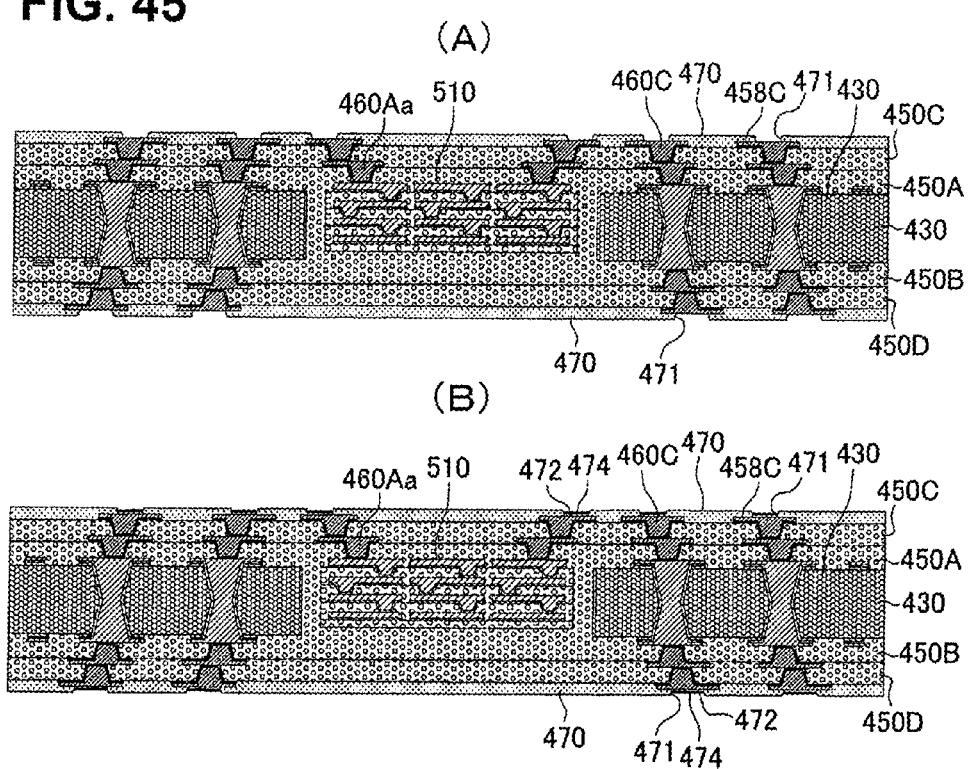
FIGS. 45(A)-45(B) are views of steps showing a method for manufacturing a printed wiring board according to the second embodiment.
Figure 48:
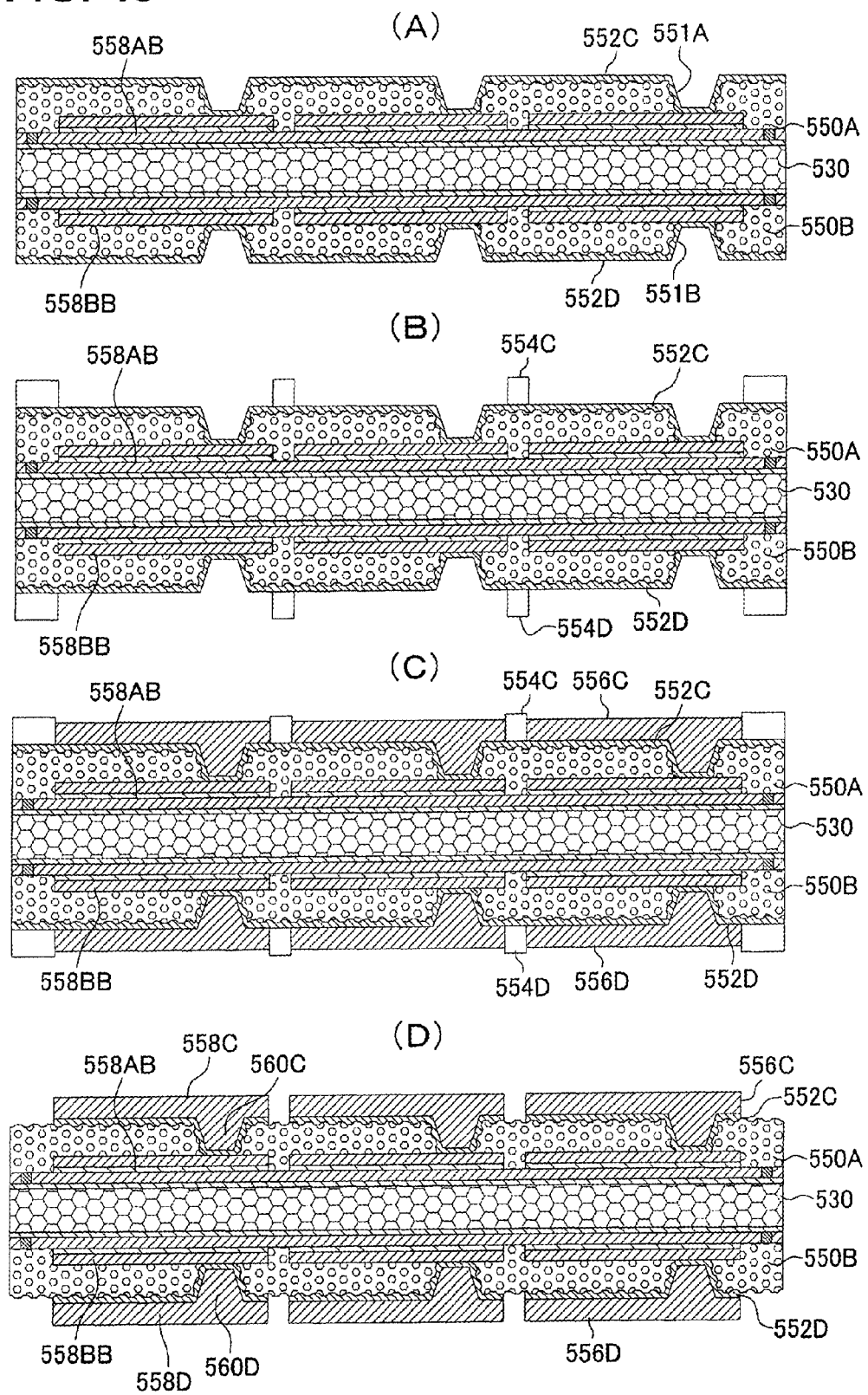
FIGS. 48(A)-48(D) are views of steps showing a method for manufacturing an inductor component according to the first modified example of the second embodiment.
Figure 59:
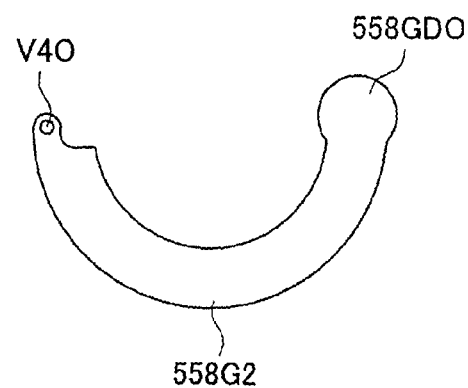
FIG. 59 is a plan view showing a coil layer of a laminated coil.

FIG. 34 shows yet another example of a laminated coil. Via conductor (460Aa) (connection via conductor of the first buildup layer) shown in FIG. 32 is connected to electrode (558GDI) (input electrode) of fourth coil layer (558G1) (uppermost coil layer), and the current flows counterclockwise in substantially a semicircle and reaches input connection portion (V4I) of fourth coil layer (558G1) (FIG. 34(D)). Fourth coil layer (558G1) is connected by via conductor (560G) to input via pad (P3I) of third coil layer (558E1). The current flows counterclockwise in substantially a semicircle and reaches input connection portion (V3I) of third coil layer (558E1) (FIG. 34(C)). Third coil layer (558E1) is connected by via conductor (560E) to input via pad (P2I) of second coil layer (558C1) (FIG. 34(B)). The current flows counterclockwise in substantially a semicircle and reaches input connection portion (V2I) of second coil layer (558C1) (FIG. 34(B)). Second coil layer (558C2) is connected by via conductor (560C) to input via pad (P1I) of first coil layer (558A) (FIG. 34(A)). The current flows counterclockwise in substantially the entire circle of first coil layer (558A), and flows out from output via pad (P1O) of first coil layer (558A) to be connected by via conductor (560C) to output connection portion (V2O) of second coil layer (558C2). The current flows counterclockwise in a semicircle and reaches output via pad (P2O) of second coil layer (558C2) (FIG. 34(B)). The second coil layer is connected by via conductor (560E) to output connection portion (V3O) of third coil layer (558E2) (FIG. 34(C)). The current flows counterclockwise in substantially a semicircle and reaches output via pad (P3O) of third coil layer (558E2) (FIG. 34(C)). The third coil layer is connected by via conductor (560G) to output connection portion (V4O) of fourth coil layer (558G2) (FIG. 34(D)). The current flows counterclockwise in substantially a semicircle and reaches connection wiring (L1O) (FIG. 34(D)). The laminated coil shown in FIG. 34 is connected in series or parallel to another laminated coil through connection wiring. Fourth coil layer (558G) may include electrode (558GDO) (output electrode) at the end opposite output connection portion (V4O) (FIG. 59). In such a case, the laminated coil shown in FIG. 34 is connected to a conductive layer in the first buildup layer by connection via conductor (460Aa) on the output electrode without being connected to another laminated coil. Except for the lowermost coil layer, other coil layers (fourth coil layer, third coil layer, second coil layer) are formed with input circuits (558G1, 558E1, 558C1) and output circuits (558G2, 558E2, 558C2) which are wiring patterns. Input circuits and output circuits are each a wiring pattern shaped substantially semicircular (FIG. 34).

The first coil layer (lowermost coil layer) is a wiring pattern shaped in substantially a circular coil. Other coil layers except for the lowermost coil layer are formed with two wiring patterns. In the second embodiment, a laminated coil is connected through connection wiring (L1O) to an adjacent laminated coil having the same shape. Inductor component 510 of the second embodiment is formed with three laminated coils. When an inductor component has multiple laminated inductors, the inductor component may have common output electrode (KD) (FIG. 58(A)). Each laminated inductor has input electrode (558GD1), and output electrode (558GDO) of each laminated inductor is connected to common output electrode (KD) (FIG. 58(B)). In such a case, each laminated inductor is connected parallel. A connection via conductor may be formed on each output electrode of each laminated coil (FIG. 58(C)). In such a case, each laminated coil is connected to a connection terminal through a connection circuit in the buildup layer. Multiple laminated coils are connected in the buildup layer.

When multiple laminated coils are connected parallel, the multiple laminated coils are connected with low resistance. Therefore, when an inductor component is formed with multiple laminated coils, a low-resistance inductor is obtained. FIG. 58 shows alignment marks (ALM) formed on uppermost resin insulation layer (550G). When an inductor component has alignment marks (ALM), the inductor component is accommodated in an opening of a core substrate according to the alignment marks of the core substrate. The connection reliability between connection via conductors and electrodes is enhanced.

Inductor components shown in FIGS. 33, 34 and others have electrodes. Therefore, when such an inductor component is incorporated in the core substrate of a printed wiring board, openings for connection via conductors can be formed on electrodes and connection reliability is high between the electrodes of the inductor component and the connection via conductors. The coating layer containing magnetic-substance particles or magnetic-substance film formed on electrodes and on the uppermost resin insulation layer may have openings to expose the electrodes. After the inductor component is incorporated in the core substrate, the openings for connection via conductors that reach the electrodes are not required to penetrate through the coating layer or the magnetic-substance film. When openings for connection via conductors are formed, the inductor component and the electrodes are unlikely to sustain damage. When an inductor component is incorporated in a printed wiring board, the inductor component performs as initially designed.

An inductor component may be covered by resin film containing inorganic particles. Resin film is not magnetic. Resin film and coating film contain resin such as epoxy in addition to particles. The bonding strength of the inductor component and filler resin is enhanced. Defects such as breakage in conductive layers caused by peeling between the inductor component and filler resin are prevented in a printed wiring board. Coating film may contain non-magnetic inorganic particles in addition to magnetic-substance particles. As non-magnetic inorganic particles, silica particles and alumina particles are listed. The thermal expansion coefficient of the coating film is lowered.

An inductor component is formed by alternately laminating a resin insulation layer and a coil layer, and includes an electrode to be connected to a connection via conductor of the printed wiring board. Therefore, the thickness of the inductor component is adjusted by adjusting the number of resin insulation layers and the number of coil layers. Accordingly, an inductor component is manufactured in consideration of the thickness of a core substrate. Then, the inductance is adjusted by the number of coil layers and the number of laminated inductors. Accordingly, inductor components according to the embodiments of the present invention are suitable for a component to be incorporated in a core substrate. In addition, since a printed wiring board and an inductor component are connected by connection via conductors, inductor components according to the embodiments of the present invention are suitable to be incorporated in a printed wiring board. An inductor component may be covered by non-magnetic resin film. Deterioration of the inductor component is suppressed.

In the embodiments, buildup layers and inductor components are manufactured by technologies used in the technical field of printed wiring boards. Since buildup layers and inductor components are manufactured separately, the thickness of wiring patterns of coil layers can be set greater than the thickness of conductive layers of buildup layers. Therefore, a low-resistance inductor component is incorporated in a printed wiring board to manufacture a printed wiring board with fine conductive circuits. It is preferred that the thickness of the wiring pattern of a coil layer be set 1.2~3 times the thickness of conductive layers of buildup layers. Inductor components with low resistance and high inductance are obtained. Thin printed wiring boards with fine circuits are obtained.

When the surface of the uppermost coil layer is roughened, peeling is prevented between the filler resin, coating layer or resin film and the inductor component. If the surface of the uppermost coil layer is not roughened, resin seldom exists between electrodes and connection via conductors. Peeling is prevented between the electrodes and the connection via conductors. The upper surfaces of electrodes of the inductor component exposed through the openings for connection via conductors are preferred to be flat, while the rest of the surface of the uppermost coil layer is preferred to be roughened. Peeling is prevented between the filler resin, coating layer or resin film and the inductor component and between the electrodes and the connection via conductors.

FIGS. 35~40 show the process for manufacturing an inductor component of the second embodiment.

Forming Film for Resin Insulation Layers Containing Magnetic-substance Particles (A) Preparing Resin-Containing Solution In a mixed solvent containing 6.8 g of MEK and 27.2 g of xylene, 85 g of epoxy resin (brand name Epikote 1007, made by Japan Epoxy Resin Co., Ltd.) and magnetic-substance particles such as iron (III) oxide are added. Examples of magnetic-substance particles are cobalt iron oxide, barium ferrite and the like.

(B) Preparing Film for Resin Insulation Layers

Dicyandiamide (brand name CG-1200 made by BTI Japan Co., Ltd.) as a curing agent and a curing catalyst (brand name Curezol 2E4HZ made by Shikoku Chemicals Corp.) are added to the resin-containing solution prepared in (A) above. Then, such a composition is kneaded using a three-roll mill to form a solution for resin insulation layers. The amounts of the curing agent and the curing catalyst to be added are each 3.3 g to 100 g of epoxy. The solution for resin insulation layers is applied on a polyethylene-terephthalate sheet using a roll coater (made by Thermotronics, Inc.) Then, the solution is heated and dried at 160° C. for five minutes to remove the solvent. Film for resin insulation layers containing magnetic-substance particles is obtained. Its thickness is approximately 20 µm~50 µm. The amount of magnetic-substance particles in the film for resin insulation layers is 30 vol. %~60 vol. %. Film for resin insulation layers may contain inorganic particles such as silica and alumina instead of magnetic-substance particles.

Commercially available double-sided copper-clad laminate 530 and copper foils (534A, 534B) are prepared, and the copper foils are laminated on both surfaces of the double-sided copper-clad laminate (FIG. 35(A)). Ultrasonic waves are used to bond the periphery of copper foil and the periphery of double-sided copper-clad laminate 530 as a support sheet (FIG. 35(B)). Bonding portions are indicated as (536A, 536B) in FIG. 35(B). The film prepared in (B) above is laminated on copper foils (534A, 534B) and cured so that lowermost resin insulation layers (550A, 550B) are formed (FIG. 35(C)). Resin insulation layers in the second embodiment are made of resin such as epoxy and of magnetic-substance particles.

Electroless plated films (552A, 552B) are formed on resin insulation layers (550A, 550B) (FIG. 36(A)). Plating resists with a predetermined pattern are formed on the electroless plated films, and electrolytic plating is performed so that electrolytic plated films (556A, 556B) are formed on electroless plated films (552A, 552B) exposed from the plating resists. Then, the plating resists are removed, and electroless plated films between portions of electrolytic plated films (556A, 556B) are removed. First coil layers (558A, 558B) are formed, being made of electroless plated films (552A, 552B) and electrolytic plated films (556A, 556B) on the electroless plated films (FIG. 36(B)). The film prepared in (B) above is laminated on the first coil layers and on the lowermost resin insulation layers and cured so that second resin insulation layers (550C, 550D) are formed (FIG. 36(C)).

Via-conductor openings (551C, 551D) that reach via pads (P1I, P1O) in the first coil layers are formed in second resin insulation layers (550C, 550D) by using a laser (FIG. 37(A)). Electroless plated films (552C, 552D) are formed on second resin insulation layers (550C, 550D) and in via-conductor openings (551C, 551D) (FIG. 37(B)).

Plating resists (554C, 554D) with a predetermined pattern are formed on electroless plated films (552C, 552D) (FIG. 38(A)). Electrolytic plating is performed to form electrolytic plated films (556C, 556D) on the electroless plated films exposed from the plating resists (FIG. 38(B)). The plating resists are removed, and the electroless plated films between portions of electrolytic plated films (556C, 556D) are removed. Second coil layers (558C, 558D), via conductors (560C, 560D) and connection portions (V2I, V2O) are formed, being made of electroless plated films (552C, 552D) and electrolytic plated films (556C, 556D) on the electroless plated films (FIG. 38(C)). Via conductors (560C, 560D) connect via pads of the first coil layers and the connection portions of the second coil layers. When electrodes are formed on the second coil layers, a laminated coil having two coil layers is completed. Surfaces of the second coil layers are roughened (FIG. 39(A)).

Using the same method for forming second resin insulation layers and for forming second coil layers, third resin insulation layers (550E, 550F), third coil layers (558E, 558F), fourth resin insulation layers (550G, 550H) and fourth coil layers (558G, 558H) (uppermost coil layers) are formed in that order on the second resin insulation layers and coil layers. In addition to coil layers, input electrodes, connection wiring and output electrodes are formed as wiring patterns on the uppermost resin insulation layers. Two laminates (LA, LB) are formed on the copper-clad laminate. A laminate which is formed with laminated coils and the copper-clad laminate is completed. In FIG. 39(B), three laminated coils (first laminated coil (CA), second laminated coil (CB), third laminated coil (CC)) are shown on one surface of the copper-clad laminate. In the present example, the inductor component is formed with first, second and third laminated coils (CA, CB, CC). The first laminated coil has input electrode (558GDI) and the third laminated coil has output electrode (558GDO). The first laminated coil and the second laminated coil are connected by connection wiring, which is not shown in the drawings. The second laminated coil and the third laminated coil are connected by connection wiring, which is not shown in the drawings. The first, second and third laminated coils are connected in series. The direction of the current flow in each coil layer and in each laminated coil is the same. Via conductors (560E, 560F) in the third resin insulation layers connect the second coil layers and the third coil layers, and via conductors (560G, 560H) in the fourth resin insulation layers connect the third coil layers and the fourth coil layers. Surfaces of the first, second and third coil layers are roughened. Surfaces of the fourth coil layers are not roughened. Alternatively, the first, second and third laminated coils (multiple laminated coils) may each have an input electrode and output electrode, and each laminated coil may be connected in parallel. Also, each laminated coil may be connected in parallel to a common electrode.

The laminate is cut by a router or the like along (X1, X1) lines inside bonded portions (536A, 536B) shown in FIG. 39(B). The laminate is separated into laminated coils with copper foils (534A, 534B) and double-sided copper-clad laminate 530 (FIG. 40(A)). PET film 535 is pasted to the fourth coil layers and uppermost resin insulation layer (FIG. 40(B)), and copper foil (534A) is removed by etching. Then, the PET film is removed and inductor component 510 is completed (FIG. 40(C)).

A method for manufacturing printed wiring board 410 of the second embodiment is shown in FIGS. 41~45.

(1) Double-sided copper-clad laminate (430Z) is the starting material, which is made of insulative substrate (430A) and copper foils 432 laminated on both of its surfaces. The thickness of the insulative substrate is 100~400 μm. If the thickness is less than 100 μm, the strength of the substrate is too low. If the thickness exceeds 400 μm, the thickness of the printed wiring board increases. The insulative substrate has first surface (F) and second surface (S) opposite the first surface. A black-oxide treatment not shown in the drawing is performed on surfaces of copper foils 432 (FIG. 41(A)).

(2) Laser is irradiated on double-sided copper-clad laminate (430Z) from the first-surface (F) side of the insulative substrate. First opening portions (431a) are formed, narrowing from the first surface of the insulative substrate toward the second surface (FIG. 41(B)).

(3) Laser is irradiated on double-sided copper-clad laminate (430Z) from the second-surface (S) side of the insulative substrate. Second opening portions (431b) are formed, narrowing from the second surface of the insulative substrate toward the first surface (FIG. 41(C)). Second opening portions (431b) are joined with first opening portions (431a) in the insulative substrate to form penetrating holes for throughhole conductors.

(4) Electroless plating is performed to form electroless plated films 433 on the inner walls of the penetrating holes and on the copper foils (FIG. 41(D)).

(5) Electrolytic plating is performed to form electrolytic plated films 437 on the electroless plated films. Through-hole conductors 436 are formed in the penetrating holes. Through-hole conductors 436 are made of electroless plated film 433 formed on inner walls of the penetrating holes and electrolytic plated film 437 filled in the penetrating holes (FIG. 41(E)).

(6) Etching resists 435 with a predetermined pattern are formed on electrolytic plated films 437 on surfaces of core substrate 430 (FIG. 41(F)).

(7) Electrolytic plated film 437, electroless plated film 433 and copper foil 432 exposed from the etching resists are removed. Then, the etching resists are removed, and conductive layers (434A, 434B) and through-hole conductors 436 are formed (FIG. 42(A)).

(8) Opening 420 for accommodating an inductor component is formed by a laser in the center of insulative substrate (430A). The core substrate is completed (FIG. 42(B)). Thickness (CT) of the core substrate (FIG. 42(B)) is 120 μm~450 μm.

(9) Tape 494 is pasted to the first surface of the core substrate. Opening 420 is covered by the tape (FIG. 42(C)). PET film is listed as an example of tape 494.

(10) An inductor component is positioned on tape 494 left exposed through opening 420 (FIG. 42(D)). At this time, electrodes face the tape. The thickness of the inductor component accommodated in opening 420 of the core substrate is 30%~100% of the thickness of the core substrate.

(11) B-stage prepreg is laminated on second surface (S) of core substrate 430. Resin seeps out from the prepreg into the opening by thermal pressing, and opening 420 is filled with filler 450 (resin filler) (FIG. 42(E)). The gap between the inner wall of the opening and the inductor component is filled with filler. The inductor component is secured to the core substrate. Resin film for interlayer insulation layers may be laminated instead of prepreg. Prepreg contains reinforcing material such as glass cloth, but resin film for interlayer resin insulation layers does not contain reinforcing material; both of them are preferred to contain inorganic particles such as glass particles. The filler contains inorganic particles such as silica.

(12) After the tape is removed (FIG. 43(A)), B-stage prepreg is laminated on first surface (F) of core substrate 430. Prepreg on the first and second surfaces of the core substrate is cured. Insulation layers (interlayer resin insulation layers) (450A, 450B) are formed on the first surface and the second surface of the core substrate (FIG. 43(B)).

(13) Openings (451A) for connection via conductors that reach electrodes of the inductor component are formed in insulation layer (450A) using a CO2 gas laser irradiated from the first-surface side. Via-conductor openings 451 that reach conductive layer (434A) or through-hole conductors 436 are formed at the same time. Via-conductor openings 451 that reach conductive layer (434B) or through-hole conductors 436 are formed in insulation layer (450B) from the second-surface side (see FIG. 43(C)). Surfaces of insulation layers (450A, 450B) are roughened (not shown in the drawings).

(14) Electroless plating is performed to form electroless plated films 452 on the inner walls of via-conductor openings and on the insulation layers (FIG. 43(D)).

(15) Plating resists 454 are formed on electroless plated films 452 (FIG. 44(A)).

(16) Next, electrolytic plating is performed to form electrolytic plated films 456 on the electroless plated films exposed from the plating resists (see FIG. 44(B)).

(17) Next, plating resists 454 are removed by a 5% NaOH solution. Then, electroless plated films 452 exposed from electrolytic copper-plated films are removed by etching to form conductive layers (458A, 458B) made of electroless plated film 452 and electrolytic plated film 456. Conductive layers (458A, 458B) include multiple conductive circuits and lands of via conductors. At the same time, via conductors (460A, 460B) and connection via conductors (460Aa) are formed (FIG. 44(C)). Via conductors (460A, 460B) connect conductive layers on the core substrate or through-hole conductors with conductive layers (458A, 458B) on the insulation layers. Connection via conductors (460Aa) connect electrodes (input electrode, output electrode) of the inductor component with conductive layer (458A) on the insulation layer.

(18) Treatments in FIGS. 43(A)~44(C) are repeated to form uppermost and lowermost insulation layers (450C, 450D) on insulation layers (450A, 450B). Conductive layers (458C, 458D) are formed on uppermost and lowermost insulation layers (450C, 450D). Via conductors (460C, 460D) are formed in uppermost and lowermost insulation layers (450C, 450D), and conductive layers (458A, 458B) and conductive layers (458C, 458D) are connected by their respective via conductors (460C, 460D) (FIG. 44(D)). A first buildup layer is formed on the first surface of the core substrate, and a second buildup layer is formed under the second surface of the core substrate. Buildup layers each have insulation layers and via conductors for connecting conductive layers in different layers. In the second embodiment, the first buildup layer further includes connection via conductors.

(19) Solder-resist layers 470 having openings 471 are formed on the first and second buildup layers (FIG. 45(A)). Openings 471 expose upper surfaces of conductive layers and via conductors. Such portions work as pads.

(20) Metal film made of nickel layer 472 and gold layer 474 on nickel layer 472 is formed on pads (FIG. 45(B)). Metal film made of nickel-palladium-gold layers may also be used instead of nickel-gold layers. In a printed wiring board shown in FIG. 32, connection via conductors are included only in the first buildup layer. Thus, the second buildup layer is not required to have conductive circuits under the inductor component. A decrease in inductance is suppressed. When the second buildup layer directly under the inductor component does not have conductive circuits, the printed wiring board tends to warp. In such a case, the thickness of the insulation layers in the first buildup layer is preferred to be greater than the thickness of the second buildup layer. As an alternative example, it is preferred that insulation layers in the first buildup layer not contain reinforcing material and that the second buildup layer contain reinforcing material. Warping of the printed wiring board is reduced.

(21) Next, solder bumps (476U) are formed on pads of the first buildup layer, and solder bumps (476D) are formed on pads of the second buildup layer. Printed wiring board 410 having solder bumps is completed (FIG. 32).

An IC chip is mounted on printed wiring board 410 through solder bumps (476U) (not shown in the drawing). Then, the printed wiring board is mounted on a motherboard through solder bumps (476D).

First Modified Example of the Second Embodiment

FIGS. 46~51 show steps for manufacturing an inductor component according to a modified example of the second embodiment. The same as in FIG. 35(B), double-sided copper-clad laminate 530 and copper foils (534A, 534B) are bonded (FIG. 46(A)). First conductive circuits (558AB, 558BB) made of Cu/Ni/Cu film are formed on copper foils (534A, 534B) (FIG. 46(B)).

Resin insulation layers (550A, 550B) containing magnetic-substance particles the same as in the second embodiment are formed on copper foils (534A, 534B) and on first conductive circuits (558AB, 558BB) (FIG. 47(A)). Via-conductor openings (551A, 551B) are formed in resin insulation layers (550A, 550B) using a laser (FIG. 47(B)). Surfaces of resin insulation layers (550A, 550B) are roughened (FIG. 47(C)).

Electroless plated films (552C, 552D) are formed on surfaces of resin insulation layers (550A, 550B) and in via-conductor openings (551A, 551B) (FIG. 48(A)). Plating resists (554C, 554D) with a predetermined pattern are formed on electroless plated films (552C, 552D) (FIG. 48(B)). Electrolytic plating is performed to form electrolytic plated films (556C, 556D) on the electroless plated films exposed from the plating resists (FIG. 48(C)). After the plating resists are removed, the electroless plated films exposed from electrolytic plated films are removed, and coil layers (558C, 558D) made of electroless plated films (552C, 552D) and electrolytic plated films (556C, 556D) are formed on resin insulation layers (550A, 550B). Via conductors (560C, 560D) which connect first conductive circuits and coil layers are formed in resin insulation layers (550A, 550B) (FIG. 48(D)).

Roughened layers (558β) are formed on surfaces of coil layers (558C, 558D) (FIG. 49(A)). Treatments shown in FIGS. 47(A)~49(A) are repeated. Laminated coils are formed, having four coil layers and three resin insulation layers (FIG. 49(B)). The same as in the second embodiment, the laminate is cut by a router along (X1, X1) lines inside bonded portions (536A, 536B) (FIG. 50(A)). The laminate is separated between copper foils (534A, 534B) and double-sided copper-clad laminate (530Z) (FIG. 50(B)).

Figure 51:
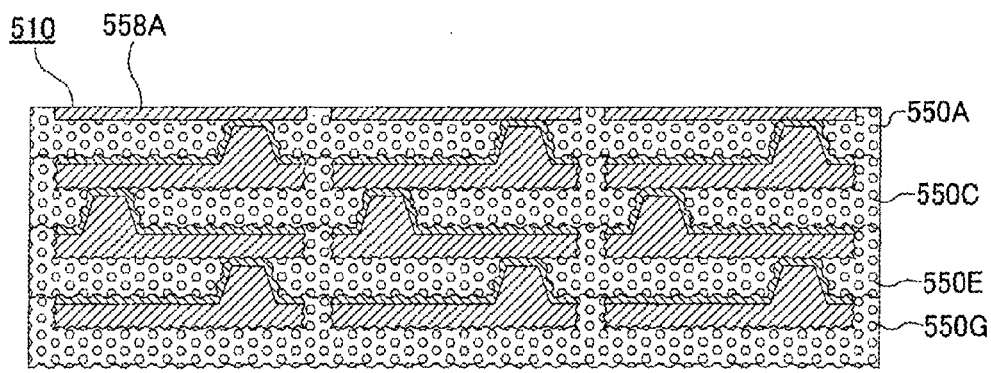
FIG. 51 is a view of steps showing a method for manufacturing an inductor component according to the first modified example of the second embodiment.

Copper foil (534A) and the Cu film which forms part of first conductive circuit (558AB) are removed. Then, the Ni layer is selectively etched away from the first conductive circuit. Coil layer (558A) (uppermost coil layer) and electrodes are formed. Inductor component 510 is completed (FIG. 51). The inductor component is accommodated in a printed wiring board in such a way that coil layer (558A) faces the first surface of the core substrate. The uppermost coil layer is embedded in the uppermost resin insulation layer in the present embodiment.

Second Modified Example of the Second Embodiment

Figure 52:
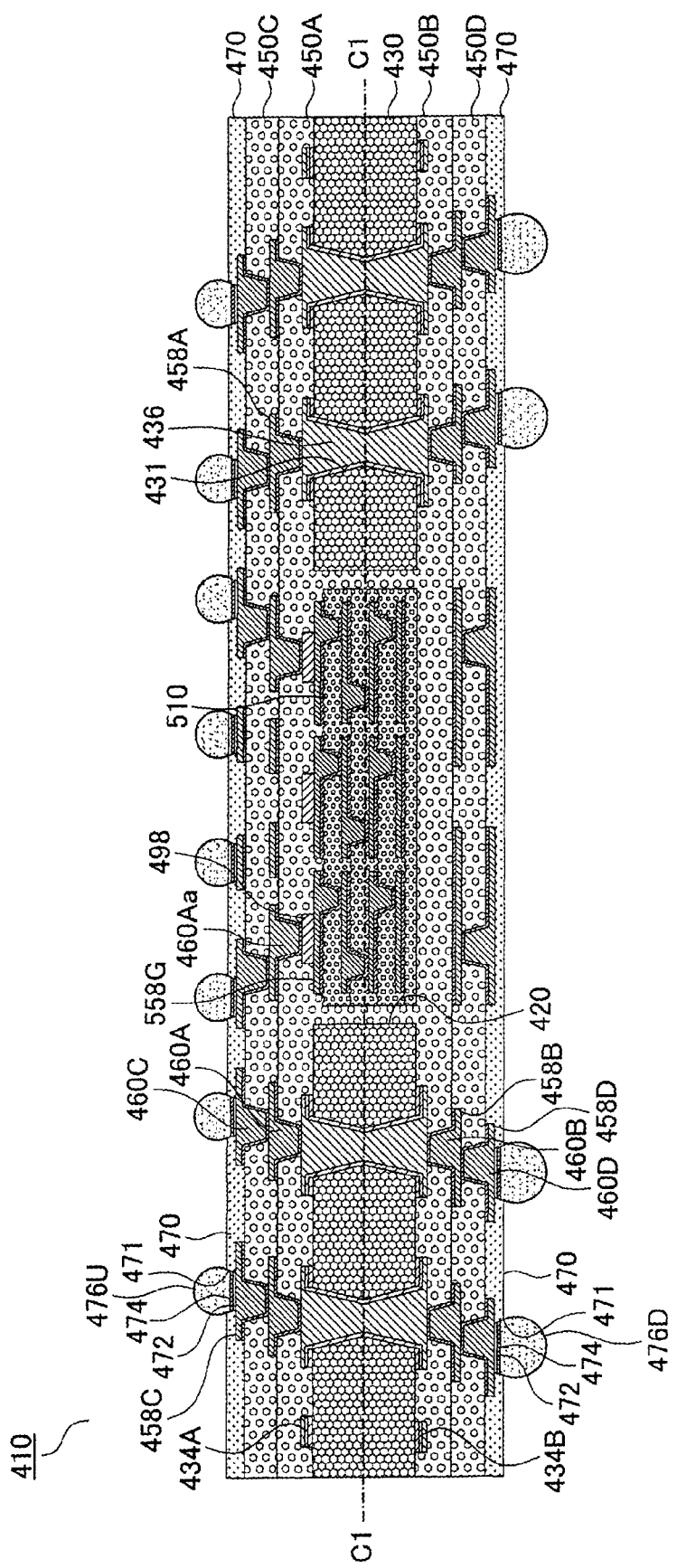
FIG. 52 is a cross-sectional view of a printed wiring board according to a second modified example of the second embodiment of the present invention.

FIG. 52 shows a cross-sectional view of printed wiring board 410 according to a second modified example of the second embodiment. In the second modified example of the second embodiment, conductor posts 498 (protruding electrodes) are formed on uppermost coil layer (558G) (fourth coil layer) of an inductor component. The protruding electrodes are made of copper. A protruding electrode is positioned on an end of an uppermost coil layer, and a connection via conductor is formed on the protruding electrode. Fourth coil layer (558G) and connection via conductors (460Aa) are connected by conductor posts 498.

The thickness of an inductor component can be adjusted by conductor post 498 in printed wiring board 410 according to the second modified example of the second embodiment. When inductor component 510, which is thinner than the thickness of core substrate 430, is incorporated in the core substrate, the inductor component is positioned in substantially the center of the core substrate. Center line (C1-C1) of the core substrate comes closer to the center line of the inductor component. Since the printed wiring board incorporating an inductor component becomes symmetrical, warping is suppressed.

In the second embodiment, the thickness of the wiring pattern of a coil layer is preferred to be greater than the thickness of a conductive layer in the core substrate. The resistance of the coil layer decreases.

Third Embodiment

Figure 53:
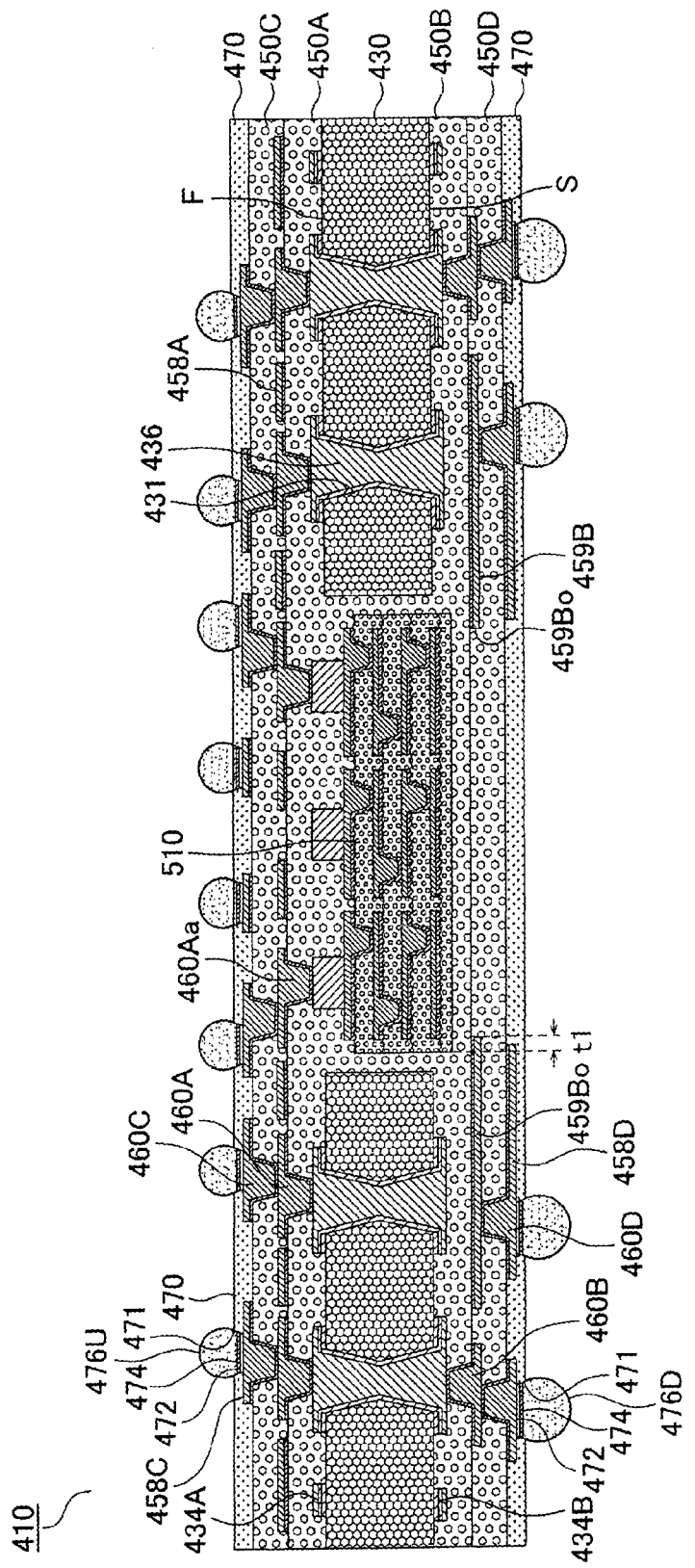
FIG. 53 is a cross-sectional view of a printed wiring board according to a third embodiment of the present invention.

FIG. 53 shows a cross-sectional view of printed wiring board 410 according to a third embodiment. The second buildup layer in the third embodiment does not have a conductive layer directly under the region that includes coil layers. A decrease in inductance is suppressed. A conductive layer in the second buildup layer includes conductive circuit (459Bo), which extends from under the core substrate beyond the filler resin in a gap to directly under the periphery of the inductor component. The gap indicates space between the inductor component and a side wall of the core substrate. When a conductive layer in the second buildup layer has an opening directly under the inductor component, warping of the printed wiring board is slight because of such conductive circuit (459Bo). In addition, cracking seldom occurs in the second buildup layer.

In the third embodiment, the thickness of the wiring pattern of a coil layer is preferred to be greater than the thickness of a conductive layer in the core substrate. The resistance of the coil layer decreases.

Fourth Embodiment

Figure 54:
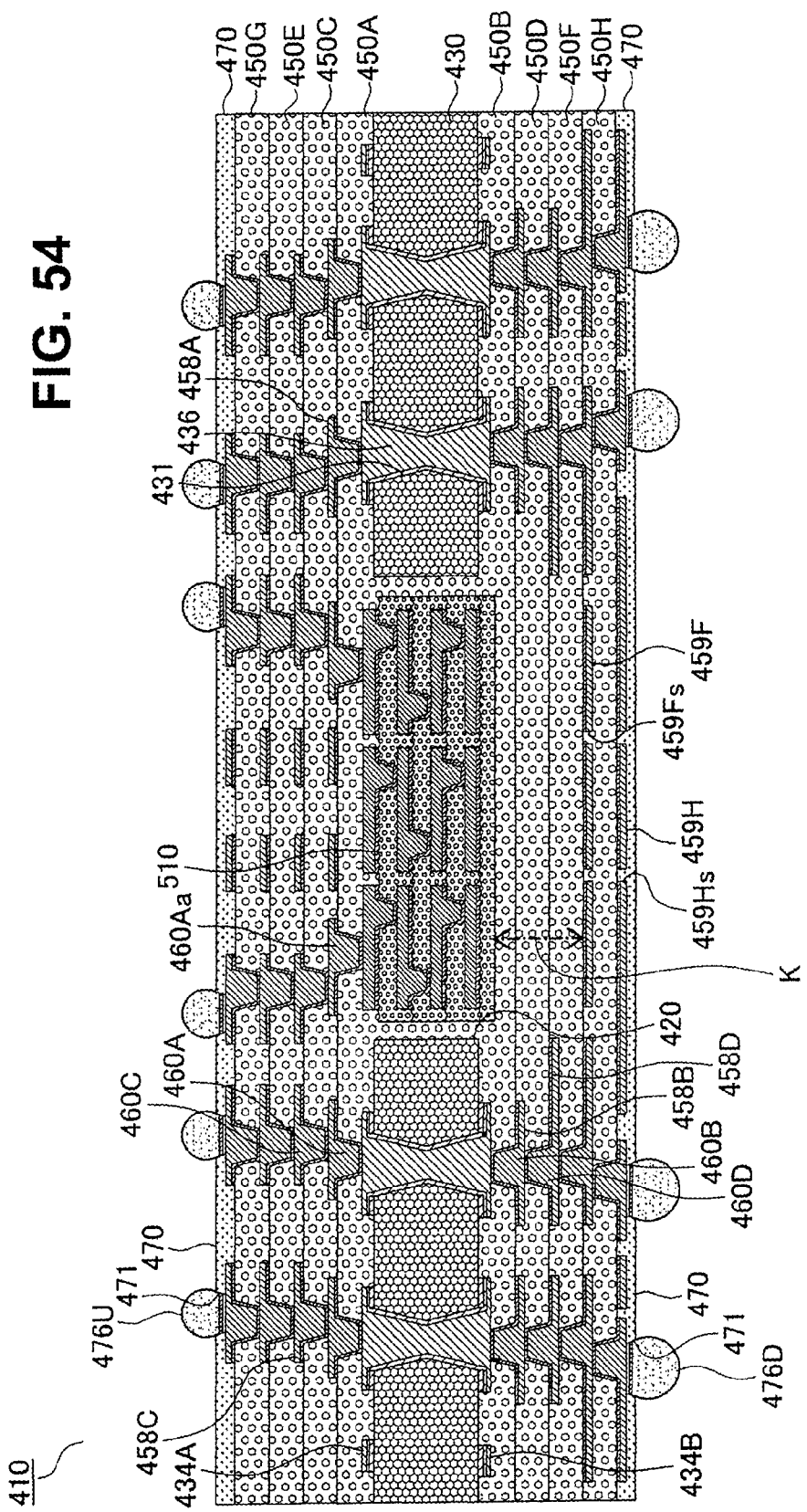
FIG. 54 is a cross-sectional view of a printed wiring board according to a fourth embodiment of the present invention.

FIG. 54 shows a cross-sectional view of printed wiring board 410 according to a fourth embodiment. In the fourth embodiment, the second buildup layer directly under an inductor component is formed with layers that include conductive circuits such as plain layers (459F, 459H) for power source or ground (solid patterns) and with layers that do not include conductive circuits. In a region directly under the inductor component, conductive layers are preferred not to be formed under insulation layer (450B) (the insulation layer directly under the core substrate) in the second buildup layer. A conductive layer closer to the inductor component does not have a conductive circuit directly under the inductor component. Such a conductive layer has an opening directly under the inductor component. In addition, the plain layer directly under the inductor component has slits (59Fs, 59Hs) and is divided into multiple portions. Distance (K) from the inductor component to the conductive circuit directly under the inductor component is preferred to be 60 µm or greater. Distance (K) is preferred to be 60 µm or greater and 400 µm or less. A decrease in inductance is suppressed.

In the printed wiring board according to the fourth embodiment, plain layer (459F) formed directly under the inductor component is separated from the inductor component with multiple insulation layers placed in between. Thus, inductance is unlikely to decrease. The two conductive layers closer to the core substrate are preferred not to have conductive circuits directly under the inductor component. Moreover, since plain layers (459F, 459H) are divided, inductance seldom decreases.

In the fourth embodiment, the thickness of the wiring pattern of a coil layer is preferred to be greater than the thickness of a conductive layer in the core substrate. The resistance of the coil layer decreases.

Inductor Component and Printed Wiring Board in Fifth Embodiment

Figure 56:
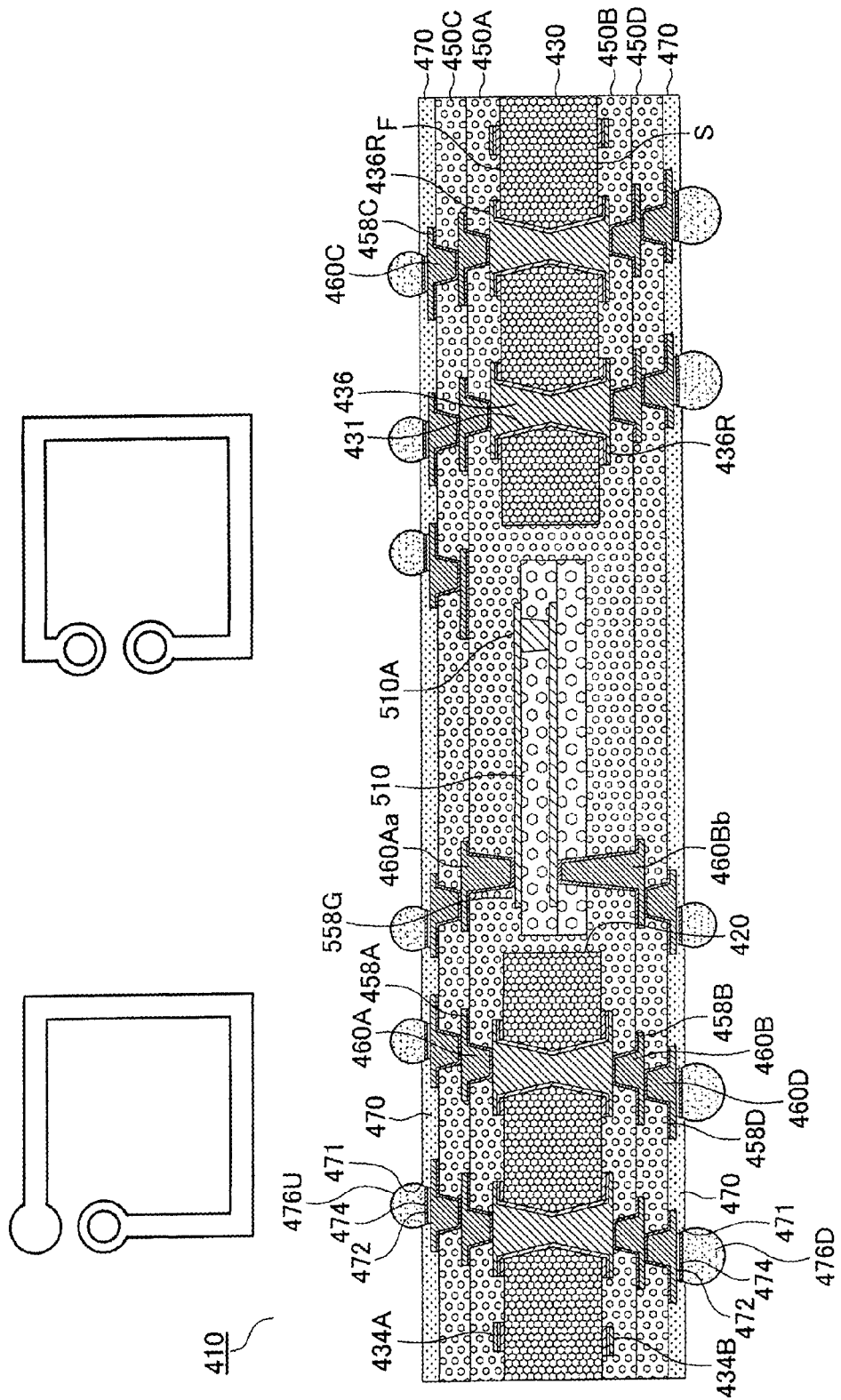
FIG. 56 is a cross-sectional view of a printed wiring board according a fifth embodiment of the present invention.

FIG. 56 shows an inductor component of a fifth embodiment and a printed wiring board incorporating the component.

Copper foils are bonded to a copper-clad laminate the same as in the second embodiment. A lower electrode and a first coil layer are formed on the lowermost resin insulation layer. The lower electrode is formed on an end of the first coil layer, and a via pad is formed on the other end. A second resin insulation layer is formed on the lowermost resin insulation layer and on the first coil layer. A via-conductor opening reaching the via pad is formed in the second resin insulation layer. A second coil layer and an upper electrode are formed on the second resin insulation layer. The first coil layer and the second coil layer are connected by a via conductor. In the present example, the inductor component has electrodes on its upper and lower portions (upper and lower electrodes). When an inductor component having upper and lower electrodes is incorporated in the core substrate, a conductive layer of the second buildup layer and the inductor component are connected by lower connection via conductor (460Bb), and a conductive layer of the first buildup layer and the inductor component are connected by upper connection via conductor (460Aa). A lower connection via conductor is connected to a lower electrode, and an upper connection via conductor is connected to an upper electrode. If an inductor component is incorporated in a printed wiring board, it is easy to design the wiring of the printed wiring board. The printed wiring board tends to become symmetrical in a cross-sectional direction. Also, since the inductor component is sandwiched by connection via conductors, connection reliability is enhanced between the inductor component and conductive layers of buildup layers.

In the fifth embodiment, the thickness of the wiring pattern of a coil layer is preferred to be greater than the thickness of a conductive layer in the core substrate. The resistance of the coil layer decreases.

Sixth Embodiment

Resin insulation layers of an inductor component according to a sixth embodiment do not contain magnetic-substance particles. Resin insulation layers of an inductor component according to the sixth embodiment are made up of inorganic particles such as silica and of resin such as epoxy.

Preparing Film for Resin Insulation Layers Containing Inorganic Particles (A) Preparation of Resin-Containing Solution In a mixed solvent containing 6.8 g of MEK and 27.2 g of xylene, 85 g of epoxy resin (brand name Epikote 1007, made by Japan Epoxy Resin Co., Ltd.) and inorganic particles such as silica are added. Inorganic particles do not include magnetic-substance particles.

(B) Preparing Film for Resin Insulation Layers

Dicyandiamide (brand name CG-1200 made by BTI Japan Co., Ltd.) as a curing agent and a curing catalyst (brand name Curezol 2E4HZ made by Shikoku Chemicals Corp.) are added to the resin-containing solution prepared in (A) above. Then, such a composition is kneaded using a three-roll mill to form a solution for resin insulation layers. The amounts of the curing agent and the curing catalyst to be added are each 3.3 g to 100 g of epoxy. The solution for resin insulation layers is applied on a polyethylene-terephthalate sheet using a roll coater (made by Thermotronics, Inc.) Then, the solution is heated and dried at 160° C. for five minutes to remove the solvent. Film for resin insulation layers containing inorganic particles is obtained. Its thickness is approximately 20 µm~50 µm. The amount of inorganic particles in the cured resin insulation layers is 30 vol. %~60 vol. %.

(C) Method for Manufacturing Inductor Component

FIG. 33 shows an inductor component of the sixth embodiment. The method for manufacturing an inductor component according to the sixth embodiment is the same as the method for manufacturing an inductor component according to the first embodiment. In the sixth embodiment, film for resin insulation layers containing inorganic particles is used to form an inductor component the same as in the first embodiment. In the sixth embodiment, resin insulation layers including the lowermost and uppermost resin insulation layers are each made of inorganic particles and resin such as epoxy.

(D) Method for Manufacturing Printed Wiring Board

FIG. 32 shows a printed wiring board of the sixth embodiment. The method for manufacturing a printed wiring board according to the sixth embodiment is the same as the method for manufacturing a printed wiring board according to the first embodiment.

Modified Example of Sixth Embodiment (A) Preparing Resin Solution

In a mixed solvent containing 6.8 g of MEK and 27.2 g of xylene, 85 g of epoxy resin (brand name Epikote 1007, made by Japan Epoxy Resin Co., Ltd.) and magnetic-substance particles such as iron (III) oxide are added. Examples of magnetic-substance particles are cobalt iron oxide, barium ferrite and the like.

(B) Preparing Filler-Resin Solution

Dicyandiamide (brand name CG-1200 made by BTI Japan Co., Ltd.) as a curing agent and a curing catalyst (brand name Curezol 2E4HZ made by Shikoku Chemicals Corp.) are added to the resin-containing solution prepared in (A) above. Then, such a composition is kneaded using a three-roll mill to form a solution for resin insulation layers. The amounts of the curing agent and the curing catalyst to be added are each 3.3 g to 100 g of epoxy.

(C) Forming Inductor Component

An inductor component used in a modified example of the sixth embodiment is the inductor component according to the sixth embodiment.

(D) Forming Printed Wiring Board

A core substrate is manufactured the same as in the first embodiment, and a tape is pasted to a first surface of the core substrate (FIG. 42(C)). An inductor component is positioned on the tape. Electrodes of the inductor face the tape. Electrodes of the inductor face the first surface of the core substrate (FIG. 42(D)).

The filler-resin solution prepared in (B) above is put between the inductor component and the core substrate (space) using a dispenser. Then, the filler-resin solution is dried and cured. Filler resin 450 is formed between the inductor component and the core substrate (space) (FIG. 60(A)). The amount of magnetic-substance particles in the filler resin is 30 vol. % to 60 vol. %.

Next, the tape is removed from the core substrate. Then, a first interlayer resin insulation layer is formed on the first surface of the core substrate and on the inductor component. A second interlayer resin insulation layer is formed on the second surface of the core substrate and under the inductor component (FIG. 43(B)). After that, a printed wiring board is manufactured by steps the same as in FIGS. 43(C) through 45(B) (FIG. 60(B)). In the present embodiment, filler resin containing magnetic-substance particles exists between the second interlayer resin insulation layer of the second buildup layer and the inductor component. Therefore, a decrease in inductance is suppressed when a lower conductive layer is formed under the second interlayer resin insulation layer directly below the inductor component. Since a conductive layer is formed in the second buildup layer directly below the inductor component, a thin printed wiring board is provided. In addition, warping of the printed wiring board is reduced.

Seventh Embodiment

In the third embodiment, a second buildup layer does not have a conductive layer directly under a region containing a coil layer.

In the present example, a coil layer is formed in the second buildup layer directly under an inductor component (FIG. 61). The number of coil layers of the inductor component is two in the present example. FIG. 61(B) shows a plan view of each coil layer. (L1) in FIG. 61 is a plan view of the uppermost coil layer of the inductor component, and (L2) is a plan view of the lowermost coil layer of the inductor component. (L3) in FIG. 61 shows a lower conductive layer directly under the inductor component, and (L4) in FIG. 61 shows the lowermost conductive layer directly under the inductor component. Coil layers are formed in the second buildup layer directly under the inductor component. The lower conductive layer and the lowermost conductive layer have coil layers directly under the inductor component. The coil layers formed in the second buildup layer are connected to the inductor component by via conductors in the second buildup layer. In the present example, coil layers in the inductor component and coil layers in the second buildup layer form an inductor. Inductance increases. The coil layers in the inductor component and the coil layers in the second buildup layer are preferred to overlap. Namely, when those coil layers are projected on the first surface of the core substrate at equal magnification, images of coil layers overlap.

The printed wiring board shown in FIG. 61 may be manufactured by the same method as in the second embodiment by adjusting via conductor positions and plating resist patterns when forming the second buildup layer.

In each embodiment, each modified example and each example, coil layers in the inductor component are preferred to overlap. Namely, when each coil layer is projected on a first surface of a core substrate at equal magnification, images of coil layers overlap.

Inductor components shown in each embodiment, each modified example and each example are preferred to have alignment marks (ALM) (FIG. 58). In addition, via pads and connection portions in a coil layer may be smaller than the wiring width in the coil layer. The resistance of the inductor is reduced.

EXAMPLE 1

FIGS. 35~40 show steps for manufacturing an inductor component in Example 1. Preparing Film for Resin Insulation Layers Containing Magnetic-substance Particles (A) Preparation of Resin-Containing Solution In a mixed solvent containing 6.8 g of MEK and 27.2 g of xylene, 85 g of epoxy resin (brand name Epikote 1007, made by Japan Epoxy Resin Co., Ltd.) and iron (III) oxide are added.

(B) Preparing Film for Resin Insulation Layers

Dicyandiamide (brand name CG-1200 made by BTI Japan Co., Ltd.) as a curing agent and a curing catalyst (brand name Curezol 2E4HZ made by Shikoku Chemicals Corp.) are added to the resin-containing solution prepared in (A) above. Then, such a composition is kneaded using a three-roll mill to form a solution for resin insulation layers. The amounts of the curing agent and the curing catalyst to be added are each 3.3 g to 100 g of epoxy. The solution for resin insulation layers is applied on a polyethylene-terephthalate sheet using a roll coater (made by Thermotronics, Inc.) Then, the solution is heated and dried at 160° C. for five minutes to remove the solvent. The thickness of the film for resin insulation layers is approximately 50 μm. The amount of iron (III) oxide is 45 vol. %.

Commercially available double-sided copper-clad laminate 530 and copper foils (534A, 534B) are prepared, and copper foils are laminated on both surfaces of the double-sided copper-clad laminate (FIG. 35(A)). The periphery of copper foils and the periphery of double-sided copper-clad laminate 530 are bonded using ultrasonic waves (FIG. 35(B)). The film prepared in (B) above is laminated on copper foils (534A, 534B) and cured so that lowermost resin insulation layers (550A, 550B) are formed (FIG. 35(C)).

Electroless copper-plated films (552A, 552B) are formed on resin insulation layers (550A, 550B) (FIG. 36(A)). Plating resists with a predetermined pattern are formed on the electroless copper-plated films, and electrolytic plating is performed so that electrolytic plated films (556A, 556B) are formed on electroless copper-plated films (552A, 552B) exposed from the plating resists. Then, the plating resists are removed, and electroless copper-plated films between portions of electrolytic plated films (556A, 556B) are removed. First coil layers (558A, 558B) are formed, being made of electroless copper-plated films (552A, 552B) and electrolytic copper-plated films (556A, 556B) on the electroless copper-plated films (FIG. 36(B)). The film prepared in (B) above is laminated on the first coil layers and the lowermost resin insulation layers and cured so that second resin insulation layers (550C, 550D) are formed (FIG. 36(C)).

Via-conductor openings (551C, 551D) reaching via pads (P1I, P1O) in the first coil layers are formed in second resin insulation layers (550C, 550D) using a laser (FIG. 37(A)). Electroless copper-plated films (552C, 552D) are formed on second resin insulation layers (550C, 550D) and in via-conductor openings (551C, 551D) (FIG. 37(B)).

Plating resists (554C, 554D) with a predetermined pattern are formed on electroless copper-plated films (552C, 552D) (FIG. 38(A)). Electrolytic plating is performed to form electrolytic plated films (556C, 556D) on electroless copper-plated films exposed from the plating resists (FIG. 38(B)). The plating resists are removed, and the electroless copper-plated films between portions of electrolytic plated films (556C, 556D) are removed. Second coil layers (558C, 558D), via conductors (560C, 560D) and connection portions (V2I, V2O) are formed, being made of electroless copper-plated films (552C, 552D) and electrolytic copper-plated films (556C, 556D) on the electroless copper-plated films (FIG. 38(C)). Via conductors (560C, 560D) connect via pads of the first coil layers and connection portions of the second coil layers. Surfaces of the second coil layers are roughened (FIG. 39(A)).

By the same methods for forming second resin insulation layers and for forming second coil layers, third resin insulation layers, third coil layers, fourth resin insulation layers and fourth coil layers (uppermost coil layers) are formed in that order on the second resin insulation layers and second coil layers. In addition to coil layers, input electrodes, connection wiring and output electrodes are formed in wiring patterns on the uppermost resin insulation layers. Two laminates are formed on the copper-clad laminate. A laminate which is formed with laminated coils and a copper-clad laminate is completed. In FIG. 39(B), three laminated coils (first laminated coil (CA), second laminated coil (CB), third laminated coil (CC)) are shown on one surface of the copper-clad laminate. In that example, the inductor component is formed with first, second and third laminated coils (CA, CB, CC). Each laminated coil has input electrode (558GD1) and output electrode (558GDO). Output electrodes of each laminated coil are connected to common electrode (KD) by connection wiring not shown in the drawings. First, second and third laminated coils are connected parallel. The direction of electric current in each coil layer and each laminated coil is the same.

The laminate is cut by a router or the like along (X1, X1) lines inside bonded portions (536A, 536B) shown in FIG. 39(B) so that the laminate is separated into laminated coils with copper foils (534A, 534B) and double-sided copper-clad laminate 530 (FIG. 40(A)). PET film 535 is pasted on the fourth coil layer and the uppermost resin insulation layer (FIG. 40(B)), and copper foil (534A) is etched away. Then, the PET film is removed and inductor component 510 is completed (FIG. 40(C)). The thickness of each resin insulation layer is 50 μm, the thickness of each coil layer is 30 μm, and the thickness of the inductor component is approximately 230 μm.

FIGS. 41~45 show a method for manufacturing printed wiring board 410 of the present example.

(1) Double-sided copper-clad laminate (430Z) is the starting material, having insulative substrate (430A) and copper foils 432 laminated on both of its surfaces. The thickness of the insulative substrate is 200 μm, and the thickness of the copper foils is 3 μm. A black-oxide treatment not shown in the drawings is conducted on surfaces of copper foils 432 (FIG. 41(A)).

(2) Double-sided copper-clad laminate (430Z) is irradiated by a laser from the first-surface (F) side of the insulative substrate. First opening portions (431a) are formed, narrowing from the first surface of the insulative substrate toward the second surface (FIG. 41(B)).

(3) Double-sided copper-clad laminate (430Z) is irradiated by a laser from the second-surface (S) side of the insulative substrate. Second opening portions (431b) are formed, narrowing from the second surface of the insulative substrate toward the first surface (FIG. 41(C)). Second opening portions (431b) are joined with first opening portions (431a) in the insulative substrate to form penetrating holes for through-hole conductors.

(4) Electroless copper plating is performed to form electroless copper-plated films 433 on the inner walls of penetrating holes and on the copper foils (FIG. 41(D)).

(5) Electrolytic copper plating is performed to form electrolytic copper-plated films 437 on the electroless copper-plated films. Through-hole conductors 436 are formed in the penetrating holes. Through-hole conductors 436 are made of electroless copper-plated film 433 formed on the inner walls of penetrating holes and of electrolytic copper-plated film 437 filled in the penetrating holes (FIG. 41(E)).

(6) Etching resists 435 with a predetermined pattern are formed on electrolytic copper-plated films 437 on surfaces of core substrate 430 (FIG. 41(F)).

(7) Electrolytic copper-plated film 437, electroless copper-plated film 433 and copper foil 432 which are exposed from the etching resist are removed. Then, the etching resists are removed and conductive layers (434A, 434B) and through-hole conductors 436 are formed (FIG. 42(A)). Conductive layers (434A, 434B) of the core substrate are 20 μm. Thickness (CT) of the core substrate (FIG. 42(B)) is 240 μm.

(8) A laser is used to form opening 420 for accommodating an inductor component in the center of core substrate 430 (FIG. 42(B)). Core substrate 430 is completed.

(9) Tape 494 is pasted on the first surface of the core substrate. Opening 420 is covered by the tape (FIG. 42(C)). PET film is listed as an example of tape 494.

(10) An inductor component is positioned on tape 494 exposed through opening 420 (FIG. 42(D)).

(11) B-stage ABF-GX13GC (made by Ajinomoto Fine-Techno Co., Inc.) is laminated on second surface (S) of core substrate 430. Resin seeps out from the prepreg into the opening during thermal pressing, and opening 420 is filled with filler 450 (FIG. 42(E)). The filler contains glass particles.

(12) After removing the tape (FIG. 43(A)), B-stage ABF-GX13GC (made by Ajinomoto Fine-Techno Co., Ltd.) is laminated on first surface (F) of core substrate 430. Prepreg on the first surface and second surface of the core substrate is cured. Insulation layers (450A, 450B) (interlayer insulation layers) are formed on the first surface and second surface of the core substrate (FIG. 43(B)).

(13) A CO2 gas laser is irradiated from the first-surface side to form via-conductor openings (451A) reaching electrodes of the inductor component in insulation layer (450A). At the same time, via-conductor openings 451 are formed to reach conductive layer (434A) or through-hole conductors 436. Via-conductor openings 451 reaching conductive layer (434B) or through-hole conductors 436 are formed in insulation layer (450B) from the second-surface side (see FIG. 43(C)). Surfaces of insulation layers (450A, 450B) are roughened (not shown in the drawings).

(14) Electroless copper plating is performed to form electroless copper-plated films 452 on the inner walls of via-conductor openings and on the insulation layers (FIG. 43(D)).

(15) Plating resists 454 are formed on electroless copper-plated films 452 (FIG. 44(A)).

(16) Next, electrolytic copper plating is performed to form electrolytic copper-plated films 456 on the electroless copper-plated films exposed from the plating resists (see FIG. 44(B)).

(17) Next, plating resists 454 are removed by a 5% NaOH solution. Then, electroless copper-plated films 452 exposed from the electrolytic copper-plated films are etched away, and conductive layers (458A, 458B), which are made of electroless copper-plated film 452 and electrolytic copper-plated film 456, are formed. The thickness of conductive layers (458A, 458B) is 15 μm (FIG. 44(C)). Via conductors (460A, 460B) and connection via conductors (460Aa) are simultaneously formed. Conductive layer (458B) does not have conductive circuits directly under the inductor component.

(18) Treatments in FIGS. 43(B)~44(C) are repeated. Uppermost and lowermost insulation layers (450C, 450D) are formed on insulation layers (450A, 450B). Conductive layers (458C, 458D) are formed on uppermost and lowermost insulation layers (450C, 450D). Via conductors (460C, 460D) are formed in uppermost and lowermost insulation layers (450C, 450D) (FIG. 44(D)). The thickness of conductive layers (458C, 458D) is 15 μm. Conductive layer (458D) does not have conductive circuits directly under the inductor component.

(19) Solder-resist layers 470 having openings 471 are formed on the first and second buildup layers (FIG. 45(A)). Openings 471 expose the upper surfaces of conductive layers and via conductors. Such portions work as pads.

(20) Metal film made of nickel layer 472 and gold layer 474 on nickel layer 472 is formed on pads (FIG. 45(B)).

(21) After that, solder bumps (476U) are formed on pads in the first buildup layer, and solder bumps (476D) are formed on pads in the second buildup layer. Printed wiring board 410 having solder bumps is completed (FIG. 32).

EXAMPLE 2

Method for Manufacturing Inductor Component Having Protruding Electrode

An uppermost coil layer is formed the same as in Example (1). Then, electroless copper-plated film is formed on the uppermost coil layer and uppermost resin insulation layer. Plating resist is formed on the electroless copper-plated film. The plating resist has an opening, which exposes an end of the uppermost coil layer. Electrolytic copper-plated film is formed on the electroless copper-plated film exposed from the plating resist. The plating resist is removed. The electroless copper-plated film exposed by the removal of the plating resist is removed. A protruding electrode made of electroless copper-plated film and electrolytic copper-plated film is formed. The thickness of the protruding electrode is 10 μm. A printed wiring board is manufactured by the same method as in example (1).

Coil layers of an inductor component are preferred to overlap in each embodiment, each modified example and each example. Namely, when each coil layer is projected on a first surface of a core substrate at equal magnification, images of coil layers overlap.

In each embodiment, each modified example and each example, the thermal expansion coefficient of the incorporated inductor component is set lower than the thermal expansion coefficient of the insulative substrate.

A wiring board according to the first aspect of the present invention has a substrate, a buildup layer formed on the substrate and made by alternately laminating a conductive layer and an insulation layer, and an inductor component accommodated in the substrate and having a second insulation layer and a second conductive pattern formed on the second insulation layer. When the area of a cross section in a thickness direction of the inductor component is set as (S1) and the sum of cross-sectional areas of the second conductive patterns in that cross section is set as (P1), while the area of a cross section in a thickness direction of the substrate and the buildup layer is set as (S2) and the sum of cross-sectional areas of the conductive layers in that cross section is set as (P2), P1/S1 is set greater than P2/S2.

A method for manufacturing a wiring board according to the second aspect of the present invention includes preparing an inductor component having a second insulation layer and a second conductive pattern formed on the second insulation layer, preparing a substrate, accommodating the inductor component in the substrate, and forming on the substrate a buildup layer made by alternately laminating a conductive layer and an insulation layer. When the area of a cross section in a thickness direction of the inductor component is set as (S1) and the sum of cross-sectional areas of the second conductive patterns in that cross section is set as (P1), while the area of a cross section in a thickness direction of the substrate and the buildup layer is set as (S2) and the sum of cross-sectional areas of the conductive layers in that cross section is set as (P2), P1/S1 is set greater than P2/S2.

A printed wiring board according to the third aspect of the present invention has a core substrate having an opening to incorporate an inductor component and having a first surface and a second surface opposite the first surface, an inductor component accommodated in the opening, filler resin filled in a gap between a side wall of the opening of the core substrate and the inductor component, and a first buildup layer formed on the first surface of the core substrate and on the inductor component. In such a printed wiring board, the inductor component is made up of at least one coil layer formed as a wiring pattern on a plane, at least one resin insulation layer formed on the coil layer, an electrode formed on the resin insulation layer, and a via conductor formed in the resin insulation layer to connect the coil layer and the electrode; the inductor component is accommodated in the opening in such a way that the electrode faces the first surface of the core substrate; and the first buildup layer includes a first interlayer resin insulation layer formed on the first surface of the core substrate and on the inductor component, an upper conductive layer on the first interlayer resin insulation layer, and a connection via conductor connecting the upper conductive layer and the electrode.

A method for manufacturing an inductor component according to the fourth aspect of the present invention includes forming a lowermost resin insulation layer on a support sheet, forming a coil layer with a wiring pattern on the lowermost resin insulation layer, forming a second resin insulation layer on the coil layer and the lowermost resin insulation layer, forming in the second resin insulation layer a via-conductor opening reaching the coil layer, forming an electrode on the second resin insulation layer, forming a via conductor in the via-conductor opening to connect the electrode and the coil layer, and separating the support body and the lowermost resin insulation layer.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
a core substrate having a cavity portion;
an inductor component accommodated in the cavity portion of the core substrate;
a filler resin filling a gap formed between the core substrate and the inductor component in the cavity portion of the core substrate; and
a first buildup layer formed on a first surface of the core substrate and on the inductor component,
wherein the inductor component comprises at least one coil layer forming a wiring pattern on a plane, at least one second insulation layer formed on the coil layer and comprising an insulating resin material, a plurality of electrodes including an input electrode and an output electrode and formed on the second insulation layer, and a plurality of via conductors formed in the second insulation layer and connecting the coil layer and the electrodes, the inductor component is accommodated in the cavity portion of the core substrate such that the plurality of electrodes faces the first surface of the core substrate, and the first buildup layer includes a first interlayer resin insulation layer formed on the first surface of the core substrate and on the inductor component, a conductive layer formed on the first interlayer resin insulation layer, and a plurality of connection via conductors connecting the conductive layer and the electrodes in the inductor component.

2. The printed wiring board according to claim 1, wherein the inductor component comprises a plurality of the coil layers and a plurality of the second insulation layers, the plurality of second insulation layers includes an uppermost second insulation layer, the coil layers and the second insulation layers are alternately laminated, the inductor component comprises the plurality of via conductors formed in the second insulation layers and connecting the coil layers through the second insulation layers, and the electrodes are formed on the uppermost second insulation layer.

3. The printed wiring board according to claim 2, wherein the plurality of second insulation layers includes a lowermost second insulation layer, the plurality of coil layers includes a lowermost coil layer, and the lowermost coil layer is formed on the lowermost second insulation layer.

4. The printed wiring board according to claim 2, wherein each of the second insulation layers comprises magnetic-substance particles dispersed throughout the second insulating layer.

5. The printed wiring board according to claim 1, wherein the inductor component is covered with one of a magnetic-substance film and a coating layer comprising magnetic-substance particles.

6. The printed wiring board according to claim 2, further comprising an uppermost coil layer forming a wiring pattern on the uppermost second insulation layer, wherein one of the electrodes is formed on an end portion of the uppermost coil layer.

7. The printed wiring board according to claim 2, further comprising an uppermost coil layer forming a wiring pattern on the uppermost second insulation layer, wherein the plurality of electrodes is formed on the uppermost coil layer.

8. The wiring board according to claim 2, wherein the core substrate, the first buildup layer and the inductor component satisfy that a ratio of P1/S1 is set greater than a ratio of P2/S2, where S1 represents a cross-sectional area of the inductor component, P1 represents a sum of cross-sectional areas of conductive patterns in the inductor component, S2 represents a sum of cross sectional areas of the core substrate and the first buildup layer, P2 represents a sum of cross-sectional areas of conductive patterns in the first buildup layer, and the cross sectional areas is areas of cross sections taken in a thickness direction of the core substrate, the first buildup layer and the inductor component.

9. The wiring board according to claim 8, wherein a ratio of P1/S1 to P2/S2 is set 2 or greater and 3 or less.

10. The wiring board according to claim 8, wherein the ratio of P1/S1 is set 0.6 or greater and 0.9 or less.

11. The wiring board according to claim 8, wherein each of the second conductive patterns has a thickness which is set greater than a thickness of each of the conductive layers.

12. The wiring board according to claim 8, wherein the conductive patterns of the inductor component are electrically connected to the conductive layers of the buildup layer through a plurality of via conductors.

13. The wiring board according to claim 8, wherein the plurality of conductive patterns of the inductor component forms a plurality of inductors connected parallel to each other.

14. The wiring board according to claim 8, further comprising a chip capacitor accommodated in the core substrate and electrically connected to the inductor component.

15. The wiring board according to claim 1, wherein the inductor component is accommodated in the cavity portion of the core substrate such that the plurality of electrodes is exposed from the filler resin and connected to the plurality of connection via conductors, respectively.

16. The wiring board according to claim 2, wherein each of the second insulation layers comprises magnetic-substance particles dispersed throughout each of the second insulating layers in an amount of 30 vol % to 60 vol %.

17. The wiring board according to claim 1, wherein the second insulation layer comprises magnetic-substance particles dispersed throughout the second insulating layer in an amount of 30 vol. % to 60 vol. %.

18. The wiring board according to claim 1, further comprising:
a through-hole conductor formed through the core substrate.

19. The wiring board according to claim 1, wherein the plurality of electrodes includes the input electrode and the output electrode having a same electric potential, and the wiring pattern of the coil layer has a thickness which is in a range of 1.2 to 3 times a thickness of the conductive layer in the first buildup layer.

20. The wiring board according to claim 1, further comprising:
a second buildup layer formed on a second surface of the core substrate on an opposite side with respect to the first surface of the core substrate,
wherein the second buildup layer includes a conductive circuit formed directly under the inductor component such that a distance from the inductor component to the conductive circuit directly under the inductor component is 60 μm or greater.

* * * * *